(12) United States Patent
Feng et al.

(10) Patent No.: US 11,263,973 B2
(45) Date of Patent: Mar. 1, 2022

(54) SHIFT REGISTER UNIT, GATE DRIVE CIRCUIT, DISPLAY DEVICE AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Xiaolong Wei, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 436 days.

(21) Appl. No.: 16/468,439

(22) PCT Filed: Nov. 9, 2018

(86) PCT No.: PCT/CN2018/114827
§ 371 (c)(1),
(2) Date: Jun. 11, 2019

(87) PCT Pub. No.: WO2019/157842
PCT Pub. Date: Aug. 22, 2019

(65) Prior Publication Data
US 2021/0366400 A1    Nov. 25, 2021

(30) Foreign Application Priority Data

Feb. 14, 2018  (CN) .......................... 201810151698.5

(51) Int. Cl.
*G09G 3/3266*    (2016.01)
*G11C 19/28*    (2006.01)

(52) U.S. Cl.
CPC .......... *G09G 3/3266* (2013.01); *G11C 19/28* (2013.01); *G09G 2310/0286* (2013.01); *G09G 2320/0233* (2013.01)

(58) Field of Classification Search
CPC ...... G06F 3/041–047; G06F 2203/041–04114; G06F 3/0412;
(Continued)

(56) References Cited

U.S. PATENT DOCUMENTS

| 8,531,374 B2 | 9/2013 | Kao et al. |
| 9,142,163 B2 | 9/2015 | Jin et al. |

(Continued)

FOREIGN PATENT DOCUMENTS

| CN | 103165056 A | 6/2013 |
| CN | 105243996 A | 1/2016 |

(Continued)

OTHER PUBLICATIONS

May 7, 2020—(CN) First Office Action Appn 201810151698.5 with English Translation.
Oct. 4, 2021—(EP) Extended European Search Report Appn 18884840.2.

*Primary Examiner* — Sanjiv D. Patel
(74) *Attorney, Agent, or Firm* — Banner & Witcoff, Ltd.

(57) ABSTRACT

A shift register unit, a grid drive circuit, a display device and a driving method are disclosed. The shift register unit includes a display sub-shift-register and a detection sub-shift-register. The display sub-shift-register includes a display output terminal, and the display sub-shift-register is configured to output a display output signal of the shift register unit from the display output terminal at a display stage; the detection sub-shift-register is connected to a display output terminal of the display sub-shift-register to receive a display output signal, and includes a first random pulse signal terminal to receive a first random pulse signal.

(Continued)

The detection sub-shift-register is configured to output a detection output signal of the shift register unit when the display output signal is at a turn-on level and the first random pulse signal is at a turn-on level.

19 Claims, 28 Drawing Sheets

(58) Field of Classification Search
CPC ............ G09G 2310/0286; G11C 19/28; G11C 19/287; G11C 19/00; G11C 19/184
See application file for complete search history.

(56) References Cited

U.S. PATENT DOCUMENTS

| | | |
|---|---|---|
| 9,361,847 B2 | 6/2016 | Choi |
| 9,847,057 B2 | 12/2017 | Hwang et al. |
| 2016/0351160 A1 | 12/2016 | In et al. |
| 2018/0075791 A1 | 3/2018 | Li |

FOREIGN PATENT DOCUMENTS

| | | |
|---|---|---|
| CN | 106297615 A | 1/2017 |
| KR | 20160147173 A | 12/2016 |
| KR | 1020170078978 A | 7/2017 |
| TW | I434255 B | 4/2014 |

SHIFT REGISTER UNIT, GATE DRIVE CIRCUIT, DISPLAY DEVICE AND DRIVING METHOD

The application is a U.S. National Phase Entry of International Application No. PCT/CN2018/114827 filed on Nov. 9, 2018, designating the United States of America and claiming priority to Chinese Patent Application No. 201810151698.5, filed on Feb. 14, 2018. The present application claims priority to and the benefit of the above-identified applications and the above-identified applications are incorporated by reference herein in their entirety.

TECHNICAL FIELD

The embodiments of the present disclosure relate to a shift register unit, a gate drive circuit, a display device and a driving method.

BACKGROUND

In the field of display technology, a pixel array usually includes rows of gate lines and columns of data lines interleaved with the gate lines. The gate lines can be driven by an attached integrated drive circuit. In recent years, with the continuous improvement of amorphous silicon thin film technology, it is also possible to directly integrate a gate drive circuit on the thin film transistor array substrate to form a GOA (Gate driver On Array) to drive the gate lines.

For example, a GOA comprising a plurality of cascaded shift register units can be used to provide voltage signals for switching state of the rows of gate lines of the pixel array, thereby controlling the rows of gate lines to be sequentially turned on, and data signals are provided to pixel units of corresponding rows in the pixel array by data lines to form gray level voltages required for displaying the gray levels of an image, thereby displaying each frame of image.

SUMMARY

At least an embodiment of the present disclosure provides a shift register unit including a display sub-shift-register and a detection sub-shift-register. The display sub-shift-register includes a display output terminal, and the display sub-shift-register is configured to output a display output signal of the shift register unit from the display output terminal at a display stage; the detection sub-shift-register is connected to the display output terminal of the display sub-shift-register to receive the display output signal, and includes a first random pulse signal terminal to receive the first random pulse signal, and the detection sub-shift-register is configured to output a detection output signal of the shift register unit when the display output signal and the first random pulse signal are both turn-on levels.

For example, in the shift register unit provided in one embodiment of the present disclosure, the detection sub-shift-register includes a first detection input sub-circuit, a first pull-up node reset sub-circuit and a detection output sub-circuit; the first detection input sub-circuit is configured to charge a first pull-up node in response to the display output signal and the first random pulse signal; the first pull-up node reset sub-circuit is configured to reset the first pull-up node in response to a first reset signal; the detection output sub-circuit is configured to output a first clock signal to a detection output terminal under the control of the level of the first pull-up node.

For example, in the shift register unit provided in one embodiment of the present disclosure, the detection sub-shift-register further includes a first pull-up node noise reduction sub-circuit, a first output noise reduction sub-circuit and a first pull-down sub-circuit; the first pull-up node noise reduction sub-circuit is configured to reduce noise on the first pull-up node under the control of the level of the first pull-down node; the detection output noise reduction sub-circuit is configured to reduce noise at the detection output terminal under the control of the level of the first pull-down node; the first pull-down sub-circuit is configured to control the level of the first pull-down node under the control of the level of the first pull-up node.

For example, in the shift register unit provided by an embodiment of the present disclosure, the first detection input sub-circuit includes a first transistor and a second transistor; a gate electrode of the first transistor is configured to be connected to the display output terminal to receive the display output signal, a first electrode of the first transistor is configured to be connected to a second clock signal terminal to receive a second clock signal, and a second electrode of the first transistor is configured to be connected to a first electrode of the second transistor; a gate electrode of the second transistor is configured to be connected to the first random pulse signal terminal to receive the first random pulse signal, and a second electrode of the second transistor is connected to the first pull-up node.

For example, in the shift register unit provided by an embodiment of the present disclosure, the first detection input sub-circuit includes a first transistor. The gate electrode of the first transistor is configured to be connected to the display output terminal to receive the display output signal, the first electrode of the first transistor is configured to be connected to the first random pulse signal terminal to receive the first random pulse signal, the second electrode of the first transistor is configured to be connected to the first pull-up node, or the gate electrode of the first transistor is configured to be connected to the first random pulse signal terminal to receive the first random pulse signal, a first electrode of the first transistor is configured to be connected to the display output terminal to receive the display output signal, and a second electrode of the first transistor is configured to be connected to the first pull-up node.

For example, in the shift register unit provided by an embodiment of the present disclosure, the first pull-up node reset sub-circuit includes a third transistor, a gate electrode of the third transistor is configured to be connected to the first reset terminal to receive the first reset signal, the first electrode of the third transistor is configured to be connected to the first pull-up node, and the second electrode of the third transistor is configured to be connected to the first voltage terminal to receive the first voltage signal; or the detection output sub-circuit includes a fourth transistor whose gate is configured to be connected to the first pull-up node, and a first storage capacitor whose first electrode is configured to be connected to a first clock signal terminal to receive the first clock signal, and whose second electrode is configured to be connected to the detection output terminal to output the detection output signal; the first electrode of the first storage capacitor is connected with the first pull-up node, and the second electrode of the first storage capacitor is connected with the detection output terminal; or the first pull-up node noise reduction sub-circuit includes a fifth transistor, a gate electrode of the fifth transistor is configured to be connected to the first pull-down node, the first electrode of the fifth transistor is configured to be connected to the first pull-up node, and a second electrode of the fifth transistor is configured to be connected to the first voltage terminal; or the detection output noise reduction sub-circuit includes a sixth transistor, a gate electrode of which is configured to be connected to the first pull-down node, the first electrode of which is configured to be connected to the detection output terminal, and the second electrode of which is configured to be connected to the first voltage terminal; or the first pull-down sub-circuit includes a seventh transistor and an eighth transistor, a gate electrode of the seventh transistor is connected to the first electrode and configured to be connected to a second voltage terminal to receive a second voltage signal, and the second electrode of the seventh transistor is configured to be connected to the first pull-down node; a gate electrode of the eighth transistor is connected to the first pull-up node, the first electrode of the eighth transistor is connected to the first pull-down node, and the second electrode of the eighth transistor is configured to be connected to the first voltage terminal to receive the first voltage signal.

For example, in the shift register unit provided in one embodiment of the present disclosure, the first pull-down sub-circuit further includes a ninth transistor and a tenth transistor. A gate electrode and a first electrode of the ninth transistor are connected and are configured to be connected to a third voltage terminal to receive a third voltage signal, and the second electrode of the ninth transistor is connected to the first pull-down node; a gate electrode of the tenth transistor is connected to the first pull-up node, the first electrode of the tenth transistor is connected to the first pull-down node, and the second electrode of the tenth transistor is configured to be connected to the first voltage terminal to receive the first voltage signal.

For example, in the shift register unit provided in one embodiment of the present disclosure, the detection sub-shift-register further includes a second detection input sub-circuit and a detection input terminal. The second detection input sub-circuit is configured to be connected to a detection input terminal to receive a detection input signal and charge the first pull-up node in response to the detection input signal.

For example, in the shift register unit provided in one embodiment of the present disclosure, the second detection input sub-circuit includes an eleventh transistor. A gate electrode and a first electrode of the eleventh transistor are connected and configured to be connected to the detection input terminal to receive the detection input signal, the second electrode of the eleventh transistor is connected to the first pull-up node, or the gate electrode of the eleventh transistor is configured to be connected to the detection input terminal to receive the detection input signal, a first electrode of the eleventh transistor is configured to be connected to a third clock signal terminal to receive a third clock signal, and the second electrode of the eleventh transistor is connected to the first pull-up node.

For example, in the shift register unit provided by an embodiment of the present disclosure, the first pull-up node reset sub-circuit further includes a twelfth transistor. A gate electrode of the twelfth transistor is connected to a second reset terminal to receive a second reset signal, the first electrode of the twelfth transistor is connected to the first pull-up node, and the second electrode of the twelfth transistor is connected to the first voltage terminal to receive the first voltage signal.

For example, in the shift register unit provided in one embodiment of the present disclosure, the first detection input sub-circuit further includes a random pulse signal control sub-circuit and a second random pulse signal terminal. The random pulse signal control sub-circuit is configured to be connected to a display output terminal, a first random pulse signal terminal, and a second random pulse signal terminal to receive a display output signal, a first random pulse signal, and a second random pulse signal, and to simultaneously make the first random pulse signal and the second random pulse signal turn-on levels in response to the display output signal, the first random pulse signal, and the second random pulse signal.

For example, in the shift register unit provided by an embodiment of the present disclosure, the random pulse signal control sub-circuit includes a fifty-first transistor, a fifty-second transistor, a fifty-third transistor, a 54th transistor, a fifth storage capacitor, and a sixth storage capacitor. A gate electrode of the fifty-first transistor is connected to the first random pulse signal terminal, a first electrode of the fifty-first transistor is connected to the display output terminal, and a second electrode of the fifty-first transistor is connected to the gate electrode of the first transistor. A gate electrode of the fifty-second transistor is connected to the second pulse signal terminal, a first electrode of the fifty-second transistor is connected to the display output terminal, and a second electrode of the fifty-second transistor is connected to the gate electrode of the second transistor. A gate electrode of the fifty-third transistor is connected to the first clock signal terminal, a first electrode of the fifty-third transistor is connected to the gate electrode of the first transistor, and a second electrode of the fifty-third transistor is connected to the first voltage terminal. A gate electrode of the fifty-fourth transistor is connected to the first clock signal terminal, a first electrode of the fifty-fourth transistor is connected to the gate electrode of the second transistor, and a second electrode of the fifty-fourth transistor is connected to the first voltage terminal. A first electrode of the fifth storage capacitor is connected to the gate electrode of the first transistor, and a second electrode of the fifth storage capacitor is connected to the first voltage terminal. A first electrode of the sixth storage capacitor is connected to the gate electrode of the second transistor, and a second electrode of the sixth storage capacitor is connected to the first voltage terminal.

For example, in the shift register unit provided in one embodiment of the present disclosure, the detection sub-shift-register further includes a current leak-proof circuit. The current leak-proof circuit is configured to maintain a high level of the first pull-up node under control of a level of the first pull-up node.

For example, in the shift register unit provided by an embodiment of the present disclosure, the current leak-proof circuit includes a thirteenth transistor, a gate electrode of the thirteenth transistor is connected to the first pull-up node, a first electrode of the thirteenth transistor is connected to a fourth voltage terminal receive a fourth voltage signal, and a second electrode of the thirteenth transistor is connected to a feedback node; or the second detection input sub-circuit includes an eleventh transistor and a fourteenth transistor; a gate electrode of the eleventh transistor is configured to be connected to a detection input terminal to receive the detection input signal, a first electrode of the eleventh transistor is configured to be connected to a third clock signal terminal to receive a third clock signal, a second electrode of the eleventh transistor is connected to a first electrode of the fourteenth transistor, and is configured to be connected to the feedback node; a gate electrode of the fourteenth transistor is connected to the gate electrode of the eleventh transistor, and the second electrode of the fourteenth transistor is connected to the first pull-up node, or the first pull-up node reset sub-circuit comprises a third transistor, a twelfth transistor, a fifteenth transistor and a sixteenth transistor; a gate electrode of the third transistor is configured to be connected to the first reset terminal to receive the first reset signal, a first electrode of the third transistor is connected to a second electrode of the fifteenth transistor and is configured to be connected to the feedback node, and a second electrode of the third transistor is configured to be connected to the first voltage terminal; a gate electrode of the twelfth transistor is connected to the second reset terminal to receive the second reset signal, a first electrode of the twelfth transistor is connected to a second electrode of the sixteenth transistor and is configured to be connected to the feedback node, and a second electrode of the twelfth transistor is connected to the first voltage terminal to receive the first voltage signal; a gate electrode of the fifteenth transistor is connected to the gate electrode of the third transistor, and a first electrode of the fifteenth transistor is connected to the first pull-up node. A gate electrode of the sixteenth transistor is connected to the gate electrode of the twelfth transistor, and a first electrode of the sixteenth transistor is connected to the first pull-up node; or the first pull-up node noise reduction sub-circuit comprises a fifth transistor and a seventeenth transistor; a gate electrode of the fifth transistor is configured to be connected to the first pull-down node, a first electrode of the fifth transistor is configured to be connected to the second electrode of the seventeenth transistor, and is configured to be connected to the feedback node, and a second electrode of the fifth transistor is configured to be connected to the first voltage terminal; a gate electrode of the seventeenth transistor is connected to the gate electrode of the fifth transistor, and a first electrode of the seventeenth transistor is connected to the first pull-up node.

For example, in the shift register unit provided in one embodiment of the present disclosure, the display sub-shift-register includes a display input sub-circuit, a second pull-up node reset sub-circuit and a display output sub-circuit. The display input sub-circuit is configured to charge a second pull-up node in response to a display input signal; the second pull-up node reset sub-circuit is configured to reset the second pull-up node in response to a third reset signal received by a third reset terminal; the display output sub-circuit is configured to output a fourth clock signal to the display output terminal under control of a level of the second pull-up node.

For example, in the shift register unit provided in one embodiment of the present disclosure, the display sub-shift-register further includes a second pull-up node noise reduction sub-circuit, a display output noise reduction sub-circuit and a second pull-down sub-circuit; the second pull-up node noise reduction sub-circuit is configured to reduce noise on the second pull-up node under control of a level of the second pull-down node; the display output noise reduction sub-circuit is configured to reduce noise on the display output terminal under the control of the level of the second pull-down node; the second pull-down sub-circuit is configured to control the level of the second pull-up node under the control of the level of the second pull-up node.

For example, the shift register unit provided in one embodiment of the present disclosure further includes an output control circuit. The output control circuit is connected to the first pull-up node and the first pull-down node of the detection sub-shift-register and to the second pull-up node and the second pull-down node of the display sub-shift-register, and is configured to pull down one of the first pull-up node and the second pull-up node when the other of the first pull-up node and the second pull-up node is at an turn-on level.

For example, in the shift register unit provided in one embodiment of the present disclosure, the output control circuit includes a display output control sub-circuit and a detection output control sub-circuit. The detection output control sub-circuit is configured to control the levels of the second pull-up node and the second pull-down node under the control of the level of the first pull-up node; the display output control sub-circuit is configured to control the levels of the first pull-up node and the first pull-down node under the control of the level of the second pull-up node.

For example, the shift register unit provided by one embodiment of the present disclosure further includes logic OR circuitry. The logic OR circuit is connected to the display output terminal of the display sub-shift-register and the detection output terminal of the detection sub-shift-register, and is configured to perform OR operation on the display output signal and the detection output signal to obtain a composite output signal.

For example, in the shift register unit provided by an embodiment of the present disclosure, the logic OR circuit includes a first logic OR input sub-circuit, a second logic OR input sub-circuit, a first output control sub-circuit, a second output control sub-circuit, a first node noise reduction sub-circuit, a second node noise reduction sub-circuit, an output noise reduction control sub-circuit and an output noise reduction sub-circuit. The first logic OR input sub-circuit is configured to charge a first node in response to the detection output signal; the second logic OR input sub-circuit is configured to charge a second node in response to the display output signal; the first output control sub-circuit is configured to output the detection output signal under control of a level of the first node; the second output control sub-circuit is configured to output the display output signal under control of a level of the second node; the first node noise reduction sub-circuit is configured to reduce noise on the first node under control of a level of the display output signal; the second node noise reduction sub-circuit is configured to reduce noise on the second node under control of a level of the detected output signal; the output noise reduction control sub-circuit is configured to control a level of a third node under the control of the levels of the display output signal and the detection output signal; the output noise reduction sub-circuit is configured to reduce noise at a logic OR output terminal under the control of the level of the third node.

At least an embodiment of the present disclosure also provides a gate drive circuit, which comprises a plurality of cascaded shift register units each provided by any embodiment of the present disclosure. The first random pulse signal terminal of the detection sub-shift-register of each shift register unit is connected with a first random pulse signal line; except for a display sub-shift-register of a first stage, a display input terminal of a display sub-shift-register of each other stage is connected with a display output terminal of a display sub-shift-register of a preceding stage; except for a display sub-shift-register of a last stage, a third reset terminal of a display sub-shift-register of each other stage is connected with a display output terminal of a display sub-shift-register of a next stage.

At least an embodiment of the present disclosure also provides a gate drive circuit, which comprises a plurality of cascaded shift register units each provided by any embodiment of the present disclosure. The first random pulse signal terminal of the detection sub-shift-register of each shift register unit is connected with a first random pulse signal line; except for a display sub-shift-register of a first stage, a display input terminal of a display sub-shift-register of each other stage is connected with a display output terminal of a display sub-shift-register of a preceding stage; except for a detection sub-shift-register of a first stage, a detection input terminal of a detection sub-shift-register of each other stage is connected with a detection output terminal of a detection sub-shift-register of a preceding stage.

At least an embodiment of the present disclosure also provides a gate drive circuit, which comprises a plurality of cascaded shift register units provided by any embodiment of the present disclosure. The first random pulse signal terminal of the detection sub-shift-register of each shift register unit is connected with a first random pulse signal line; the second random pulse signal terminal of the detection sub-shift-register of each shift register unit is connected with a second random pulse signal line; except for display sub-shift-registers of a first stage and a second stage, a display input terminal of a display sub-shift-register of each other stage is connected with a display output terminal of a display sub-shift-register of a preceding stage which is separated from the display sub-shift-register by one stage; except for a detection sub-shift-register of a first stage, a detection input terminal of a detection sub-shift-register of each other stage is connected with a detection output terminal of a detection sub-shift-register of a preceding stage.

At least an embodiment of the present disclosure also provides a display device including the gate drive circuit provided in any embodiment of the present disclosure.

For example, the display device provided by one embodiment of the present disclosure further includes a random pulse generating circuit. The random pulse generating circuit is configured to generate the first random pulse signal and is connected to the first random pulse signal line.

At least an embodiment of the present disclosure also provides a driving method of the gate drive circuit, which comprises: a display output terminal of a display sub-shift-register of an (N)th stage outputting a display output signal; a detection sub-shift-register of the (N)th stage charging a first pull-up node in response to the display output signal and a first random pulse signal; and the detection sub-shift-register of the (N)th stage outputting a detection output signal; N is an integer greater than 1.

At least an embodiment of the present disclosure also provides a driving method of the gate drive circuit, which comprises: a display output terminal of a display sub-shift-register of an (N)th stage outputting a display output signal; a detection sub-shift-register of the (N)th stage charging a first pull-up node in response to the display output signal, a first random pulse signal, and a second random pulse signal; and the detection sub-shift-register of the (N)th stage outputting a detection output signal. N is an integer greater than 1.

According to the shift register unit, the gate drive circuit, the display device and the drive method provided by the embodiment of the disclosure, the problems of scanning lines and brightness nonuniformity caused by line-by-line scanning can be eliminated through the random detection function of the detection sub-shift-register, the nonuniformity of threshold voltage and the mobility of the drive transistor in the pixel circuit and the aging of the OLED can be more fully compensated, and further the display quality of the display device can be improved.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Pixel circuits in OLED display devices generally adopt a matrix drive mode, and are divided into active matrix drive and passive matrix drive according to whether switching elements are introduced into each pixel unit. An AMOLED integrates a group of thin film transistors and a storage capacitor(s) in the pixel circuit of each pixel. Through the drive control by the thin film transistors and the storage capacitor(s), the current flowing through the OLED is controlled, so that the OLED emits light as required.

Figure 1A:
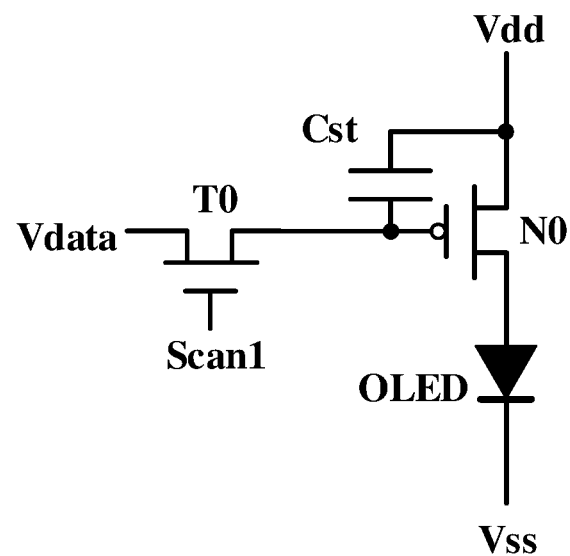
FIG. 1A is a schematic diagram of a pixel circuit.
Figure 1B:
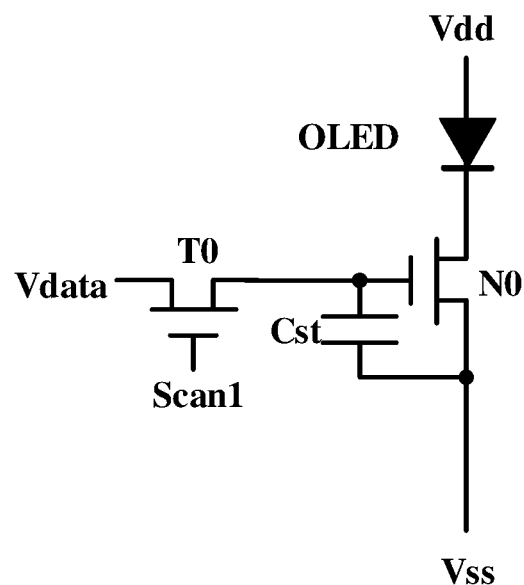
FIG. 1B is a schematic diagram of another pixel circuit.

The basic pixel circuit used in an AMOLED display device is usually 2T1C pixel circuit, that is, two thin-film transistor (TFT) and a storage capacitor Cst are used to realize the function of driving an OLED to emit light. FIG. 1A and FIG. 1B are schematic diagrams respectively showing two kinds of 2T1C pixel circuits.

As illustrated in FIG. 1A, a 2T1C pixel circuit includes a switching transistor T0, a drive transistor N0, and a storage capacitor Cst. For example, the gate electrode of the switching transistor T0 is connected to a scan line to receive a scan signal Scan1; for example, the source electrode of the switching transistor T0 is connected to a data line to receive a data signal Vdata; the drain electrode of the switching transistor T0 is connected to the gate electrode of the drive transistor N0; the source electrode of the drive transistor N0 is connected to the first voltage terminal to receive the first voltage Vdd (a high voltage), and the drain electrode of the drive transistor N0 is connected to the anode of an OLED; one end of the storage capacitor Cst is connected to the drain electrode of the switching transistor T0 and the gate electrode of the drive transistor N0, and the other end is connected to the source electrode of the drive transistor N0 and the first voltage terminal; the cathode of the OLED is connected to the second voltage terminal to receive a second voltage Vss (a low voltage, for example, a ground voltage). The driving mode of the 2T1C pixel circuit is to control the brightness (gray scale) of the pixel through the two TFTs and the storage capacitor Cst. When the scanning signal Scan1 is applied through the scanning line to turn on the switching transistor T0, the data signal Vdata input by the data drive circuit through the data line can charge the storage capacitor Cst through the switching transistor T0, thus the data signal Vdata can be stored in the storage capacitor Cst, and the stored data signal Vdata can control the conduction degree of the drive transistor N0, thereby controlling the current flowing through the drive transistor N0 to drive the OLED to emit light, that is, the current determines the gray scale of the pixel to emit light. In the 2T1C pixel circuit illustrated in FIG. 1A, the switching transistor T0 is an N-type transistor and the drive transistor N0 is a P-type transistor.

As illustrated in FIG. 1B, another 2T1C pixel circuit also includes a switching transistor T0, a drive transistor N0, and a storage capacitor Cst, but its connection mode is slightly changed, and the drive transistor N0 is an N-type transistor. The modification of the pixel circuit of FIG. 1B compared with FIG. 1A includes that the anode of the OLED is connected to the first voltage terminal to receive the first voltage Vdd (a high voltage), the cathode is connected to the drain electrode of the drive transistor N0, and the source electrode of the drive transistor N0 is connected to the second voltage terminal to receive the second voltage Vss (a low voltage, e.g., a ground voltage). One end of the storage capacitor Cst is connected to the drain electrode of the switching transistor T0 and the gate electrode of the drive transistor N0, and the other end is connected to the source electrode of the drive transistor N0 and the second voltage terminal. The operation mode of the 2T1C pixel circuit is basically the same as that of the pixel circuit illustrated in FIG. 1A, and will not be described here again.

In addition, for the pixel circuit illustrated in FIG. 1A and FIG. 1B, the switching transistor T0 is not limited to an N-type transistor but may be a P-type transistor, and it is only necessary to control to change the scanning signal Scan1 accordingly.

An OLED display device generally include a plurality of pixel units arranged in an array, and each pixel unit may include, for example, the pixel circuit described above. When the pixel circuit performs a display operation, the output current $I_{OLED}$ when the drive transistor N0 in the pixel circuit is in a saturated state can be obtained by the following formula:

$$IOLED = \tfrac{1}{2} * K(Vg - Vs - Vth)^2.$$

Here, $K = W/L * C * \mu$, W/L is the width-to-length ratio (i.e., the ratio of width to length) of the channel of the drive transistor N0, is electron mobility, C is capacitance per unit area, Vg is the voltage of the gate electrode of the drive transistor N0, Vs is the voltage of the source electrode of the drive transistor N0, and Vth is the threshold voltage of the drive transistor N0. It should be noted that, in the embodiments of the present disclosure, K is referred to as the current coefficient of the drive transistor in a pixel circuit, and the following embodiments are the same as this and will not be described again.

The threshold voltage Vth of the drive transistor in each pixel circuit may differ due to the manufacturing process, and the threshold voltage Vth of the drive transistor may drift due to, for example, the influence of temperature change. At the same time, the current coefficient K of the drive transistor will also suffer from aging over time. Therefore, the difference and aging of the threshold voltage Vth and the current coefficient K of each drive transistor may lead to poor display (e.g., uneven display), so it is necessary to compensate the threshold voltage Vth and the current coefficient K.

For example, after a data signal (e.g., a data voltage) Vdata is applied to the gate electrode of the drive transistor N0 via the switching transistor T0, the data signal Vdata may charge the storage capacitor Cst, and because the data signal Vdata can turn on the drive transistor N0, the voltage Vs of the source electrode or the drain electrode of the drive transistor N0 electrically connected to one end of the storage capacitor Cst may change accordingly.

Figure 1C:
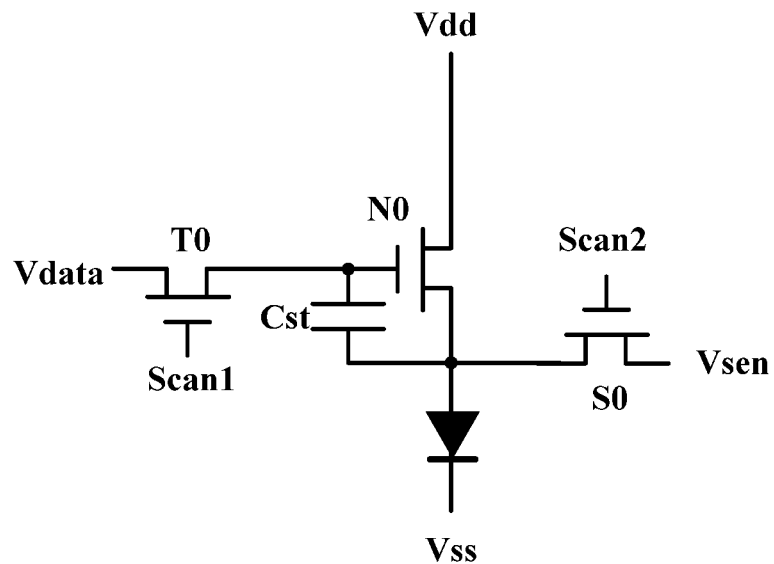
FIG. 1C is a schematic diagram of yet another pixel circuit.

For example, FIG. 1C shows a pixel circuit (i.e., 3T1C circuit) that can detect a threshold voltage of a drive transistor, and the drive transistor N0 is an N-type transistor. For example, as illustrated in FIG. 1C, in order to realize the compensation function, a sensing transistor S0 may be introduced on the basis of a 2T1C circuit, that is, a first end of the sensing transistor S0 may be connected to a source electrode of a drive transistor N0, a second end of the sensing transistor S0 may be connected to a detection circuit (not illustrated) via a sensing line, and a gate electrode of the sensing transistor S0 receives a compensation scan signal Scan2. Thus, after the drive transistor N0 is turned on, the compensation scanning signal Scan2 can be applied, thereby charging the detection circuit via the sensing transistor S0 and causing the source potential of the drive transistor N0 to change. When the voltage Vs at the source electrode of the drive transistor N0 is equal to the difference between the gate voltage Vg of the drive transistor N0 and the threshold voltage Vth of the drive transistor, the drive transistor N0 is turned off. At this time, after the drive transistor N0 is turned off, the sensing voltage (that is, the voltage Vb of the source electrode after the drive transistor N0 is turned off) can be acquired from the source electrode of the drive transistor N0 via the turned-on sensing transistor S0. After obtaining the voltage Vb of the source electrode after the drive transistor N0 is turned off, the threshold voltage of the drive transistor Vth=Vdata-Vb can be obtained, whereby compensation data can be established (i.e., determined) for each pixel circuit based on the threshold voltage of the drive transistor in each pixel circuit, thereby realizing the threshold voltage compensation function of each sub-pixel of the display panel.

Figure 1D:
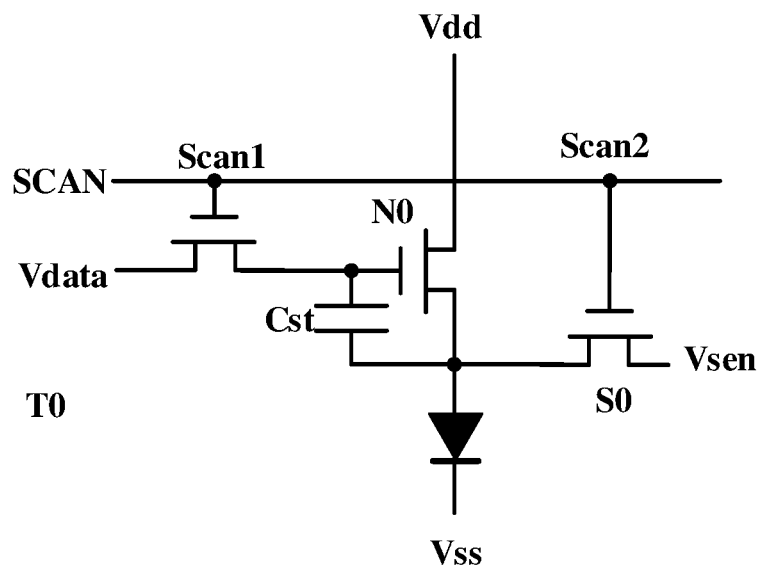
FIG. 1D is a schematic diagram of yet another pixel circuit.

For example, as illustrated in FIG. 1D, the scan signal Scan1 and the compensation scan signal Scan2 may also be provided by the same gate scan line. The pixel circuit can not only detect current, but also switch on the organic light emitting diode to make it emit light.

Figure 1E:
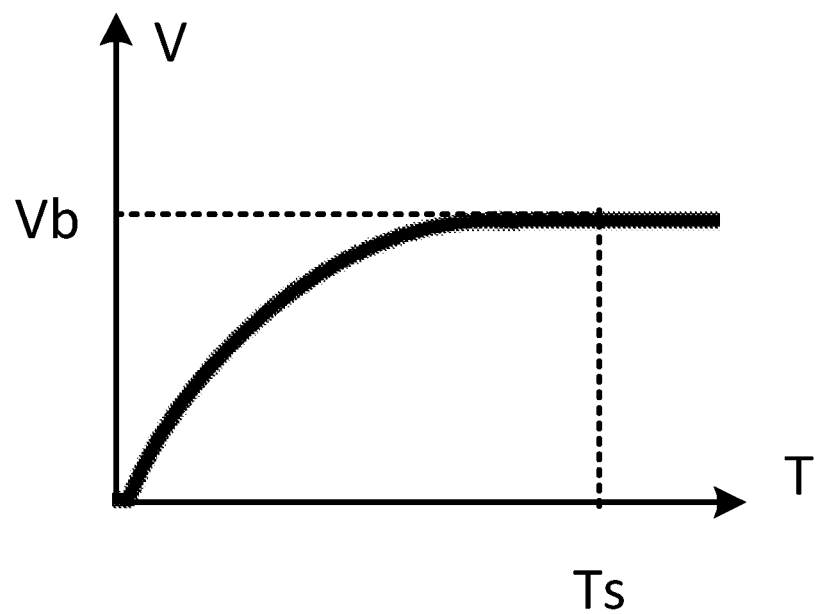
FIG. 1E is a graph showing the change of sensing voltage over time.

For example, FIG. 1E shows a graph of the sensing voltage obtained from the source electrode of the drive transistor N0 via the conductive sensing transistor S0 as a function of time. For example, after the data signal Vdata is applied, in the process of charging the detection circuit via the sensing line, as the charging time of the storage capacitor Cst or the like increases, the charging speed will correspondingly decrease (i.e., the speed at which the sensing voltage increases decreases) (see FIG. 1E), because the charging current decreases as the sensing voltage (i.e., the voltage Vs of the source electrode of the drive transistor N0) increases. Specifically, the output current $I_{OLED}$ of the drive transistor N0 in a saturated state can be obtained by the following formula:

$$I_{OLED} = \tfrac{1}{2} * K(Vg - Vs - Vth)^2$$

$$= \tfrac{1}{2} * K(Vdata - Vs - Vth)^2$$

$$= \tfrac{1}{2} * K((Vdata - Vth) - Vs)^2.$$

Here, $K = W/L * C * \mu$, W/L is the width-to-length ratio (i.e., the ratio of width to length) of the channel of the drive transistor N0, is electron mobility, and C is capacitance per unit area.

In the process that the voltage Vs at the source electrode of the drive transistor N0 increases to Vdata-Vth, the value of [(Vdata-Vth)-Vs] decreases continuously with the increase of Vs. Correspondingly, the current $I_{OLED}$ output by the drive transistor N0 and the charging speed also decrease continuously. Therefore, the time period Ts required from the start of charging to the turning-off of the drive transistor N0 is long, so it is usually necessary to detect the threshold voltage during the shutdown process after the normal display of the display panel is finished.

In an OLED panel employing a pixel circuit as illustrated in FIG. 1C or FIG. 1D, the corresponding GOA circuit also generally includes a display portion and a sense portion. The display part is used for image display, and the detection part is used for detecting or compensating the non-uniformity of the threshold voltage and the mobility of the drive transistor N0 in the pixel circuit and the aging of the OLED, which are both indispensable. However, in the process of compensating the non-uniformity of threshold voltage and the mobility in the detection part, the GOA circuit usually adopts a sequential scanning method for the compensation process. On the one hand, along with the line-by-line scanning by the GOA circuit, a scanning line which moves line by line appears on the display panel during the compensation process, thus seriously affecting the display quality of the OLED display panel. On the other hand, the brightness of different areas of the display panel is rendered to be not uniform due to the difference in compensation time caused by the line-by-line scanning.

At least an embodiment of the present disclosure provides a shift register unit including a display sub-shift-register and a sense sub-shift-register. The display sub-shift-register includes a display output terminal and is configured to output a display output signal of the shift register unit from the display output terminal; the detection sub-shift-register is connected to the display output terminal of the display sub-shift-register to receive the display output signal, and includes a first random pulse signal terminal to receive the first random pulse signal. The detection sub-shift-register is configured to output the detection output signal of the shift register unit when the display output signal is at the turn-on level (ON level) and the first random pulse signal is at the turn-on level.

The embodiments of the present disclosure also provide a gate drive circuit, a display device and a driving method corresponding to the shift register unit.

According to the shift register unit, the gate drive circuit, the display device and the drive method provided by the embodiments of the disclosure, the problems of scanning lines and brightness nonuniformity caused by line-by-line scanning can be eliminated through the random detection function of the detection sub-shift-register, the nonuniformity of threshold voltage, the mobility of the drive transistor in the pixel circuit and the aging of the OLED can be more fully compensated, and further the display quality of the display device can be improved.

Embodiments of the present disclosure and examples thereof will be described in detail below with reference to the accompanying drawings.

Figure 2:
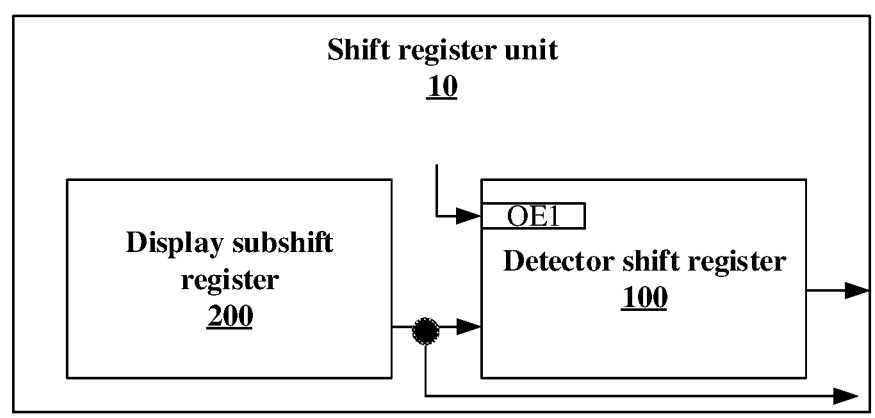
FIG. 2 is a schematic diagram of a shift register unit according to an embodiment of the present disclosure.

FIG. 2 is a schematic diagram of a shift register unit according to an embodiment of the present disclosure. As illustrated in FIG. 2, the shift register unit 10 includes a detection sub-shift-register 100 and a display sub-shift-register 200.

For example, the display sub-shift-register 200 includes a display output terminal (not illustrated in the figure) and is configured to output a display output signal of the shift register unit from the display output terminal in a display stage. For example, the display output signal output from the display sub-shift-register 200 is used to control the image display of a display panel. For example, when the connection mode of the pixel circuit illustrated in FIG. 1D is adopted, the display output signal output from the display sub-shift-register 200 is also used to compensate for the non-uniformity of the threshold voltage and the mobility of a drive transistor in the pixel circuit and the aging of an OLED.

For example, the detection sub-shift-register 100 is connected to a display output terminal of the display sub-shift-register 200 to receive the display output signal. For example, the detection sub-shift-register 100 further includes a first random pulse signal terminal OE1 to receive the first random pulse signal. The detection sub-shift-register 100 is configured to output the detection output signal of the shift register unit when the display output signal and the first random pulse signal are both at the turn-on level. For example, the detection output signal of the detection sub-shift-register 100 is used to compensate for the non-uniformity of threshold voltage and the mobility of the drive transistor in the pixel circuit, the aging of the OLED, and the like. For example, when the connection mode of the pixel circuit illustrated in FIG. 1D is adopted, the detection output signal of the detection sub-shift-register 100 is also used to control the image display of the display panel.

For example, the display output signal is transmitted as a control scan signal Scan1 to the gate electrode of the switching transistor of the pixel circuit in FIG. 1C through the gate scan line, so as to control the writing operation of the data signal, and the detection output signal is transmitted as a compensation scan signal Scan2 to the gate electrode of the sensing transistor in FIG. 1C through the compensation scan line, so as to control the compensation operation of the threshold voltage and the mobility of the drive transistor N0. For example, the display output signal and the detection output signal may also be transmitted to the gate electrodes of the switching transistor T0 and the sensing transistor S0 in the pixel circuit illustrated in FIG. 1D through the same scanning line to control the write operation of the data signal and the compensation operation of the threshold voltage, the mobility of the drive transistor N0, and the aging of the OLED, etc. For example, the first random pulse signal is generated by a random pulse generating circuit, and the first random pulse signal is transmitted to the detection sub-shift-register 100 through a first random pulse signal line.

Because the first random pulse signal is random to be generated in time and whether the output of the detection sub-shift-register 100 is performed is controlled by the display output signal and the first random pulse signal, the display device using the shift register unit for the gate drive circuit can effectively avoid the problems of scanning lines and uneven brightness caused by line-by-line scanning, further can compensate the threshold voltage and the mobility of the drive transistor in the pixel circuit, and further can improve the display quality.

Figure 3A:
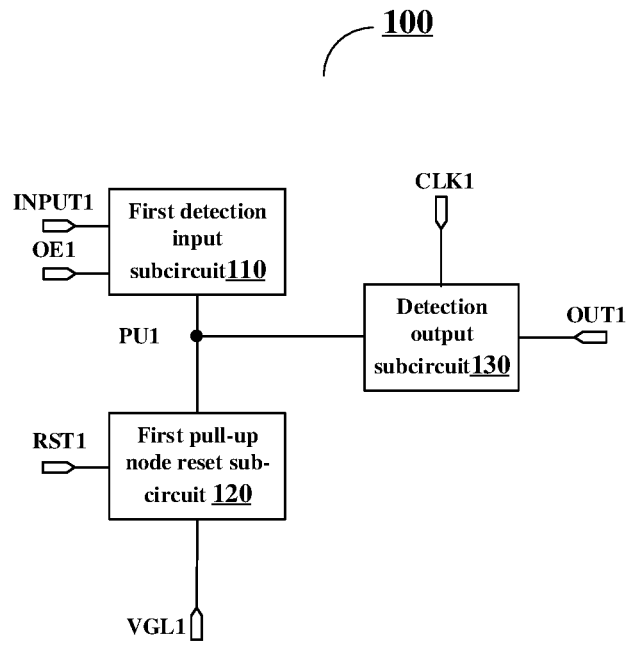
FIG. 3A is a schematic diagram of a detection sub-shift-register of the shift register unit illustrated in FIG. 2.

FIG. 3A is a schematic diagram of a detection sub-shift-register illustrated in FIG. 2. As illustrated in FIG. 3A, the exemplary detection sub-shift-register 100 includes a first detection input sub-circuit 110, a first pull-up node reset sub-circuit 120, and a detection output sub-circuit 130.

The first detection input sub-circuit 110 is configured to charge the first pull-up node PU1 in response to the display output signal and the first random pulse signal. For example, the first detection input sub-circuit 110 may be connected to the first input terminal INPUT1, the first random pulse signal terminal OE1, and the first pull-up node PU1 of the detection sub-shift-register. For example, the first input terminal INPUT1 is configured to be connected to the display output terminal to receive the display output signal of the display sub-shift-register 200. For example, the first detection input sub-circuit 110 is configured to electrically connect the first pull-up node PU1 with the first input INPU1 or the first random pulse signal OE1 or a high voltage terminal that is otherwise provided, under the common control of the display output signal received by the first input INPU1 and the first random pulse signal OE1. Therefore, the high level signal input from the first input terminal INPUT1 or the first random pulse signal terminal OE1 or the high level signal output from the high voltage terminal can charge the first pull-up node PU1 to increase (pull up) the voltage of the first pull-up node PU1 to control the conduction of the detection output sub-circuit 130.

The first pull-up node reset sub-circuit 120 is configured to reset the first pull-up node PU1 in response to the first reset signal, so that the voltage of the first pull-up node PU1 is reduced (pulled down), so that the detection output sub-circuit 130 is no longer turned on. For example, the first reset signal is a global reset signal, which can reset the first pull-up nodes PU1 of all detection sub-shift-registers 100. For example, the first pull-up node reset sub-circuit 120 may be configured to be connected to the first reset terminal RST1, so that the first pull-up node PU1 may be electrically connected to a low-level signal or a low-voltage terminal, such as the first voltage terminal VGL1, under the control of a first reset signal input from the first reset terminal RST1, thereby enabling pull-down reset of the first pull-up node PU1. It should be noted that, for example, the first voltage terminal VGL1 can be configured to maintain an input of a direct current (DC) low level signal, and this DC low level is referred to as a first voltage signal. The following embodiments are the same as the above and will not be described in detail.

The detection output sub-circuit 130 is configured to output a first clock signal to the detection output terminal OUT1, as the detection output signal of the detection sub-shift-register 100, under the control of the level of the first pull-up node PU1, so as to control the compensation of the threshold voltage and the mobility of a drive transistor in a pixel circuit connected to the detection output terminal, the aging of an OLED, and the like. For example, the detection output sub-circuit 130 may be configured to be turned on under the control of the level of the first pull-up node PU1, electrically connecting the first clock signal terminal CLK1 and the detection output terminal OUT1, so that the first clock signal input by the first clock signal terminal CLK1 can be output to the detection output terminal OUT1.

Figure 3B:
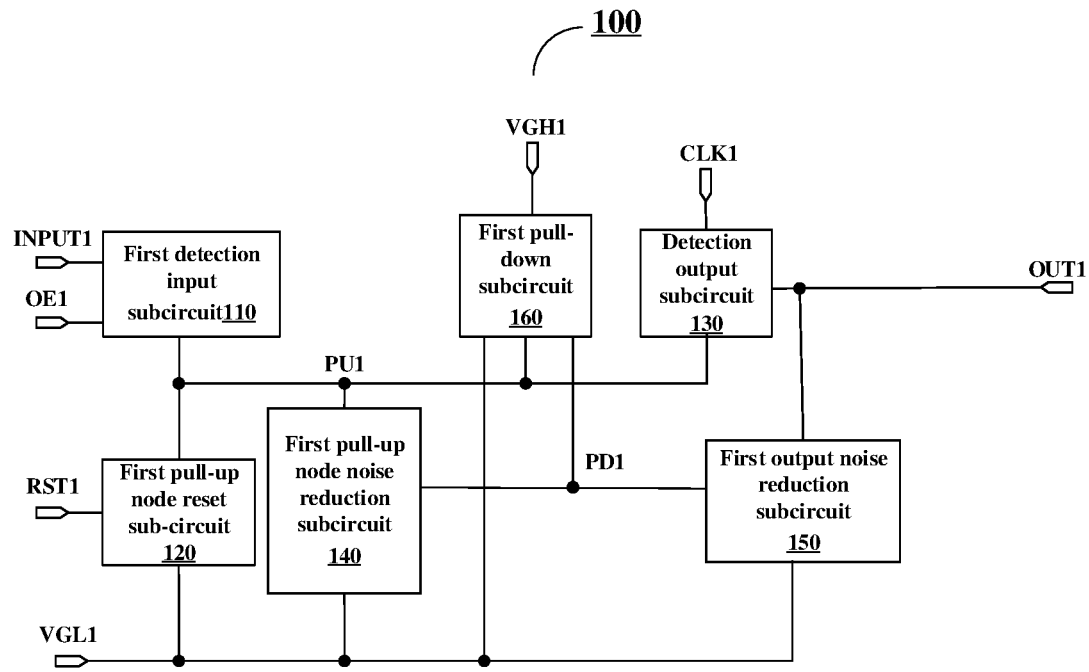
FIG. 3B is a schematic diagram of another detection sub-shift-register of the shift register unit illustrated in FIG. 2.

For example, as illustrated in FIG. 3B, in another example of the embodiment of the present disclosure, on the basis of the example illustrated in FIG. 3A, the detection sub-shift-register 100 further includes a first pull-up node noise reduction sub-circuit 140, a first output noise reduction sub-circuit 150, and a first pull-down sub-circuit 160.

The first pull-up node noise reduction sub-circuit 140 is configured to reduce noise on the first pull-up node PU1 under the control of the level of the first pull-down node PD1. For example, the first pull-up node noise reduction sub-circuit 140 may be configured to be connected to the first voltage terminal VGL1, so as to electrically connect the first pull-up node PU1 and the first voltage terminal VGL1 under the control of the level of the first pull-down node PD1, thereby performing pull-down noise reduction on the first pull-up node PU1.

The first output noise reduction sub-circuit 150 is configured to reduce noise on the detection output terminal OUT1 under the control of the level of the first pull-down node PD1. For example, the first output noise reduction sub-circuit 150 may be configured to electrically connect the detection output terminal OUT1 and the first voltage terminal VGL1 under the control of the level of the first pull-down node PD1, thereby performing pull-down noise reduction on the detection output terminal OUT1.

The first pull-down sub-circuit 160 is configured to control the level of the first pull-down node PD1 under the control of the level of the first pull-up node PU1. For example, the first pull-down sub-circuit 160 may connect the first voltage terminal VGL1, the second voltage terminal VGH1, the first pull-up node PU1, and the first pull-down node PD1 to electrically connect the first pull-down node PD1 and the first voltage terminal VGL1 under the control of the level of the first pull-up node PU1, thereby controlling the level of the first pull-down node PD1, such that when the first pull-up node PU1 is at a high level, the first pull-down node PD1 is at a low level. As illustrated in the figure, the first pull-down sub-circuit 160 can electrically connect the first pull-down node PD1 and the second voltage terminal VGH1 under the control of the level of the second voltage terminal VGH1, so that the first pull-down node PD1 is at a high level. For example, the second voltage terminal VGH1 may be configured to maintain an input of a DC high level signal, which is referred to as a second voltage signal. The following embodiments of the present disclosure are the same as the above and will not be described again.

Figure 4A:
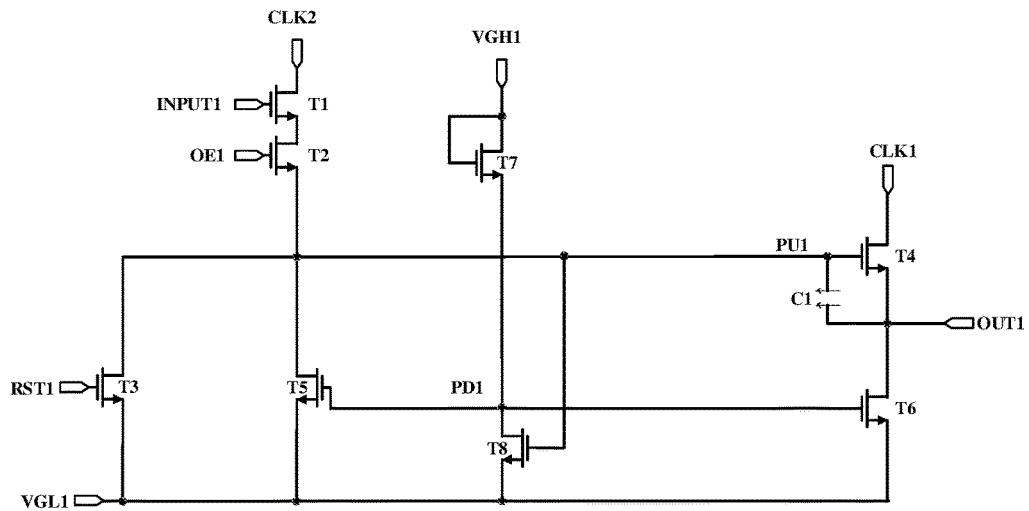
FIG. 4A is a circuit diagram of a specific implementation example of the detection sub-shift-register illustrated in FIG. 3B.

For example, the detection sub-shift-register 100 illustrated in FIG. 3B may be implemented as the circuit structure illustrated in FIG. 4A in one example. In the following description, each transistor is an N-type transistor, and the high level applied to its gate is a turn-on voltage and the low level is a turn-off voltage to realize the switching control of the N-type transistor, but these do not constitute limitations to the embodiments of the present disclosure.

The first detection input sub-circuit 110 may be implemented as a first transistor T1 and a second transistor T2. The gate electrode of the first transistor T1 is configured to be connected to a display output terminal (i.e., the first input terminal INPUT1) to receive a display output signal, the first electrode is configured to be connected to a second clock signal terminal CLK2 to receive a second clock signal, and the second electrode is configured to be connected to the first electrode of the second transistor T2; the gate electrode of the second transistor T2 is configured to be connected to the first random pulse signal terminal OE1 to receive the first random pulse signal, and the second electrode is connected to the first pull-up node PU1, so that when the first transistor T1 is turned on due to the turn-on signal (high level signal) received by the first input terminal INPU1 and the second transistor T2 is simultaneously turned on due to the turn-on signal (high level signal) received by the first random pulse signal terminal OE1, the first pull-up node PU1 is charged, by the high level signal of the second clock signal received by the second clock signal terminal CLK2, to be at a high level.

Figure 4B:
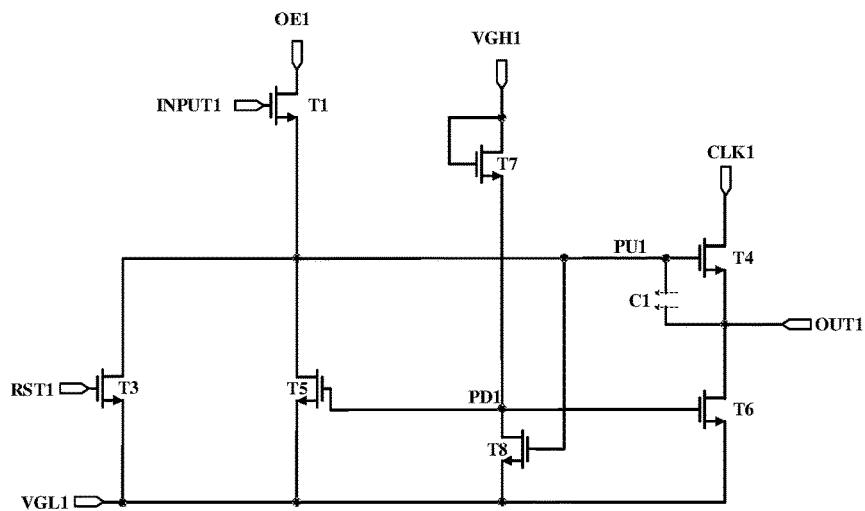
FIG. 4B is a circuit diagram of another specific implementation example of the detection sub-shift-register illustrated in FIG. 3B.
Figure 4C:
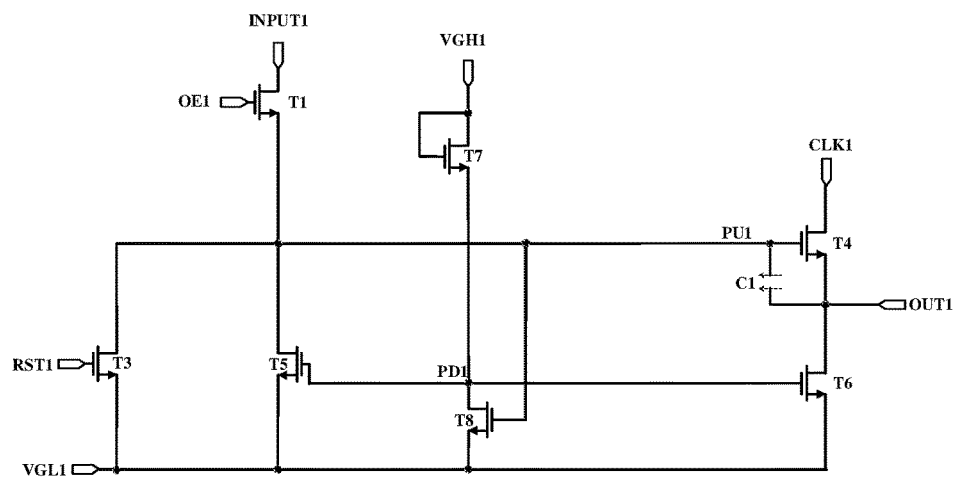
FIG. 4C is a circuit diagram of another specific implementation example of the detection sub-shift-register illustrated in FIG. 3B.

For example, in another example, the first detection input sub-circuit 110 may also be implemented as only the first transistor T1. For example, as illustrated in FIG. 4B, the gate electrode of the first transistor T1 is configured to be connected to the display output terminal (i.e., the first input terminal INPUT1) to receive the display output signal, the first electrode is configured to be connected to the first random pulse signal terminal OE1 to receive the first random pulse signal, and the second electrode is configured to be connected to the first pull-up node PU1. For another example, as illustrated in FIG. 4C, the gate electrode of the first transistor T1 is configured to be connected to the first random pulse signal terminal OE1 to receive the first random pulse signal, the first electrode is configured to be connected to the display output terminal (i.e., the first input terminal INPUT1) to receive the display output signal, and the second electrode is configured to be connected to the first pull-up node PUL.

The first pull-up node reset sub-circuit 120 may be implemented as a third transistor T3. The gate electrode of the third transistor T3 is configured to be connected to the first reset terminal RST1 to receive a first reset signal, the first electrode is configured to be connected to the first pull-up node PU1, and the second electrode is configured to be connected to the first voltage terminal VGL1. When the third transistor T3 is turned on due to the first reset signal, the first pull-up node PU1 and the first voltage terminal VGL1 are electrically connected, so that the first pull-up node PU1 can be reset and lowered from a high level to a low level.

The detection output sub-circuit 130 may be implemented as a fourth transistor T4 and a first storage capacitor C1. The gate electrode of the fourth transistor T4 is configured to be connected to the first pull-up node PU1, that is, controlled by the level of the first pull-up node PU1, that is, the fourth transistor T4 is turned on when the first pull-up node PU1 is at a high level, the fourth transistor T4 is turned off when the first pull-up node PU1 is at a low level, the first electrode of the fourth transistor T4 is configured to be connected to the first clock signal terminal CLK1 to receive a first clock signal, and the second electrode is configured to be connected to the detection output terminal OUT1 to output a detection output signal; the first electrode of the first storage capacitor C1 is connected to the first pull-up node PU1, and the second electrode is connected to the detection output terminal OUT1. When the fourth transistor T4 is turned on, the level of the first pull-up node PU1 can be further pulled up due to the bootstrap effect of the first storage capacitor C1.

The first pull-up node noise reduction sub-circuit 140 may be implemented as a fifth transistor T5. The gate electrode of the fifth transistor T5 is configured to be connected to the first pull-down node PD1, the first electrode is configured to be connected to the first pull-up node PU1, and the second electrode is configured to be connected to the first voltage terminal VGL1. The fifth transistor T5 connects the first pull-up node PU1 and the first voltage terminal VGL1 because the fifth transistor T5 is turned on when the first pull-down node PD1 is at a high level, so that the first pull-up node PU1 can be pulled down to realize noise reduction.

The detection output noise reduction sub-circuit 150 may be implemented as a sixth transistor T6. The gate electrode of the sixth transistor T6 is configured to be connected to the first pull-down node PD1, the first electrode is configured to be connected to the detection output terminal OUT1, and the second electrode is configured to be connected to the first voltage terminal VGL1. Because the sixth transistor T6 is turned on when the first pull-down node PD1 is at a high level, the detection output terminal OUT1 and the first voltage terminal VGL1 are connected, so that the detection output terminal OUT1 can be pulled down to realize noise reduction.

For example, the first pull-down sub-circuit 160 may be implemented as a seventh transistor T7 and an eighth transistor T8. The gate electrode and the first electrode of the seventh transistor T7 are connected and are configured to be connected to the second voltage terminal VGH1 to receive a second voltage signal, and the second electrode is configured to be connected to the first pull-down node PD1; the gate electrode of the eighth transistor T8 is connected to the first pull-up node PU1, the first electrode is connected to the first pull-down node PD1, and the second electrode is configured to be connected to the first voltage terminal VGL1 to receive a first voltage signal. When the first pull-up node PU1 is at a high level, the eighth transistor T8 is turned on, electrically connecting the first pull-down node PD1 with the first voltage terminal VGL1; by selection the on-state resistance of the seventh transistor T7 and the on-state resistance of the eighth transistor T8, the level of the first pull-down node PD1 can be pulled down when the eighth transistor T8 is turned on.

Figure 4D:
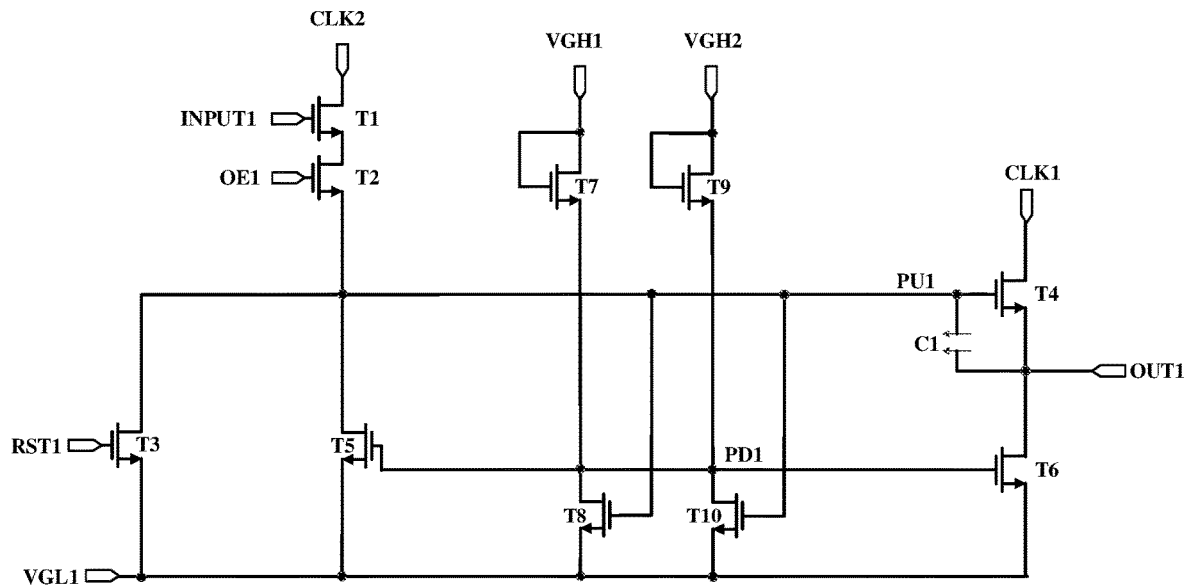
FIG. 4D is a circuit diagram of another specific implementation example of the detection sub-shift-register illustrated in FIG. 3B.

For another example, as illustrated in FIG. 4D, the first pull-down sub-circuit 160 may further include a ninth transistor T9 and a tenth transistor T10. The gate electrode and the first electrode of the ninth transistor T9 are connected and are configured to be connected to the third voltage terminal VGH2 to receive a third voltage signal, and the second electrode is connected to the first pull-down node PD1; the gate electrode of the tenth transistor T10 is connected to the first pull-up node PU1, the first electrode is connected to the first pull-down node PD1, and the second electrode is configured to be connected to the first voltage terminal VGL1 to receive a first voltage signal. When the first pull-up node PU1 is at a high level, the tenth transistor T10 is turned on, electrically connecting the first pull-down node PD1 with the first voltage terminal VGL1; by setting the on-state resistance of the ninth transistor T9 and the on-state resistance of the tenth transistor T10, the level of the first pull-down node PD1 can be pulled down when the tenth transistor T10 is turned on. In this example, the ninth transistor T9 and the tenth transistor T10 are introduced, and the second voltage signal and the third voltage signal are alternately high and low, so that the seventh transistor T7 in connection with the eighth transistor T8 can be alternately operated with the ninth transistor T9 in connection with the tenth transistor T10, thereby reducing the stress of each transistor in the first pull-down sub-circuit and prolonging the service life of these transistors. It should be noted that the first pull-down sub-circuit can also be implemented as an inverter, that is, when the first pull-up node is high, the first pull-down node is low, and vice versa.

Figure 5A:
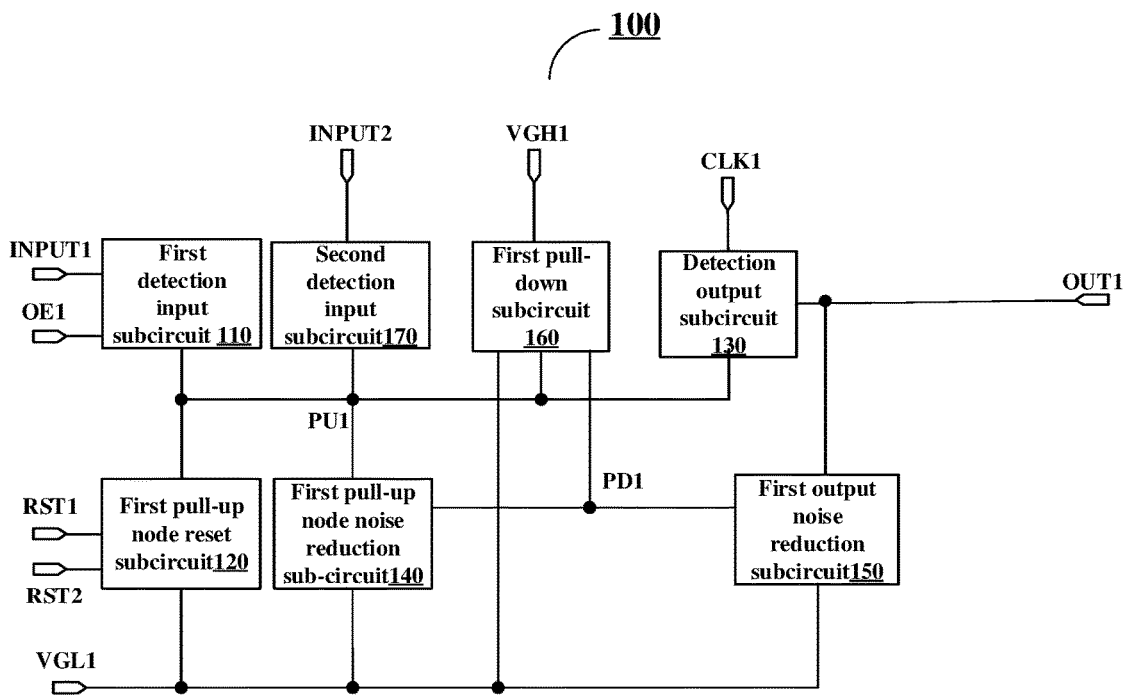
FIG. 5A is a schematic diagram of another detection sub-shift-register of the shift register unit illustrated in FIG. 2.

For example, as illustrated in FIG. 5A, in another example of the embodiment of the present disclosure, on the basis of the example illustrated in FIG. 3B, the detection sub-shift-register 100 further includes a second detection input sub-circuit 170, a detection input terminal INPUT2, and a second reset terminal RST2.

The second detection input sub-circuit 170 is configured to be connected to the detection input terminal INPUT2 to receive a detection input signal and charge the first pull-up node PU1 in response to the detection input signal. For example, the second detection input sub-circuit 170 may be connected to the detection input terminal INPU2 and the first pull-up node PU1, and configured to electrically connect the first pull-up node PU1 and the detection input terminal INPU2 or a high voltage terminal that is otherwise provided under the control of the signal input from the detection input terminal INPU2, so that the high level signal input from the detection input terminal INPU2 or the high level signal output from the high voltage terminal can charge the first pull-up node PU1 to increase the voltage of the first pull-up node PU1, so as to control the conduction of the detection output sub-circuit 130. For example, the detection input signal may be the detection output signal of the detection sub-shift-register 100 of a preceding stage. For example, the second detection input sub-circuit 170 is a circuit for receiving the output signal of the detection sub-shift-register 100 of a preceding stage during line-by-line scanning.

Figure 5B:
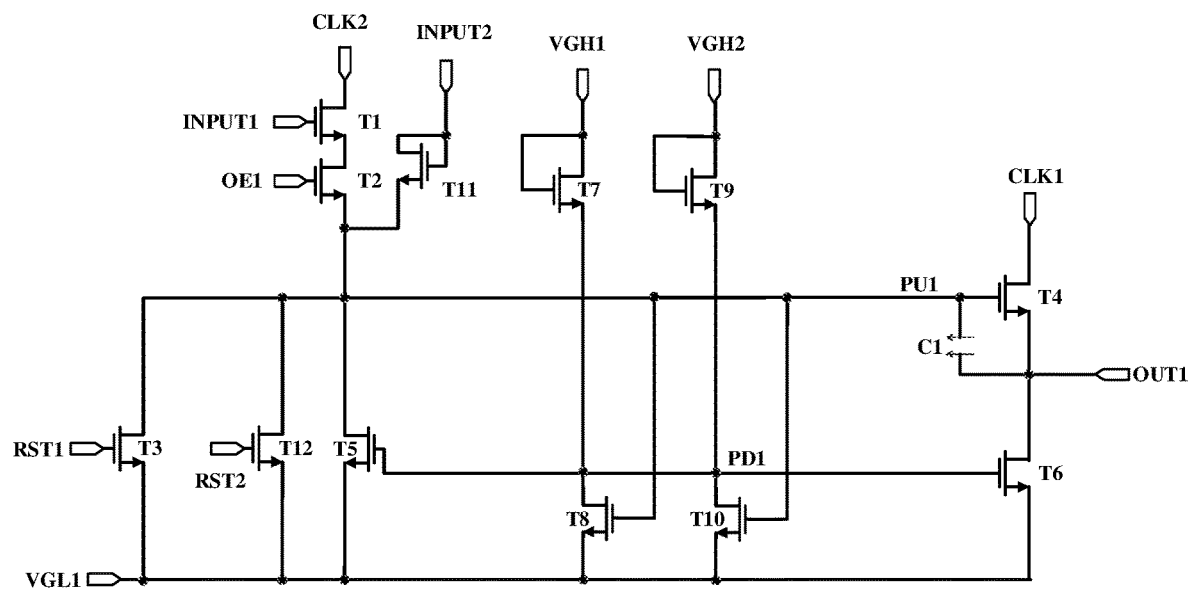
FIG. 5B is a circuit diagram of a specific implementation example of the detection sub-shift-register illustrated in FIG. 5A.
Figure 5C:
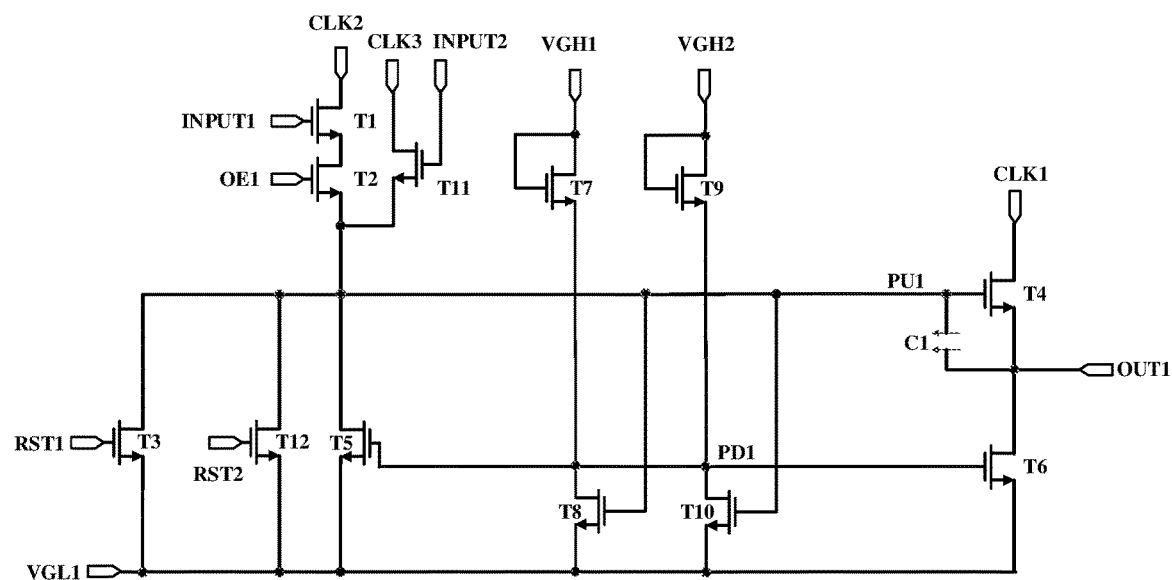
FIG. 5C is a circuit diagram of another specific implementation example of the detection sub-shift-register illustrated in FIG. 5A.

For example, as illustrated in FIG. 5B, on the basis of FIG. 4D, the second detection input sub-circuit 170 may be implemented as an eleventh transistor T1*l*. The gate electrode and the first electrode of the eleventh transistor T11 are connected and are configured to be connected to the detection input terminal INPU2 to receive a detection input signal, and the second electrode is connected to the first pull-up node PUL. For another example, as illustrated in FIG. 5C, the gate electrode of the eleventh transistor T11 is configured to be connected to the detection input terminal INPUT2 to receive the detection input signal, the first electrode is configured to be connected to the third clock signal terminal CLK3 to receive the third clock signal, and the second electrode is connected to the first pull-up node PUL. Therefore, when the eleventh transistor T11 is turned on due to the conduction signal (or high level signal) received by the detection input terminal INPUT2, the conduction signal or the high level signal received by the third clock signal terminal CLK3 is used to charge the first pull-up node PU1 to a high level.

For example, as illustrated in FIG. 5B, corresponding to the second detection input sub-circuit 170, the pull-up node reset circuit 120 in the detection sub-shift-register 100 further includes a twelfth transistor T12. The gate electrode of the twelfth transistor T12 is connected to the second reset terminal RST2 to receive the second reset signal, the first electrode is connected to the first pull-up node PU1, and the second electrode is connected to the first voltage terminal VGL1 to receive the first voltage signal. For example, when the twelfth transistor T12 is turned on in response to the detection output signal from the next stage detection sub-shift-register 100 as the second reset signal, the first pull-up node PU1 and the first voltage terminal VGL1 are electrically connected, so that the first pull-up node PU1 can be reset to be lowered from a high level to a low level.

The detection sub-shift-register 100 of this example may also have a function of line-by-line detection in addition to a function of random detection. For example, when the first random pulse signal terminal OE1 of the detection sub-shift-register 100 has no signal input, the detection sub-shift-register 100 of this example can be used to continue to control the line-by-line compensation of the threshold voltage and the mobility of the drive transistor in the pixel circuit.

When that first random pulse signal terminal OE1 of the detection sub-shift-register 100 normally operates, the first reset signal can turn off the progressive scan function of the detection sub-shift-register 100, and the detection sub-shift-register 100 can output a detection output signal for one row according to the serial number of the row that is currently scanned by the display sub-shift-register 200 and the turn-on level of the first random pulse signal. For example, the first reset signal can reset the first pull-up node of the detection sub-shift-registers 100 at all stages, thereby inhibiting the output of the detection sub-shift-registers 100 at all stages except for the current row, thus realizing the function of closing the line-by-line scanning of the detection sub-shift-registers 100, eliminating the scanning line generated by line-by-line scanning and solving the problem of uneven brightness.

In the following, the description is conducted on the basis of the structure of the detection sub-shift-register 100 in this example. It should be noted that the detection sub-shift-register 100 is not limited to this example, but may be in other structures in the above examples.

Figure 5D:
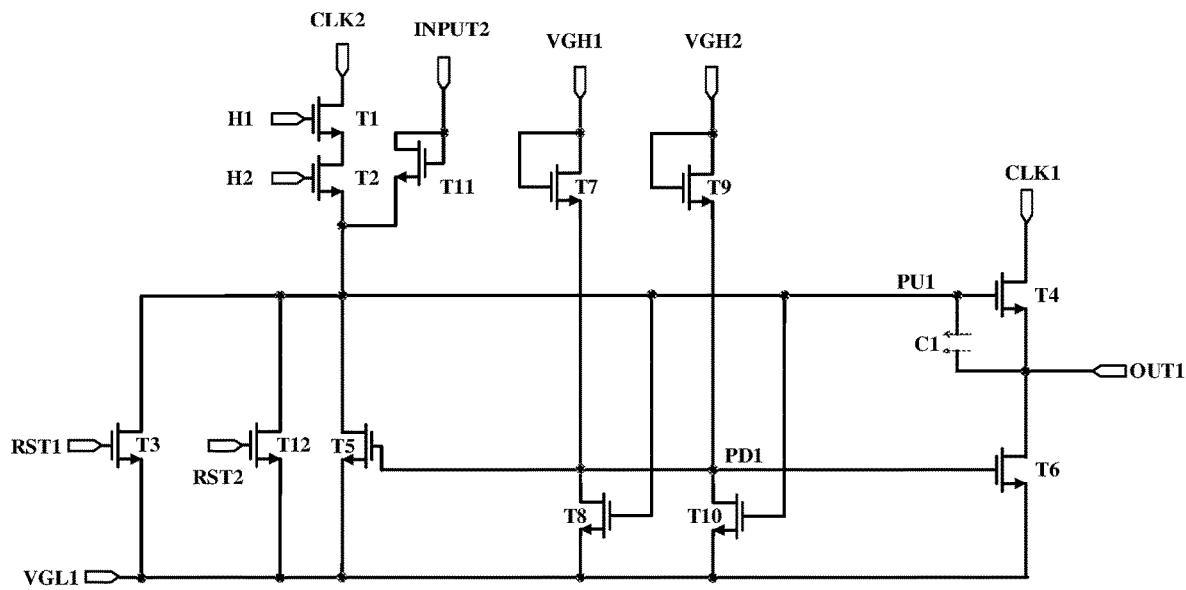
FIG. 5D is a circuit diagram of another specific implementation example of the detection sub-shift-register illustrated in FIG. 5A.
Figure 5E:
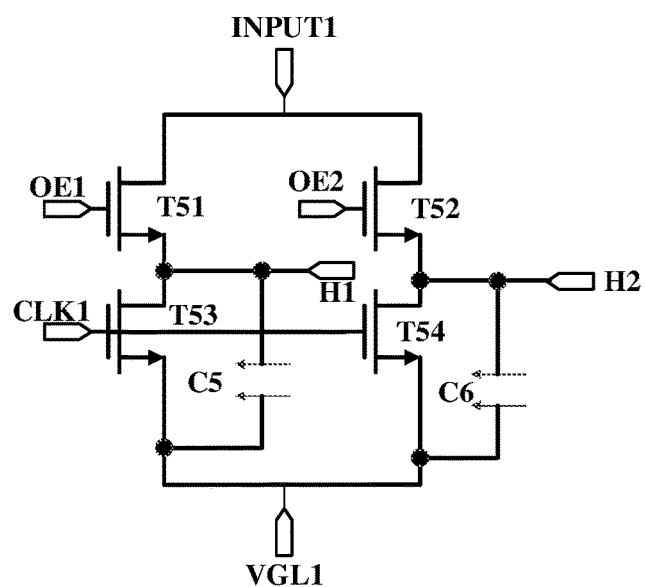
FIG. 5E is a circuit diagram of a random pulse control sub-circuit of the detection sub-shift-register illustrated in FIG. 5D.

For example, as illustrated in FIG. 5D and FIG. 5E, in another example of the embodiment of the present disclosure, on the basis of the example illustrated in FIG. 5B, the first detection input sub-circuit 110 of the detection sub-shift-register 100 further includes a random pulse signal control sub-circuit (not illustrated in the figure). For example, the random pulse signal control sub-circuit is configured to be connected to the first input terminal INPUT1 (display output terminal), the first random pulse signal terminal OE1, and the second random pulse signal terminal OE2 to receive the display output signal, the first random pulse signal, and the second random pulse signal, and to cause the first random pulse signal and the second random pulse signal to be turn-on levels simultaneously in response to the display output signal, the first random pulse signal, and the second random pulse signal.

Through the control by the random pulse signal control sub-circuit on the first random pulse signal and the second random pulse signal, the detection sub-shift-register can output the detection output signal of the shift register unit only when the first random pulse signal and the second random pulse signal are both turn-on levels. On the other hand, when the display sub-shift-register has multi-stage outputs at the same time, the random pulse signal control sub-circuit can output the detection output signal of one row according to the serial number of the row that is currently scanned by the display sub-shift-register 200 and the turn-on levels of the first random pulse signal and the second random pulse signal.

For example, as illustrated in FIG. 5E, an example of the random pulse signal control sub-circuit may be implemented as a fifty-first transistor T51, a fifty-second transistor T52, a fifty-third transistor T53, a fifty-fourth transistor T54, a fifth storage capacitor C5, and a sixth storage capacitor C6.

Figure 5F:
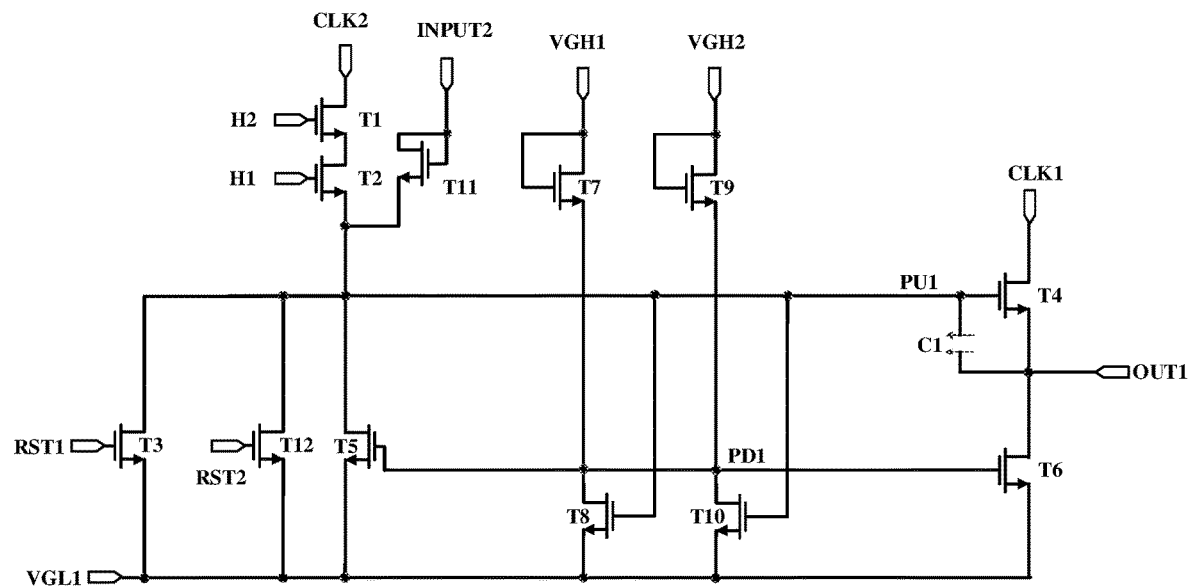
FIG. 5F is a circuit diagram of a random pulse control sub-circuit of the detection sub-shift-register illustrated in FIG. 5A.
Figure 5G:
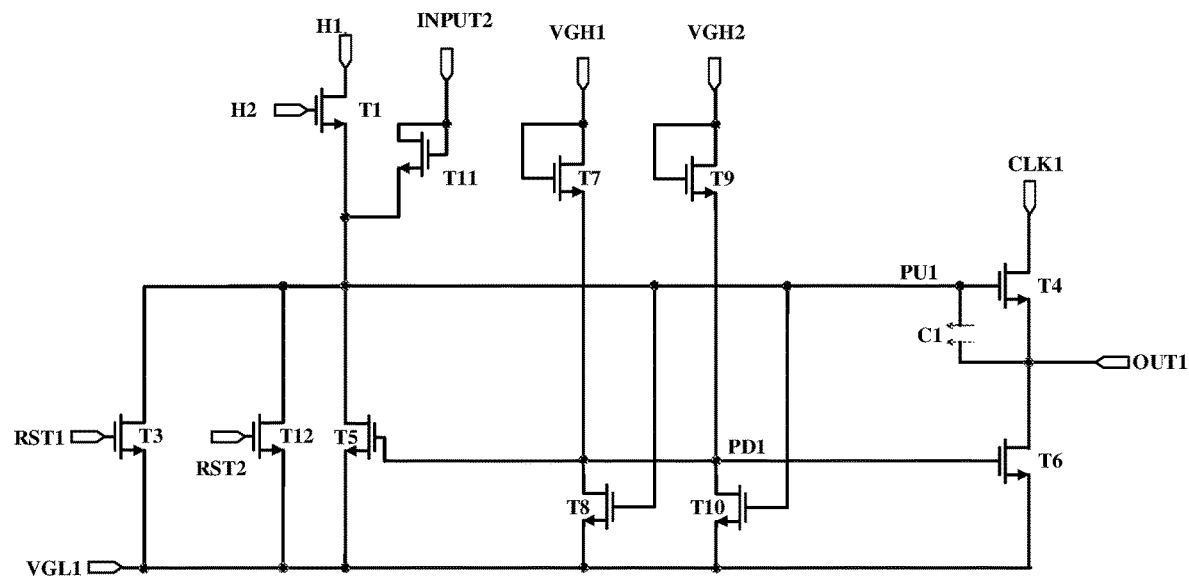
FIG. 5G is a circuit diagram of a random pulse control sub-circuit of the detection sub-shift-register illustrated in FIG. 5A.
Figure 5H:
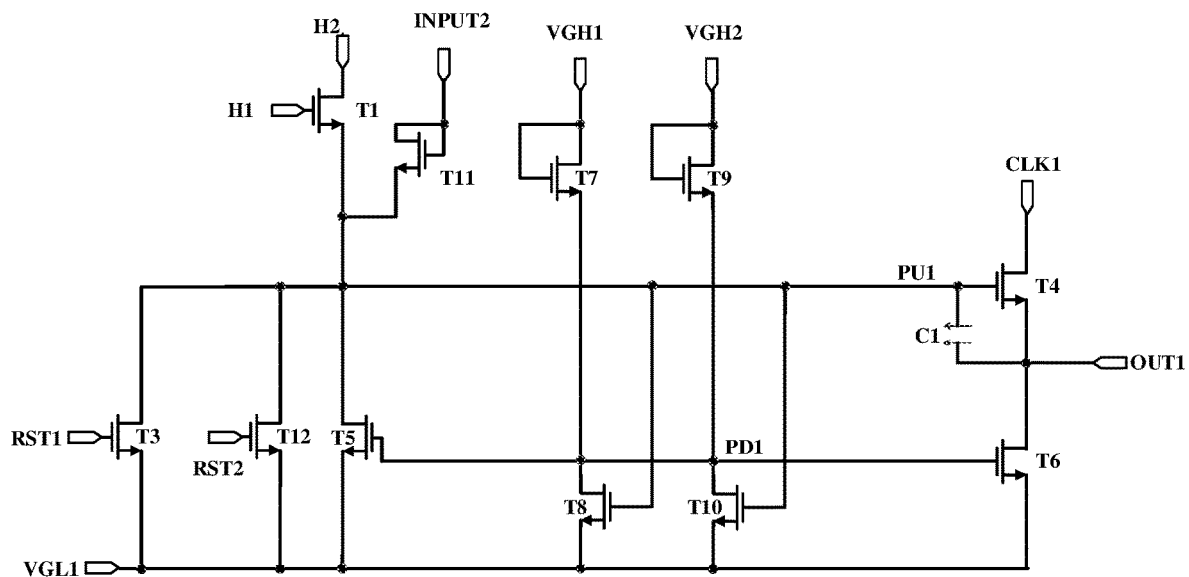
FIG. 5H is a circuit diagram of a random pulse control sub-circuit of the detection sub-shift-register illustrated in FIG. 5A.

For example, in this example, as illustrated in FIG. 5D, the gate electrode of the first transistor T1 is connected to the first output terminal H1 of the random pulse signal control sub-circuit, the first electrode is connected to the second clock signal terminal CLK2, and the second electrode is connected to the first electrode of the second transistor T2. The gate electrode of the second transistor is connected to the second output terminal H2 of the random pulse signal control sub-circuit, and the second electrode is connected to the first pull-up node PUL. Or as illustrated in FIG. 5F, the gate electrode of the first transistor T1 is connected to the second output terminal H2 of the random pulse signal control sub-circuit, the first electrode is connected to the second clock signal terminal CLK2, and the second electrode is connected to the first electrode of the second transistor T2. The gate electrode of the second transistor is connected to the first output terminal H1 of the random pulse signal control sub-circuit, and the second electrode is connected to the first pull-up node PUL. For example, the first detection input sub-circuit 110 may also include only the second transistor T2. For example, as illustrated in FIG. 5G, the gate electrode of the second transistor T2 is connected to the first output terminal H1 of the random pulse signal control sub-circuit, the first electrode is connected to the second output terminal H2 of the random pulse signal control sub-circuit, and the second electrode is connected to the first pull-up node PUL. Alternatively, as illustrated in FIG. 5H, the gate electrode of the second transistor T2 is connected to the second output H2 of the random pulse signal control sub-circuit, the first electrode is connected to the first output H1 of the random pulse signal control sub-circuit, and the second electrode is connected to the first pull-up node PU1.

For example, in this example, as illustrated in FIG. 5E, the gate electrode of the fifty-first transistor T51 is connected to the first random pulse signal terminal OE1, the first electrode is connected to the first input terminal INPUT1 (i.e., the display output terminal OUT2), and the second electrode is connected to the first output terminal H1 of the random pulse signal control sub-circuit. The gate electrode of the fifty-second transistor T52 is connected to the second pulse signal terminal OE2, the first electrode is connected to the first input terminal INPUT1 (i.e., the display output terminal OUT2), and the second electrode is connected to the second output terminal H2 of the random pulse signal control sub-circuit. The gate electrode of the fifty-third transistor T53 is connected to the first clock signal terminal CLK1, the first electrode is connected to the first output terminal H1 of the random pulse signal control sub-circuit, and the second electrode is connected to the first voltage terminal VGL1. The gate electrode of the fifty-fourth transistor T54 is connected to the first clock signal terminal CLK1, the first electrode is connected to the second output terminal H2 of the random pulse signal control sub-circuit, and the second electrode is connected to the first voltage terminal VGL1. The first electrode of the fifth storage capacitor C5 is connected to the first output terminal H1 of the random pulse signal control sub-circuit, and the second electrode is connected to the first voltage terminal VGL1. The first electrode of the sixth storage capacitor C6 is connected to the second output terminal H2 of the random pulse signal control sub-circuit, and the second electrode is connected to the first voltage terminal VGL1.

Figure 6A:
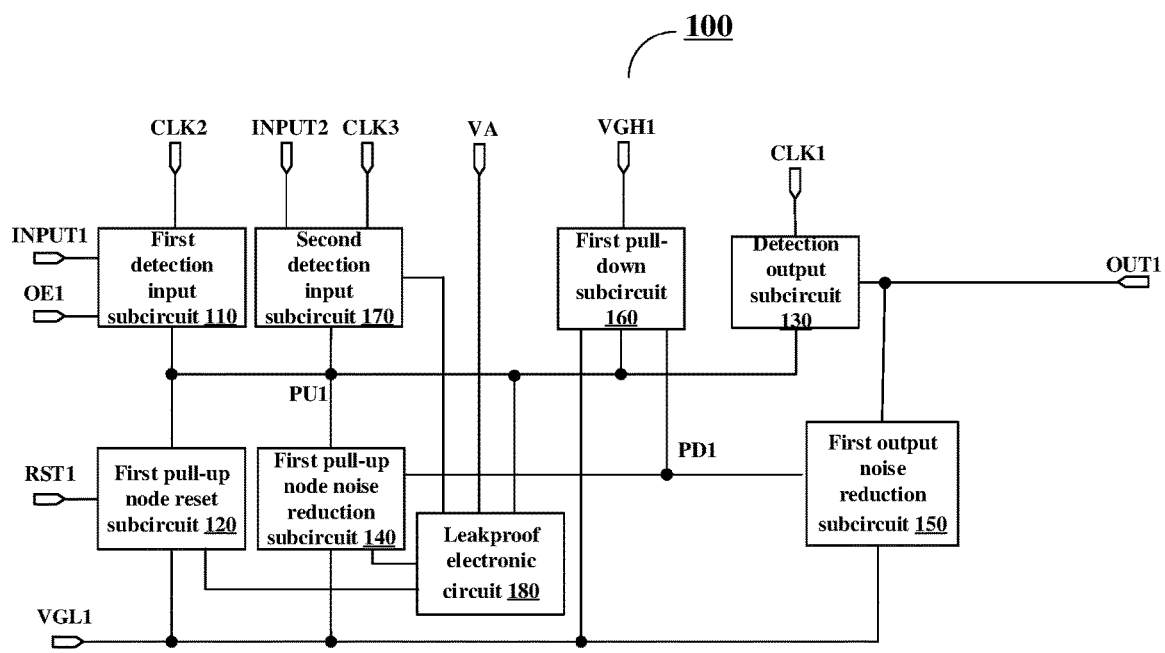
FIG. 6A is a schematic diagram of another detection sub-shift-register of the shift register unit illustrated in FIG. 2.

For example, as illustrated in FIG. 6A, in another example of the embodiment of the present disclosure, on the basis of the example illustrated in FIG. 5A, the detection sub-shift-register 100 further includes a current leak-proof circuit 180.

The current leak-proof circuit 180 is configured to maintain the high level of the first pull-up node PU1 under the control of the level of the first pull-up node PUL. For example, the current leak-proof circuit 180 is connected to the fourth voltage terminal VA, the first pull-up node PU1, the first pull-up node reset sub-circuit 120, the first pull-up node noise reduction sub-circuit 150, and the second detection input sub-circuit 170. The current leak-proof circuit 180 is configured to cause the source electrode and the drain electrode of each transistor connected to the first pull-up node PU1 to be at high levels at the same time under the control of the high level of the first pull-up node PU1, thereby preventing the level of the first pull-up node PU1 from being lowered due to current leakage to affect the display quality.

Figure 6B:
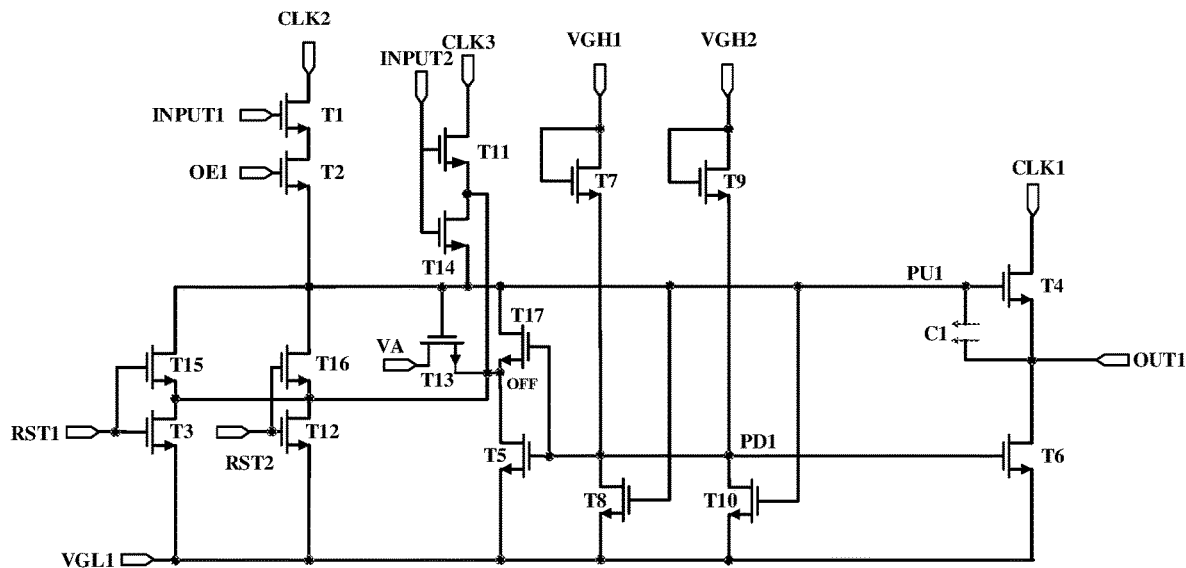
FIG. 6B is a circuit diagram of a specific implementation example of the detection sub-shift-register illustrated in FIG. 6A.

For example, as illustrated in FIG. 6B, the current leak-proof circuit 180 may be implemented as a thirteenth transistor T13. The gate electrode of the thirteenth transistor T13 is connected to the first pull-up node PU1, the first electrode is connected to the fourth voltage terminal VA to receive the fourth voltage signal, and the second electrode is connected to the feedback node OFF, so that when the thirteenth transistor T13 is turned on due to the high level of the first pull-up node PU1, the feedback node OFF is connected to the fourth voltage terminal VA, and thus the feedback node OFF can also be raised to a high level.

For example, in order to realize the current leak-proof function, accordingly, the first pull-up node reset sub-circuit 120, the first pull-up node noise reduction sub-circuit 150, and the second detection input sub-circuit 170 may be respectively implemented as a structure including two transistors.

For example, the second detection input sub-circuit 170 includes an eleventh transistor T11 and a fourteenth transistor T14. The gate electrode of the eleventh transistor T11 is configured to be connected to the detection input terminal INPUT2 to receive a detection input signal, the first electrode is configured to be connected to the third clock signal terminal CLK3 to receive a third clock signal, and the second electrode is connected to the first electrode of the fourteenth transistor T14; the gate electrode of the fourteenth transistor T14 is connected to the gate electrode of the eleventh transistor T11 and is configured to be connected to the feedback node OFF, and the second electrode is connected to the first pull-up node PU1.

The first pull-up node reset sub-circuit 120 includes a third transistor T3, a twelfth transistor T12, a fifteenth transistor T15, and a sixteenth transistor T16. The gate electrode of the third transistor T3 is configured to be connected to the first reset terminal to receive the first reset signal, the first electrode of the third transistor is connected to the second electrode of the fifteenth transistor T15 and is configured to be connected to the feedback node OFF, and the second electrode is configured to be connected to the first voltage terminal VGL1; the gate electrode of the twelfth transistor T12 is connected to the second reset terminal RST2 to receive the second reset signal, the first electrode is connected to the second electrode of the sixteenth transistor T16 and is configured to be connected to the feedback node OFF, and the second electrode is connected to the first voltage terminal VGL1 to receive the first voltage signal; the gate electrode of the fifteenth transistor T15 is connected to the gate electrode of the third transistor T3, and the first electrode is connected to the first pull-up node PUL. The gate electrode of the sixteenth transistor T16 is connected to the gate electrode of the twelfth transistor T12, and the first electrode is connected to the first pull-up node PU1.

The first pull-up node noise reduction sub-circuit includes a fifth transistor T5 and a seventeenth transistor T17. The gate electrode of the fifth transistor T5 is configured to be connected to the first pull-down node PD1, the first electrode is configured to be connected to the second electrode of the seventeenth transistor and is configured to be connected to the feedback node OFF, and the second electrode is configured to be connected to the first voltage terminal VGL1; the gate electrode of the seventeenth transistor T17 is connected to the gate electrode of the fifth transistor T5, and the first electrode is connected to the first pull-up node PU1.

For example, the first electrode of the fifteenth transistor T15 and the first electrode of the sixteenth transistor T16 are both connected to the first pull-up node PU1, and the second electrodes of the two transistors are both connected to the feedback node OFF. Therefore, when the first pull-up node PU1 is at a high level, the thirteenth transistor is turned on, connecting the feedback node OFF and the fourth voltage terminal VA, so that the feedback node OFF can also be raised to a high level. Thus, the first electrodes and the second electrodes of the fifteenth transistor T15 and the sixteenth transistor T16 are kept at a high level at the same time, thereby avoiding the reduction of the level of the first pull-up node PU1 due to the current leakage of the transistor(s) connected to the first pull-up node PU1. The operation principle of the fourteenth transistor T14 in connection with the seventeenth transistor T17 are the same as the above and will not be repeated here.

Figure 7A:
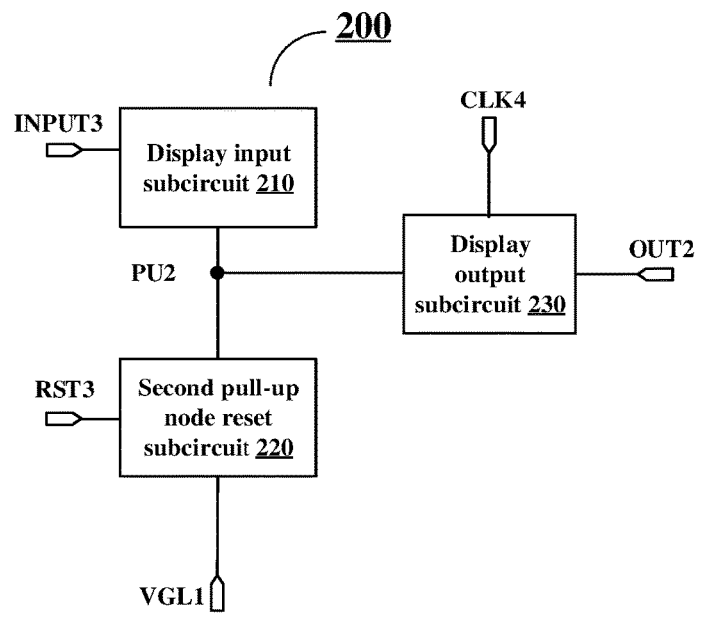
FIG. 7A is a schematic diagram of a display sub-shift-register of the shift register unit illustrated in FIG. 2.

The display sub-shift-register 200 of the shift register unit of the embodiments of the present disclosure may be implemented as various appropriate register circuits as long as the display output signal can be output, or may be further cascaded. For example, FIG. 7A is a schematic diagram of a display sub-shift-register of the shift register unit illustrated in FIG. 2. As illustrated in FIG. 7A, the display sub-shift-register 200 includes a display input sub-circuit 210, a second pull-up node reset sub-circuit 220, and a display output sub-circuit 230.

The display input sub-circuit 210 is configured to charge the second pull-up node PU2 in response to a display input signal. For example, the display input sub-circuit 210 may be connected to the display input terminal INPU3 and the second pull-up node PU2 of the display sub-shift-register 200, configured to electrically connect the second pull-up node PU2 and the display input terminal INPU3 or a high voltage terminal that is otherwise provided under the control of a signal input from the display input terminal INPU3. Therefore, the high-level signal input by the display input terminal INPU3 or the high-level signal output by the high-voltage terminal can charge the second pull-up node PU2 to increase the voltage of the second pull-up node PU2, so as to control the display output sub-circuit 230 to be turned on.

The second pull-up node reset sub-circuit 220 is configured to reset the second pull-up node PU2 in response to the third reset signal received by the third reset terminal RST3, so that the voltage of the second pull-up node PU2 is reduced (pulled down), thereby causing the display output sub-circuit 230 to no longer be turned on. For example, the second pull-up node reset sub-circuit 220 may be configured to be connected to the third reset terminal RST3, so that the second pull-up node PU2 may be electrically connected to a low-level signal or a low-voltage terminal, such as the first voltage terminal VGL1, under the control of a third reset signal input from the third reset terminal RST3, thereby pulling down the second pull-up node PU2 to reset.

The display output sub-circuit 230 is configured to output the fourth clock signal CLK4 to the display output terminal OUT2 as an output signal of the display sub-shift-register 200 under the control of the level of the second pull-up node PU2, so as to drive, for example, a gate line connected to the display output terminal OUT2. For example, the display output sub-circuit 230 may be configured to be turned on under the control of the level of the second pull-up node PU2, electrically connecting the fourth clock signal terminal CLK4 and the display output terminal OUT2, so that the fourth clock signal input by the fourth clock signal terminal CLK4 can be output to the display output terminal OUT2.

Figure 7B:
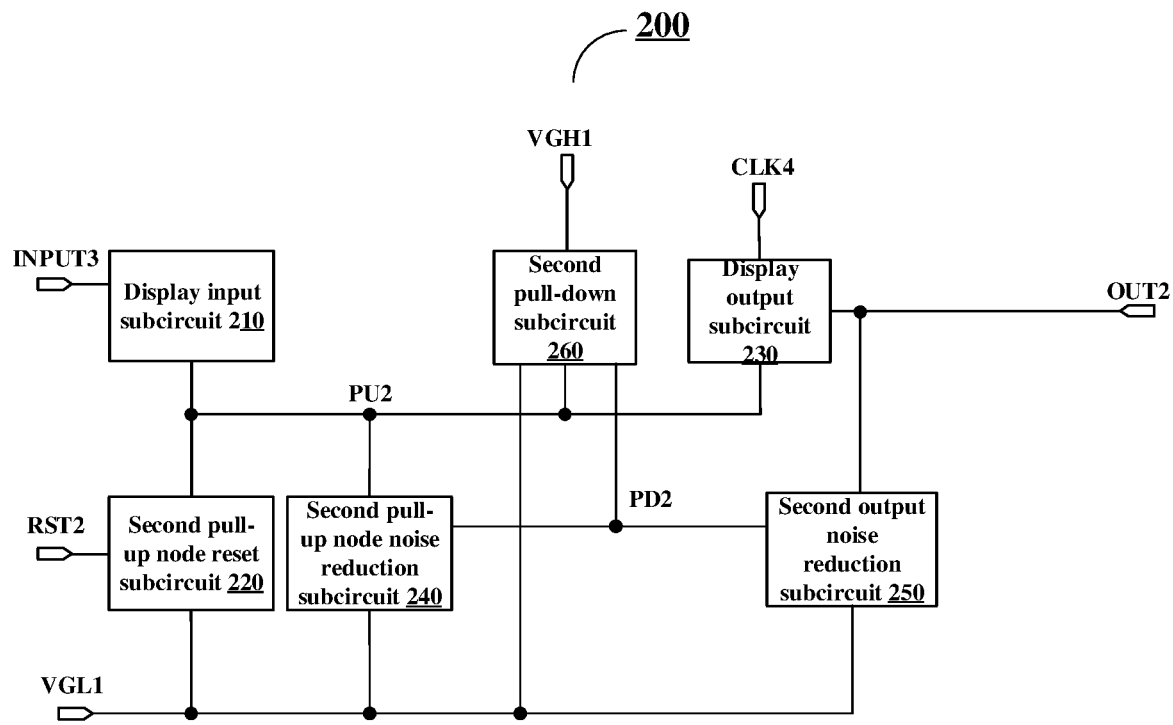
FIG. 7B is a schematic diagram of another display sub-shift-register of the shift register unit illustrated in FIG. 2.

For example, as illustrated in FIG. 7B, in another example of the embodiment of the present disclosure, on the basis of the example illustrated in FIG. 7A, the display sub-shift-register 200 further includes a second pull-up node noise reduction sub-circuit 240, a second output noise reduction sub-circuit 250, and a second pull-down sub-circuit 260.

The second pull-up node noise reduction sub-circuit 240 is configured to reduce noise on the second pull-up node PU2 under the control of the level of the second pull-down node PD2. For example, the second pull-up node noise reduction sub-circuit 240 may be configured to be connected to the first voltage terminal VGL1 so as to electrically connect the second pull-up node PU2 and the first voltage terminal VGL1 under the control of the level of the second pull-down node PD2, thereby performing pull-down noise reduction on the second pull-up node PU2.

The display output noise reduction sub-circuit 250 is arranged under the control of the level of the second pull-down node PD2 to reduce noise at the display output OUT2. For example, the second output noise reduction sub-circuit 250 may be configured to electrically connect the display output terminal OUT2 and the first voltage terminal VGL1 under the control of the level of the second pull-down node PD2, thereby performing pull-down noise reduction on the display output terminal OUT2.

The second pull-down sub-circuit 260 is configured to control the level of the second pull-up node PD2 under the control of the level of the second pull-up node PU2. For example, the second pull-down sub-circuit 260 may connect the first voltage terminal VGL1, the second voltage terminal VGH1, the second pull-up node PU2, and the second pull-down node PD2, so as to electrically connect the second pull-down node PD2 and the first voltage terminal VGL1 under the control of the level of the second pull-up node PU2, thereby performing pull-down control on the level of the second pull-down node PD2 such that the second pull-down node PD2 is at a low level when the second pull-up node PU2 is at a high level. As illustrated in the figure, the first pull-down sub-circuit 160 can electrically connect the second pull-down node PD2 and the second voltage terminal VGH1 under the control of the level of the second voltage terminal VGH1, so that the second pull-down node PD2 is at a high level.

Figure 7C:
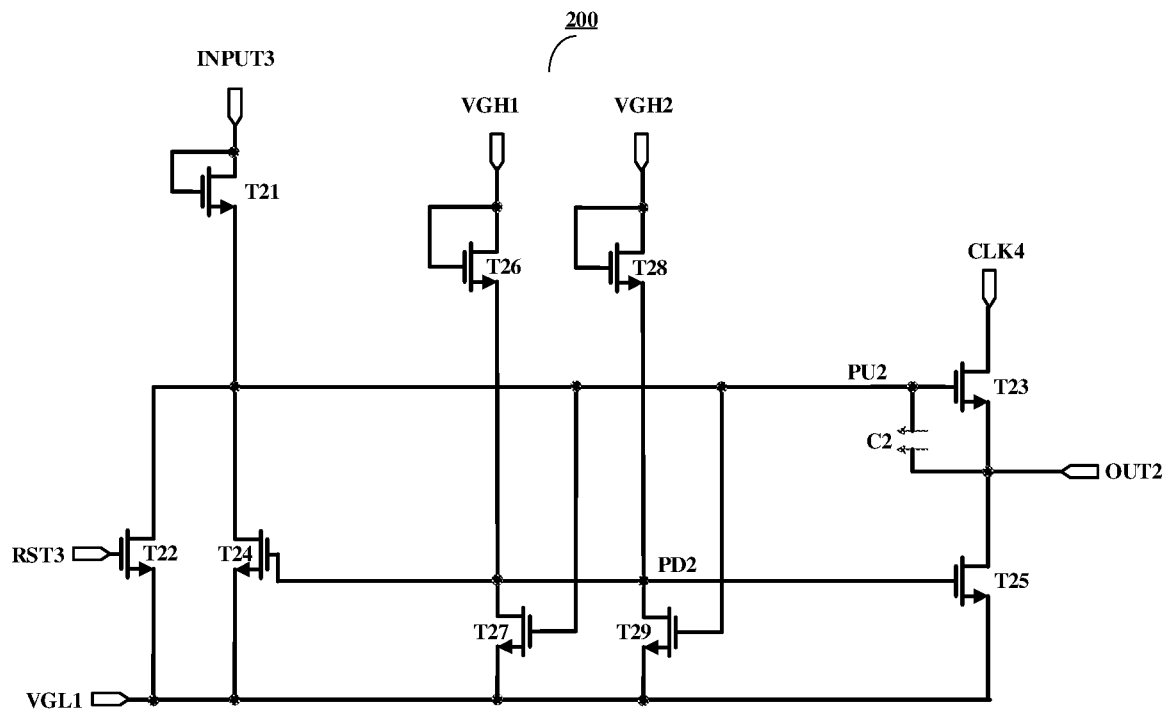
FIG. 7C is a circuit diagram showing one specific implementation example of the display sub-shift-register illustrated in FIG. 7B.

For example, the display sub-shift-register 200 illustrated in FIG. 7B may be implemented as the circuit structure illustrated in FIG. 7C in one example. In the following description, each transistor is illustrated as an N-type transistor, but it is not a limitation to the embodiments of the present disclosure.

The display input sub-circuit 210 may be implemented as a twenty-first transistor T21. The gate electrode and the first electrode of the twenty-first transistor T21 are connected and are configured to be connected to the display input terminal INPU3 to receive an input signal, and the second electrode is configured to be connected to the second pull-up node PU2 to charge the second pull-up node PU2.

The second pull-up node reset sub-circuit 220 may be implemented as a twenty-second transistor T22. The gate electrode of the twenty-second transistor T22 is configured to be connected to the third reset terminal RST3 to receive a reset signal, the first electrode is configured to be connected to the second pull-up node PU2 to reset the second pull-up node PU2, and the second electrode is configured to be connected to the first voltage terminal VGL1 to receive a first voltage.

The display output sub-circuit 230 may be implemented to include a twenty-third transistor T23 and a second storage capacitor C2. The gate electrode of the twenty-third transistor T23 is configured to be connected to the second pull-up node PU2, that is, controlled by the level of the second pull-up node PU2, thus the twenty-third transistor T23 is turned on when the second pull-up node PU2 is at a high level, and the twenty-third transistor T23 is turned off when the second pull-up node PU2 is at a low level; the first electrode is configured to be connected to the fourth clock signal terminal CLK4 to receive a clock signal, and the second electrode is configured to be connected to the display output terminal OUT2; the first electrode of the second storage capacitor C2 is configured to be connected to the gate electrode of the twenty-third transistor T23, and the second electrode is connected to the second electrode of the twenty-third transistor T23. When the twenty-third transistor T23 is turned on, the level of the second pull-up node PU2 can be further pulled up due to the bootstrap effect of the second storage capacitor C2.

The second pull-up node noise reduction sub-circuit 240 may be implemented as a twenty-fourth transistor T24. The gate electrode of the twenty-fourth transistor T24 is configured to be connected to the second pull-up node PD2, the first electrode is configured to be connected to the second pull-up node PU2 to reduce noise of the second pull-up node PU2, and the second electrode is configured to be connected to the first voltage terminal VGL1 to receive the first voltage.

The second output noise reduction sub-circuit 250 may be implemented as a twenty-fifth transistor T25. The gate electrode of the twenty-fifth transistor T25 is configured to be connected to the second pull-down node PD2, the first electrode is configured to be connected to the display output terminal OUT2, and the second electrode is configured to be connected to the first voltage terminal VG1L to receive the first voltage.

The second pull-down sub-circuit 260 may be implemented as a twenty-sixth transistor T26 and a twenty-seventh transistor T27. The gate electrode and the first electrode of the twenty-sixth transistor T26 are connected and are configured to be connected to the second voltage terminal VGH1 to receive a second voltage signal, and the second electrode is configured to be connected to the second pull-down node PD2; the gate electrode of the twenty-seventh transistor T27 is connected to the second pull-up node PU2, the first electrode is connected to the second pull-down node PD2, and the second electrode is configured to be connected to the first voltage terminal VGL1 to receive the first voltage signal. When the second pull-up node PU2 is at a high level, the twenty-seventh transistor T27 is turned on, electrically connecting the second pull-down node PD2 with the first voltage terminal VGL1; by setting the on-state resistance of the twenty-sixth transistor T26 and the on-state resistance of the twenty-seventh transistor T27, when the twenty-seventh transistor T27 is turned on, the level of the second pull-down node PD2 can be pulled down.

For another example, the second pull-down sub-circuit 260 may further include a twenty-eighth transistor T28 and a twenty-ninth transistor T29. The gate electrode and the first electrode of the twenty-eighth transistor T28 are connected and are configured to be connected to the third voltage terminal VGH2 to receive a third voltage signal, and the second electrode is connected to the second pull-down node PD2; the gate electrode of the twenty-ninth transistor T29 is connected to the second pull-up node PU2, the first electrode is connected to the second pull-down node PD2, and the second electrode is configured to be connected to the first voltage terminal VGL1 to receive the first voltage signal. When the second pull-up node PU2 is at a high level, the twenty-ninth transistor T29 is turned on, electrically connecting the second pull-down node PD2 with the first voltage terminal VGL1; by setting the on-state resistance of the twenty-eighth transistor T28 and the on-state resistance of the twenty-ninth transistor T29, when the twenty-ninth transistor T29 is turned on, the level of the second pull-down node PD2 can be pulled down. In this example, the twenty-eighth transistor T28 and the twenty-ninth transistor T29 are introduced, and the second voltage signal and the third voltage signal are alternately high level and low level, so that the twenty-sixth transistor T26 in connection with the twenty-seventh transistor T27 can be alternately operated with the twenty-eighth transistor T28 in connection with the twenty-ninth transistor T29, so that the stress of each transistor in the second pull-down sub-circuit can be reduced, and the service life of these transistors can be prolonged. It should be noted that the second pull-down sub-circuit can be implemented as an inverter, that is, when the second pull-up node is high, the second pull-down node is low, and vice versa.

Figure 8A:
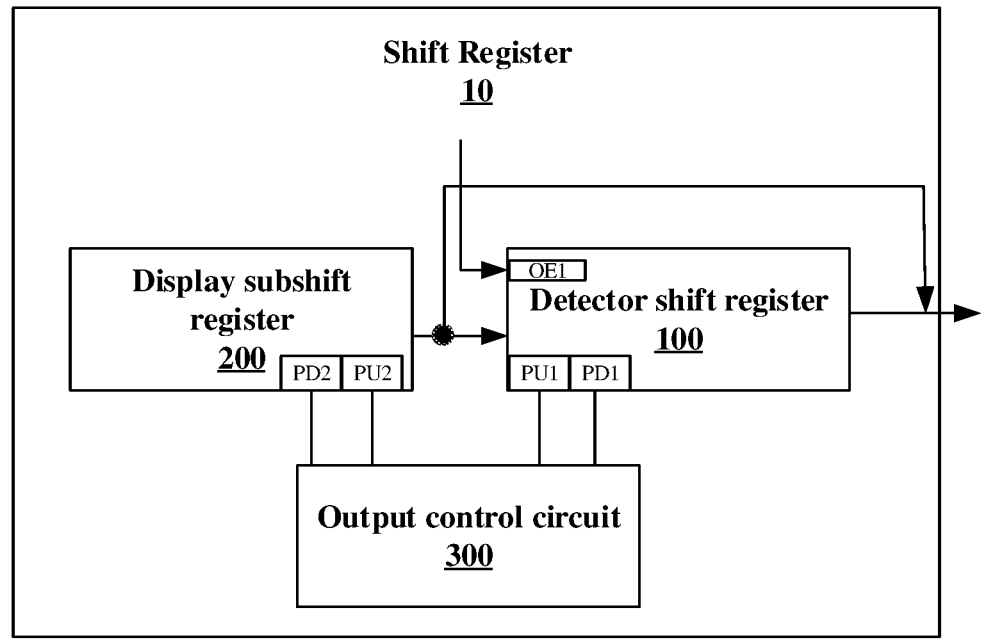
FIG. 8A is a schematic diagram of another shift register unit according to an embodiment of the present disclosure.

FIG. 8A is a schematic diagram of another shift register unit according to an embodiment of the present disclosure.

As illustrated in FIG. 8A, on the basis of the embodiment illustrated in FIG. 2, the shift register unit 10 further includes an output control circuit 300.

As illustrated in FIG. 8A, the output control circuit 300 is electrically connected to the first pull-up node PU1 and the first pull-down node PD1 of the detection sub-shift-register 100 and connected to the second pull-up node PU2 and the second pull-down node PD2 of the display sub-shift-register 200, and is configured to pull down one of the first pull-up node PU1 and the second pull-up node PU2 when the other is at an turn-on level (high level). For example, when the first pull-up node PU1 is at a high level, the level of the second pull-up node PU2 is pulled down, or vice versa, thereby ensuring that the output signal of the detection sub-shift-register 100 is not affected by the output of the display sub-shift-register 200 during the detection output, and the output signal of the display sub-shift-register 200 is not affected by the detection sub-shift-register 100 during the display output. For example, the output control circuit 300 may directly connect the output terminal of the detection sub-shift-register 100 and the output terminal of the display sub-shift-register 200 to output a composite waveform.

Figure 8B:
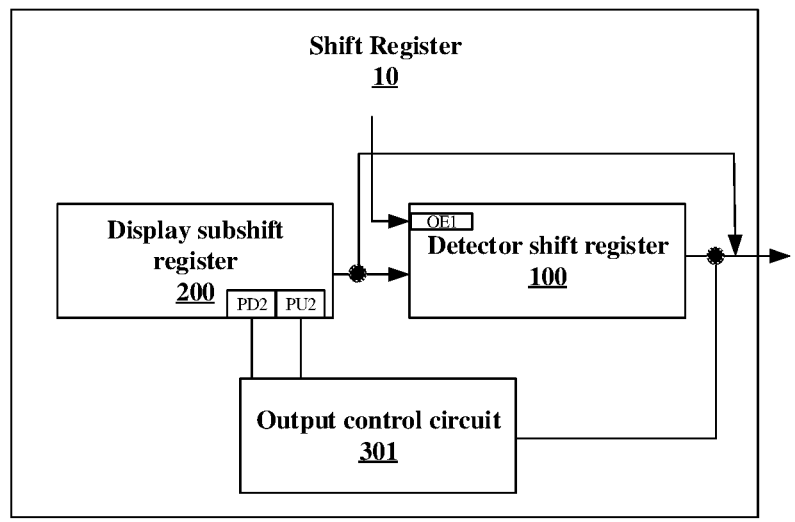
FIG. 8B is a schematic diagram of another shift register unit according to an embodiment of the present disclosure.

As illustrated in FIG. 8B, on the basis of FIG. 8A, the output control circuit 301 can also be implemented in a manner controlled by the detection output signal of the detection output terminal OUT1 of the detection sub-shift-register 100 and the second pull-up node PU2 and the second pull-down node PD2, and the specific connection mode and operation principle thereof will be described below.

Figure 9A:
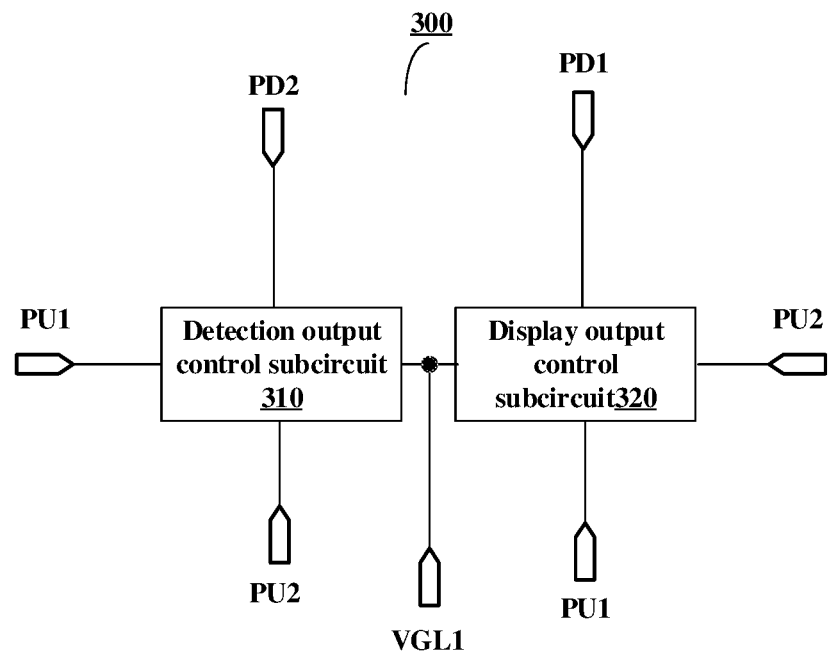
FIG. 9A is a schematic diagram of an output control circuit illustrated in FIG. 8A.

FIG. 9A is a schematic diagram of an output control circuit illustrated in FIG. 8A. As illustrated in FIG. 9A, the output control circuit 300 includes a detection output control sub-circuit 310 and a display output control sub-circuit 320.

The detection output control sub-circuit 310 is configured to control the levels of the second pull-up node PU2 and the second pull-down node PD2 under the control of the level of the first pull-up node PU1. For example, the detection output control sub-circuit 310 is connected to the second pull-up node PU2, the second pull-down node PD2, and the first voltage terminal VGL1, and is configured such that the second pull-up node PU2 and the second pull-down node PD2 are connected to the first voltage terminal VGL1 under the control of the level of the first pull-up node PU1, so that the second pull-up node PU2 and the second pull-down node PD2 can be pulled down to prevent the display sub-shift-register 200 from outputting during the output of the detection sub-shift-register 100.

The display output control sub-circuit 320 is configured to control the levels of the first pull-up node PU1 and the first pull-down node PD1 under the control of the level of the second pull-up node PU2. For example, the display output control sub-circuit 310 is connected to the first pull-up node PU1, the first pull-down node PD1, and the first voltage terminal VGL1, and is configured such that the first pull-up node PU1 and the first pull-down node PD1 are connected to the first voltage terminal VGL1 under the control of the level of the second pull-up node PU2, so that the first pull-up node PU1 and the first pull-down node PD1 can be pulled down to prevent the detection sub-shift-register 100 from outputting during the output of the display sub-shift-register 100.

Figure 9B:
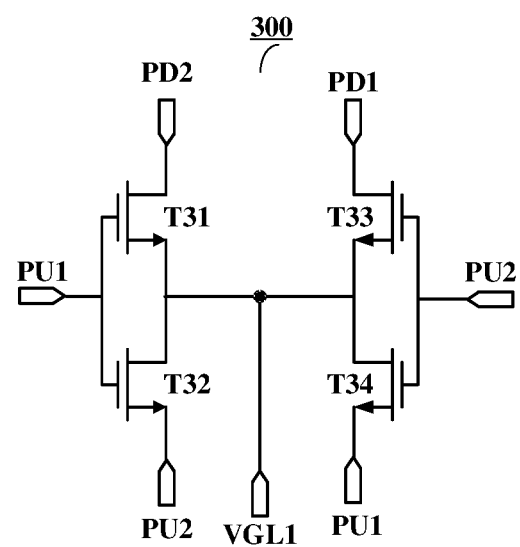
FIG. 9B is a circuit diagram of a specific implementation example of the output control circuit illustrated in FIG. 9A.

For example, the output control circuit 300 illustrated in FIG. 9A may be implemented as the circuit structure illustrated in FIG. 9B in one example. In the following description, each transistor is illustrated as an N-type transistor, but it is not a limitation to the embodiments of the present disclosure.

The detection output control sub-circuit 310 may be implemented as a thirty-first transistor T31 and a thirty-second transistor T32. The gate electrode of the thirty-first transistor T31 is configured to be connected to the first pull-up node PU1, the first electrode is configured to be connected to the second pull-down node PD2, and the second electrode is configured to be connected to the first voltage terminal VGL1; the gate electrode of the thirty-second transistor T32 is configured to be connected to the first pull-up node PU1, the first electrode is configured to be connected to the first voltage terminal VGL1, and the second electrode is configured to be connected to the second pull-up node PU2.

The display output control sub-circuit 320 may be implemented as a thirty-third transistor T33 and a thirty-fourth transistor T34. The gate electrode of the thirty-third transistor T33 is configured to be connected to the second pull-up node PU2, the first electrode is configured to be connected to the first pull-down node PD1, and the second electrode is configured to be connected to the first voltage terminal VGL1; the gate electrode of the thirty-fourth transistor T34 is configured to be connected to the second pull-up node PU2, the first electrode is configured to be connected to the first voltage terminal VGL1, and the second electrode is configured to be connected to the first pull-up node PUL.

The output control circuit 300 can directly connect the output terminal of the detection sub-shift-register 100 and the output terminal of the display sub-shift-register 200 to output a composite waveform to jointly drive, for example, a gate line connected to the shift register 10. At the same time, the output control circuit 300 causes only the display output signal to be output during the display period and only the detection output signal to be output during the interval period, and ensures that when one of the sub-shift-registers outputs, the other sub-shift-register will not interfere.

Figure 9C:
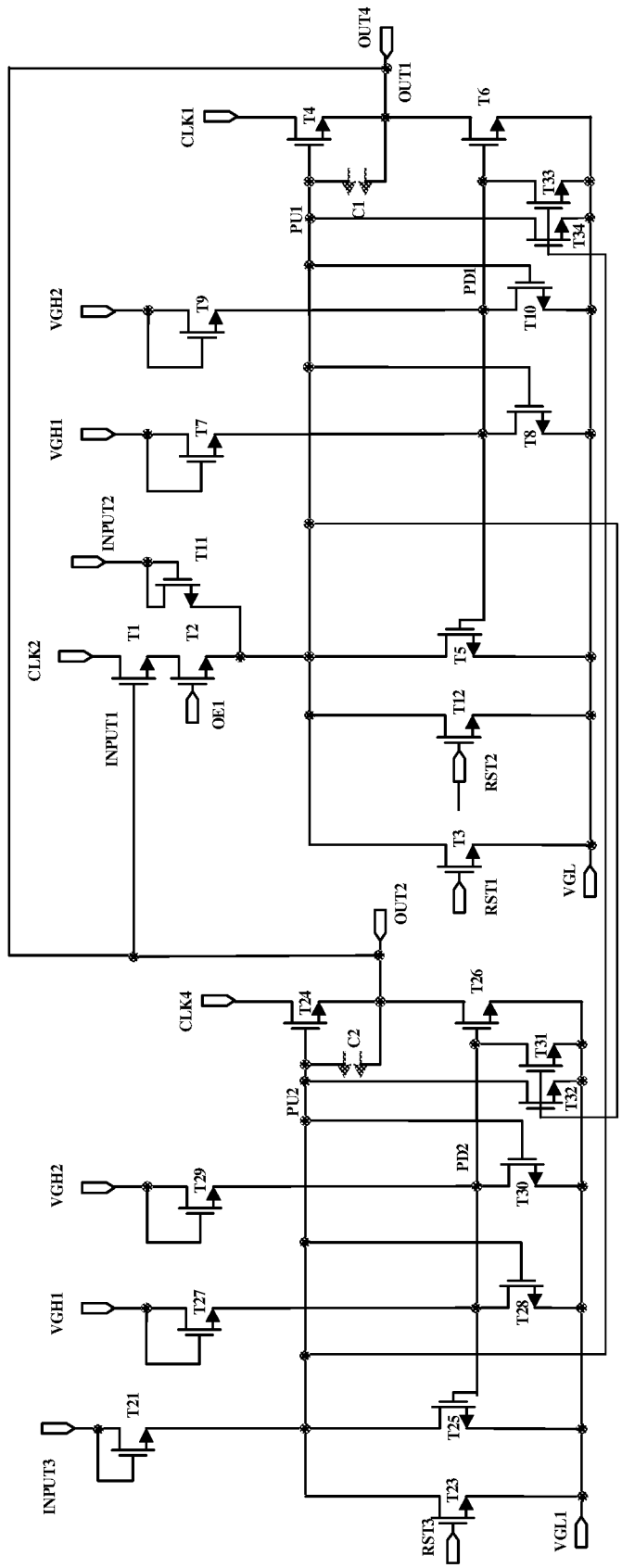
FIG. 9C is a circuit diagram of a specific implementation example of a shift register illustrated in FIG. 8A.

The shift register unit 10 illustrated in FIG. 8A may be implemented as the circuit structure illustrated in FIG. 9C in one example. For example, the detection sub-shift-register 100 and the display sub-shift-register 200 may adopt the sub-shift-register described in any embodiment of the present disclosure and will not be described in detail here. For example, in this example, the display sub-shift-register 200 may adopt the circuit structure illustrated in FIG. 7C, the detection sub-shift-register 100 may adopt the circuit structure illustrated in FIG. 5B, and the output control circuit 300 may adopt the circuit structure illustrated in FIG. 9B; and in FIG. 9C, the display sub-shift-register 200 is specifically implemented as the thirty-first transistor T31, the thirty-second transistor T32, the thirty-third transistor T33, and the thirty-fourth transistor T34, and the specific connection mode and operation principle thereof are as described in the above embodiment, and will not be described here again.

For example, as illustrated in FIG. 9C, the display output terminal OUT2 of the display sub-shift-register 200 is connected to the first input terminal INPUT1 and the detection output terminal OUT1 of the detection sub-shift-register 100, so as to output a composite waveform under the control of the output control circuit 300 to control the gate electrodes of the switching transistors T0 and the sensing transistors S0 in the pixel circuits connected to the gate scan line SCAN as illustrated in FIG. 1D.

Figure 9D:
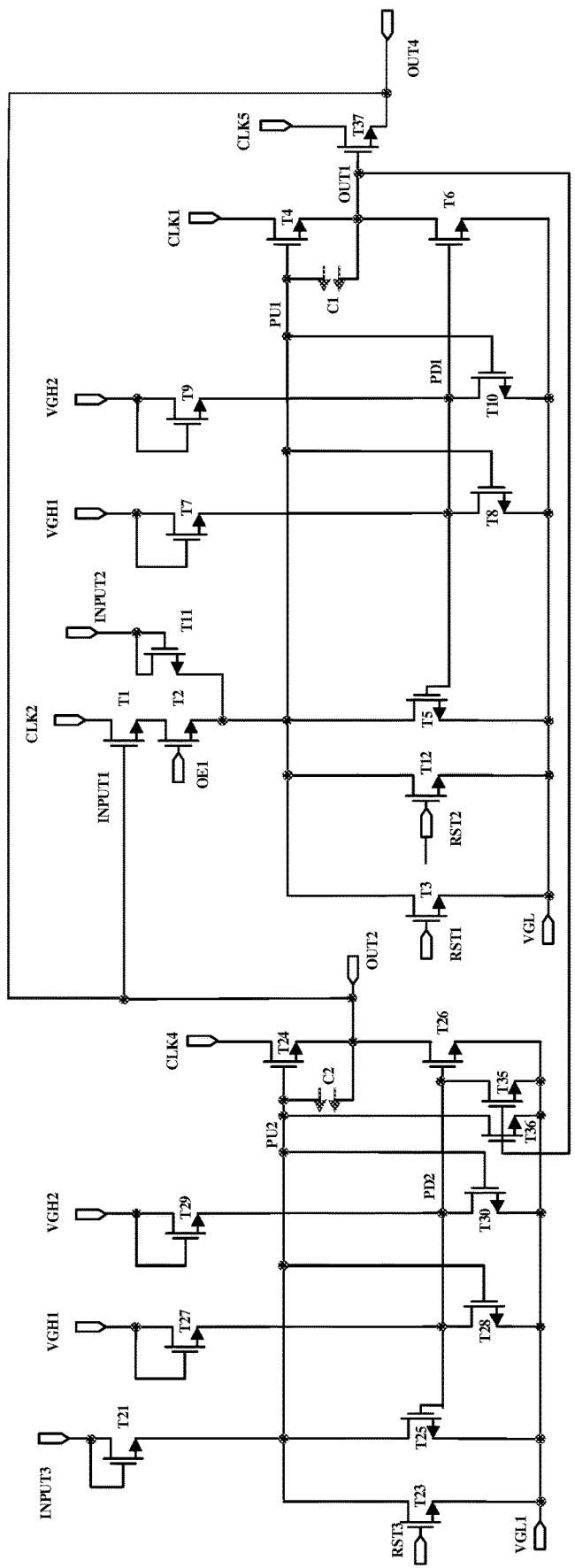
FIG. 9D is a circuit diagram of a specific implementation example of a shift register illustrated in FIG. 8B.

The shift register unit 10 illustrated in FIG. 8B may also be implemented as the circuit structure illustrated in FIG. 9D in one example. For example, the detection sub-shift-register 100 and the display sub-shift-register 200 may adopt the sub-shift-register described in any embodiment of the present disclosure and will not be described in detail here. For example, in this example, the display sub-shift-register 200 may adopt the circuit structure illustrated in FIG. 7C, and the detection sub-shift-register 100 may adopt the circuit structure illustrated in FIG. 5B. As illustrated in FIG. 9D, the output control circuit 300 is implemented by a thirty-fifth transistor T35, a thirty-sixth transistor T36, and a thirty-seventh transistor T37.

As illustrated in FIG. 9D, the gate electrode of the thirty-fifth transistor T35 is configured to be connected to the detection output terminal OUT1 to receive a detection output signal, the first electrode is configured to be connected to the second pull-down node PD2, and the second electrode is configured to be connected to the first voltage terminal VGL1; the gate electrode of the thirty-sixth transistor T36 is configured to be connected to the detection output terminal OUT1 to receive a detection output signal, the first electrode is configured to be connected to the second pull-up node PU2, and the second electrode is configured to be connected to the first voltage terminal VGL1; the gate electrode of the thirty-seventh transistor T37 is configured to be connected to the detection output terminal OUT1 to receive the detection output signal, the first electrode is configured to be connected to the fifth clock signal terminal to receive the fifth clock signal, and the second electrode is configured to be connected to the output composite output terminal OUT4 and the display output terminal OUT2.

The operation principle of the shift register 10 includes: when the detection output terminal OUT1 outputs a high level signal, the thirty-fifth transistor T35 and the thirty-sixth transistor T36 are turned on, and the second pull-up node PU2 and the second pull-down node PD2 of the display sub-shift-register 200 are connected to the first voltage terminal VGL1 and pulled down to a low level, thereby displaying that the output terminal OUT2_N is pulled down to a low level, thereby the display sub-shift-register 200 does not affect the normal operation of the detection sub-shift-register 100; meanwhile, the thirty-seventh transistor T37 is also turned on, thereby outputting the high level of the fifth clock signal to the output composite output terminal OUT4. When the display output terminal OUT2 outputs a high level, the first pull-down node PD1 of the detection sub-shift-register is at a high level, so that the detection output terminal OUT1 outputs a low level, so that the thirty-seventh transistor T37 is turned off, and the output composite output terminal OUT4 outputs only the display output signal output by the display output terminal OUT2.

Figure 10:
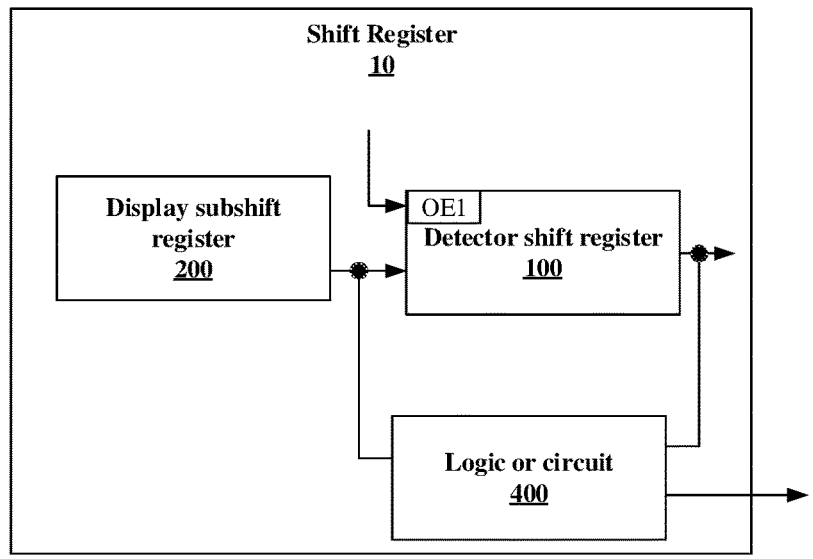
FIG. 10 is a schematic diagram of another shift register unit according to an embodiment of the present disclosure.

FIG. 10 is a schematic diagram of another shift register unit according to an embodiment of the present disclosure. As illustrated in FIG. 10, on the basis of the embodiment illustrated in FIG. 2, the shift register unit 10 further includes a logic OR circuit 400.

As illustrated in FIG. 10, the logic OR circuit 400 is connected to the display output terminal OUT2 of the display sub-shift-register 200 and the detection output terminal OUT1 of the detection sub-shift-register 100, and is configured to perform OR operation on the display output signal and the detection output signal to obtain a composite output signal.

The logic OR circuit 400 and the output control circuit 300 have similar functions, and the output signal of the detection sub-shift-register 100 and the output signal of the display sub-shift-register 200 can be combined to drive the gate line connected to the shift register 10, for example.

Figure 11A:
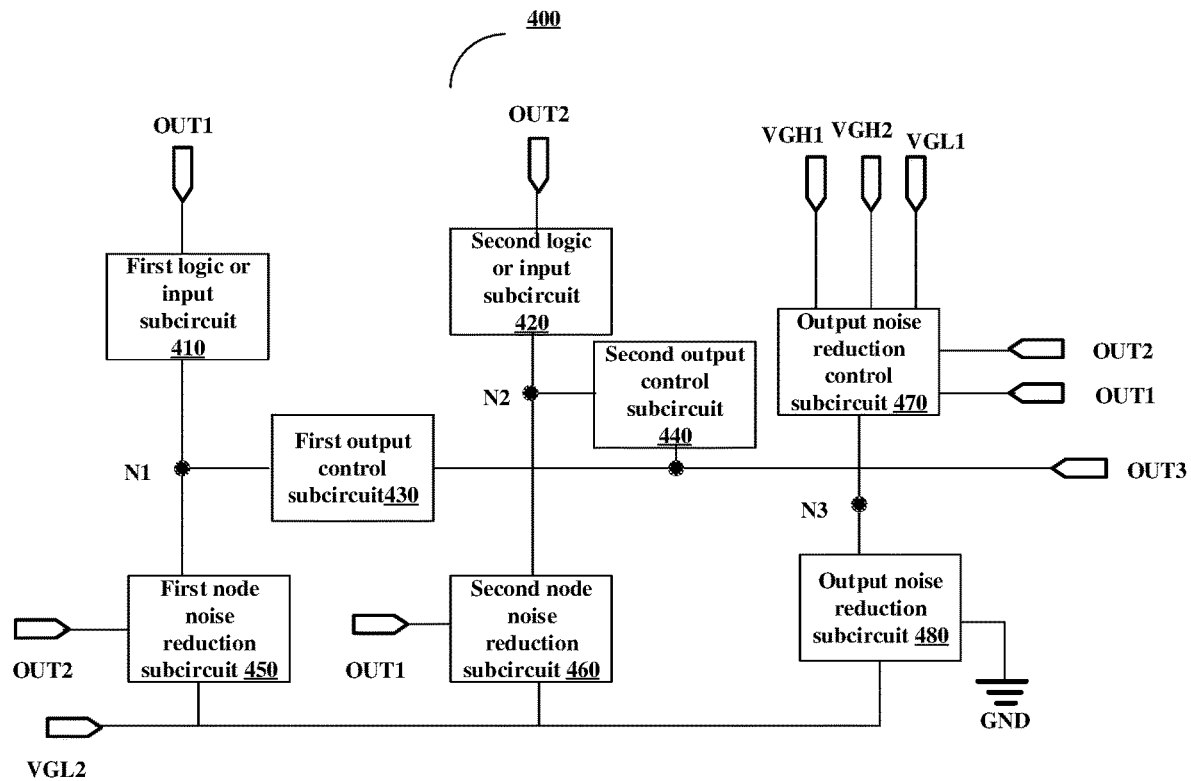
FIG. 11A is a schematic diagram of a logic OR circuit illustrated in FIG. 10.

FIG. 11A is a schematic diagram of a logic OR circuit illustrated in FIG. 10. As illustrated in FIG. 10, the logic OR circuit 400 includes a first logic OR input sub-circuit 410, a second logic OR input sub-circuit 420, a first output control sub-circuit 430, a second output control sub-circuit 440, a first node noise reduction sub-circuit 450, a second node noise reduction sub-circuit 460, an output noise reduction control sub-circuit 470, and an output noise reduction sub-circuit 480.

The first logic OR input sub-circuit 410 is configured to charge the first node N1 in response to the detected output signal. For example, the first logic OR input sub-circuit 410 may be connected to the detection output terminal OUT1 and the first node N1, and configured to electrically connect the first node N1 and the detection output terminal under the control of the detection output signal output from the detection output terminal OUT1, so that the high-level signal input from the detection output terminal OUT1 may charge the first node N1 to increase the voltage of the first node N1 to control the first output control sub-circuit 430 to turn on.

The second logic OR input sub-circuit 420 is configured to charge the second node N2 in response to the display output signal. For example, the second logic OR input sub-circuit 420 may be connected to the display output terminal OUT2 and the second node N2, and configured to electrically connect the second node N2 and the display output terminal OUT2 under the control of the display output signal output from the display output terminal OUT2, so that the high-level signal input from the display output terminal OUT2 may charge the second node N2 to increase the voltage of the second node N2 to control the second output control sub-circuit 440 to turn on.

The first output control sub-circuit 430 is configured to output a detection output signal under the control of the level of the first node N1. For example, the first output control sub-circuit 430 may be configured to be turned on under the control of the level of the first node N1 to electrically connect the detection output terminal OUT1 and the logic OR output terminal OUT3, so that the detection output signal output by the detection output terminal OUT1 can be output to the logic OR output terminal OUT3.

The second output control sub-circuit 440 is configured to output a display output signal under the control of the level of the second node N2. For example, the second output control sub-circuit 440 may be configured to be turned on under the control of the level of the second node N2 to electrically connect the display output terminal OUT2 and the logic OR output terminal OUT3, so that the display output signal output by the display output terminal OUT2 can be output to the logic OR output terminal OUT3.

The first node noise reduction sub-circuit 450 is configured to reduce the noise of the first node N1 under the control of the level of the display output signal. For example, the first node noise reduction sub-circuit 450 may be configured to be connected to the fifth voltage terminal VGL2 to electrically connect the first node N1 and the fifth voltage terminal VGL2 under the control of the level of the display output signal, thereby performing pull-down noise reduction on the first node N1.

The second node noise reduction sub-circuit 460 is configured to reduce the noise of the second node N2 under the control of the level of the detection output signal. For example, the second node noise reduction sub-circuit 460 may be configured to be connected to the fifth voltage terminal VGL2 to electrically connect the second node N2 and the fifth voltage terminal VGL2 under the control of the level of the detection output signal, thereby performing pull-down noise reduction on the second node N2.

The output noise reduction control sub-circuit 470 is configured to control the level of the third node N3 under the control of the level of the display output signal and the level of the detection output signal. For example, the output noise reduction control sub-circuit 470 is configured to be connected to the first voltage terminal VGL1, the second voltage terminal VGH1, the third voltage terminal VGH2, the detection output terminal OUT1, the display output terminal OUT2, and the third node N3, and is configured to connect the third node N3 to the first voltage terminal VGL1 to be at a low level under the control of a high level of one of the display output signal and the detection output signal. Or under the control that the display output signal and the detection output signal are at a low level at the same time, the third node N3 is connected to one of the second voltage terminal VGH1 or the third voltage terminal VGH2 so as to be at a high level.

The output noise reduction sub-circuit 480 is configured to reduce noise on the logic OR output terminal OUT3 under the control of the level of the third node N3. For example, the output noise reduction sub-circuit 480 is connected to the third node N3, the fifth voltage terminal VGL2, the ground terminal GND, and the logic OR output terminal OUT3, and is configured to connect the logic OR output terminal OUT3 to the fifth voltage terminal VGL2 under the control of the level of the third node N3, thereby performing pull-down noise reduction on the logic OR output terminal OUT3.

Figure 11B:
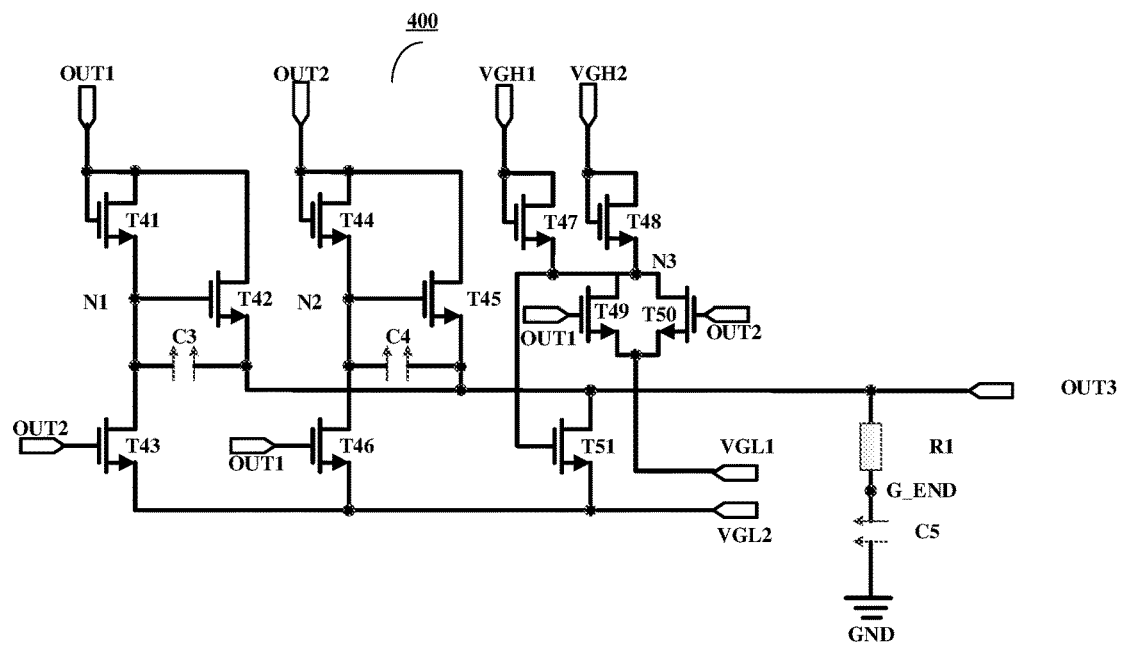
FIG. 11B is a circuit diagram of a specific implementation example of the logic OR circuit illustrated in FIG. 11A.

For example, the logic OR circuit 400 illustrated in FIG. 11A may be implemented as the circuit structure illustrated in FIG. 11B in one example. In the following description, each transistor is illustrated as an N-type transistor, but it is not a limitation to the embodiment of the present disclosure.

The first logic OR input sub-circuit 410 may be implemented as a forty-first transistor T41. The gate electrode and the first electrode of the forty-first transistor T41 are connected and are configured to be connected to the detection output terminal OUT1 to receive a detection output signal, and the second electrode is configured to be connected to the first node N1.

The first output control sub-circuit 430 may be implemented as a forty-second transistor T42 and a third storage capacitor C3. The gate electrode of the forty-second transistor T42 is connected to the first node N1, the first electrode is connected to the detection output terminal OUT1 to receive the detection output signal, and the second electrode is connected to the first electrode of the third storage capacitor C3. The second electrode of the third storage capacitor C3 is connected to the first node N1.

The first node noise reduction sub-circuit 450 may be implemented as a forty-third transistor T43. For example, the gate electrode of the forty-third transistor T43 is connected to the display output terminal OUT2 to receive a display output signal, the first electrode is connected to the first node N1, and the second electrode is connected to the fifth voltage terminal VGL2 to receive a fifth voltage signal.

The second logic OR input sub-circuit 420 may be implemented as a forty-fourth transistor T44. For example, the gate electrode and the first electrode of the forty-fourth transistor T44 are connected and are configured to be connected to the display output terminal OUT2 to receive a display output signal, and the second electrode is configured to be connected to the second node N2.

The second output control sub-circuit 440 may be implemented as a forty-fifth transistor T45 and a fourth storage capacitor C4. The gate electrode of the forty-fifth transistor T45 is connected to the second node N2, the first electrode is connected to the display output terminal OUT2 to receive a display output signal, and the second electrode is connected to the first electrode of the fourth storage capacitor C4. The second electrode of the fourth storage capacitor C4 is connected to the second node N2.

The second node noise reduction sub-circuit 460 may be implemented as a forty-sixth transistor T46. For example, the gate electrode of the forty-sixth transistor T46 is connected to the detection output terminal OUT1 to receive the detection output signal, the first electrode is connected to the second node N2, and the second electrode is connected to the fifth voltage terminal VGL2 to receive the fifth voltage signal.

The output noise reduction control sub-circuit 470 may be implemented as a forty-seventh transistor T47, a forty-eighth transistor T48, a forty-ninth transistor T49, and a fiftieth transistor T50. For example, the gate electrode of the forty-seventh transistor T47 is connected to the first electrode and is configured to be connected to the second voltage terminal VGH1, and the second electrode is connected to the third node N3; the gate electrode of the forty-eighth transistor T48 is connected to the first electrode and is configured to be connected to the third voltage terminal VGH2, and the second electrode is configured to be connected to the third node N3; the gate electrode of the forty-ninth transistor T49 is connected to the detection output terminal OUT1 to receive a detection output signal, the first electrode is connected to the third node N3, and the second electrode is connected to the first voltage terminal VGL1; the gate electrode of the fiftieth transistor T50 is connected to the display output terminal OUT2 to receive a display output signal, the first electrode is connected to the third node N3, and the second electrode is connected to the first voltage terminal VGL1.

The output noise reduction sub-circuit 480 may be implemented as a fifty-first transistor T51, a first resistor R1 and a fifth storage capacitor C5. For example, the gate electrode of the fifty-first transistor T51 is connected to the third node N3, the first electrode is connected to the logic OR output terminal OUT3, and the second electrode is connected to the fifth voltage terminal VGL2 to receive the fifth voltage signal. The first terminal of the first resistor R1 is connected to the logic OR output terminal OUT3, and the second terminal is connected to the first electrode of the fifth storage capacitor C5. The second electrode of the fifth storage capacitor C5 is connected to the ground terminal GND. It should be noted that the fifth voltage terminal VGL2 maintains, for example, an input of a DC low level signal, and this DC low level is referred to as a fifth voltage. The following embodiments are the same and will not be described again.

It should be noted that the transistors used in the embodiments of the present disclosure can be thin film transistors or field effect transistors or other switching devices with the same characteristics, and the embodiments of the present disclosure are all described with thin film transistors as examples. The source electrode and the drain electrode of a transistor used here can be symmetrical in structure, so the source electrode and the drain electrode can be structurally indistinguishable. In the embodiments of the present disclosure, in order to distinguish these two electrodes of the transistor except for the gate electrode, one electrode is directly described as the first electrode and the other electrode is described as the second electrode.

In addition, the transistors in the embodiments of the present disclosure are all described by taking N-type transistors as examples, in which the first electrode of the transistor is a drain electrode and the second electrode is a source electrode. It should be noted that this disclosure includes but is not limited to this case. For example, one or more transistors in the shift register unit provided by any embodiment of the present disclosure may also adopt a P-type transistor. In this case, the first electrode of the transistor is the source electrode and the second electrode is the drain electrode. It is only necessary to set the polarity of each electrode of the selected type of transistor according to the polarity of each electrode of the corresponding transistor in the embodiments of the present disclosure.

Figure 12A:
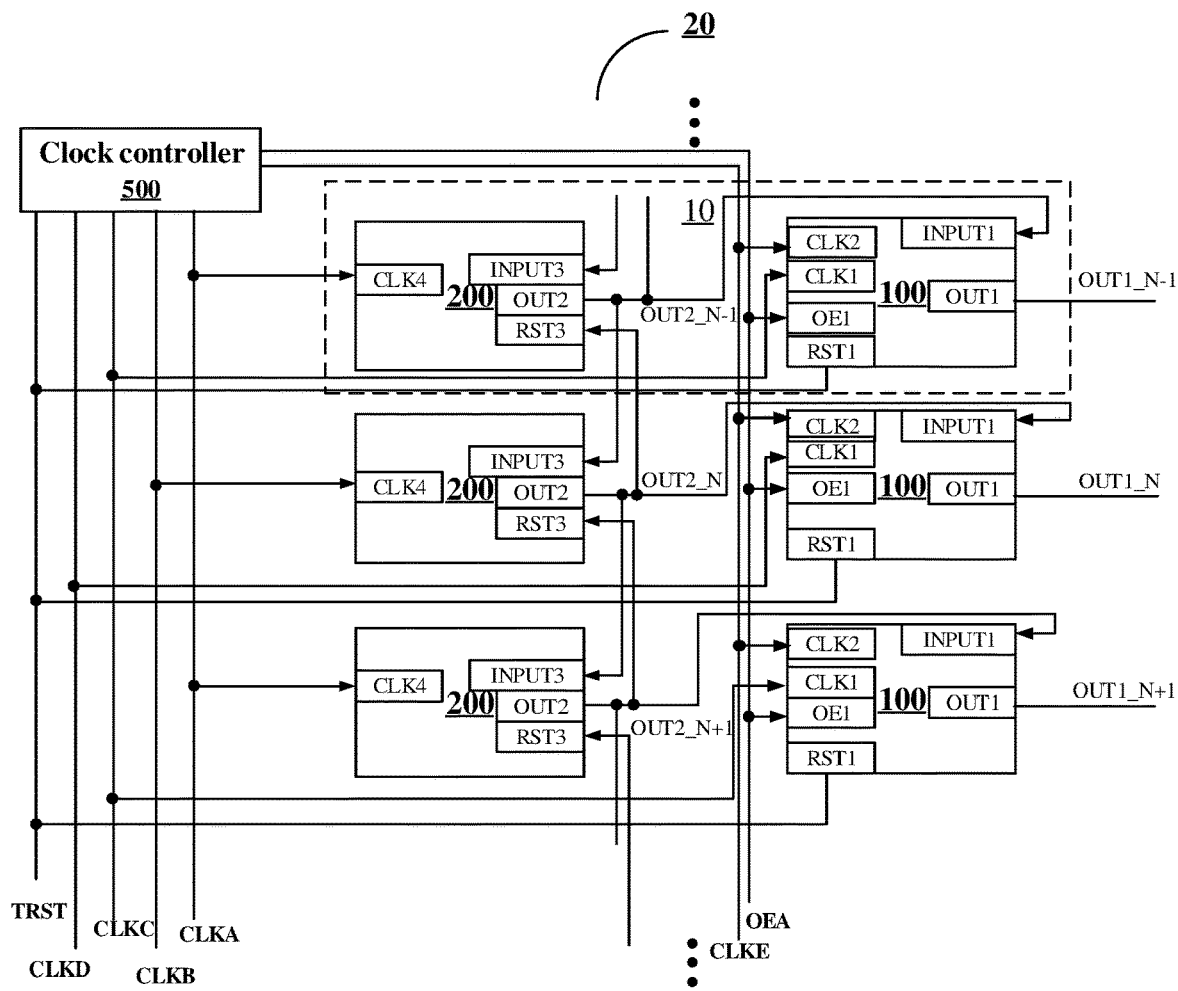
FIG. 12A is a schematic diagram of a gate drive circuit according to an embodiment of the present disclosure.

An embodiment of the present disclosure provides a gate drive circuit 20, as illustrated in FIG. 12A, which includes a plurality of cascaded shift register units 10. For example, the shift register unit 10 may adopt any of the shift register units provided in the above embodiment. For example, each shift register unit 10 includes a detection sub-shift-register 100 and a display sub-shift-register 200. For example, the first input terminal INPUT1 of each detection sub-shift-register 100 is connected to the display output terminal OUT2 of the display sub-shift-register 200. The gate drive circuit 20 can be directly integrated on the array substrate of a display device using the same manufacturing processes as those of a thin film transistor and used to realize the line-by-line scanning drive function. For example, in this example, the display sub-shift-register 200 may adopt the circuit structure in FIG. 7C, and the detection sub-shift-register 100 may adopt the circuit structure in FIG. 4D.

For example, the gate drive circuit 20 further includes a first random pulse signal line OEA and a total reset line TRST. The first random pulse signal terminal OE1 of each detection sub-shift-register 100 is connected to the first random pulse signal line OEA; the first reset terminal RST1 of each detection sub-shift-register 100 is connected to the total reset line TRST.

For example, as illustrated in FIG. 12A, except for the display sub-shift-register 200 of the last stage, the third reset terminal RST3 of the display sub-shift-register 200 of each other stage is connected to the display output terminal OUT2 of the display sub-shift-register 200 of the next stage of the other stage. Except for the display sub-shift-register 200 of the first stage, the display input terminal INPUT3 of the display sub-shift-register 200 of each other stage is connected to the display output terminal OUT2 of the display sub-shift-register 200 of the preceding stage of the other stage.

It should be noted that in the embodiments of the present disclosure, one shift register unit B is referred to as the shift register unit of the next stage for another shift register unit A, indicating that the gate scan signal output by the shift register unit B is later in timing than the gate scan signal output by the shift register unit A. Correspondingly, one shift register unit B is the shift register unit of the preceding stage of another shift register unit A, indicating that the gate scan signal output by the shift register unit B is earlier in timing than the gate scan signal output by the shift register unit A. The following embodiments are the same and will not be described again.

For example, the gate drive circuit 20 further includes a first clock signal line CLKA and a second clock signal line CLKB. The first clock signal line CLKA is connected to the clock signal terminal CLK4 of the display sub-shift-register 200 of the (2n−1)th (n is an integer greater than 0) stage; the second clock signal line CLKB is connected to the clock signal terminal CLK4 of the display sub-shift-register 200 of the 2(N)th stage. It should be noted that the embodiments of the present disclosure includes but is not limited to the above-mentioned connection mode. For example, the first clock signal line CLKA may be connected to the clock signal terminal CLK4 of the display sub-shift-register 200 of the 2(N)th stage, and the second clock signal line CLKB may be connected to the clock signal terminal CLK4 of the display sub-shift-register 200 of the (2n−1)th stage.

For example, the gate drive circuit 20 provided in an embodiment of the present disclosure further includes a third clock signal line CLKC, a fourth clock signal line CLKD, and a fifth clock signal line CLKE. The third clock signal line CLKC is connected to the clock signal terminal CLK1 of the detection sub-shift-register 100 of the (2n−1)th stage. The fourth clock signal line CLKD is connected to the clock signal terminal CLK1 of the detection sub-shift-register 100 of the 2(N)th stage, and the fifth clock signal line CLKE is connected to the second clock signal terminal CLK2 of the detection sub-shift-register 100 of each stage to input a second clock signal.

It should be noted that OUT1_N−1 and OUT2_N−1 illustrated in FIG. 12A respectively represent the output terminals of the (N−1)th stage (n is an integer greater than 1) detection sub-shift-register 100 and the display sub-shift-register 200, OUT1_N and OUT2_N respectively represent the output terminals of the detection sub-shift-register 100 of the (N)th stage and the display sub-shift-register 200, OUT1_N+1 and out2+1 respectively represent the output terminals of the (N+1)th stage detection sub-shift-register 100 and the display sub-shift-register 200. The reference numerals in the following embodiments are similar to the above case and will not be repeated here.

For example, the display input terminal INPUT1 of the display sub-shift-register of the first stage may be configured to receive a trigger signal STV, and the third reset terminal RST3 of the display sub-shift-register 200 of the last stage may be configured to receive a reset signal RESET, and the trigger signal STV and the reset signal RESET are not illustrated in FIG. 12A.

For example, as illustrated in FIG. 12A, the gate drive circuit 20 may further include a timing controller 500. For example, the timing controller 500 may be configured to be connected to the first clock signal line CLKA, the second clock signal line CLKB, the third clock signal line CLKC, the fourth clock signal line CLKD, the fifth clock signal line CLKE, the total reset line TRST, and the first random pulse signal line OEA to provide the clock signals, the first random pulse signal, and the first reset signal, respectively, to the display sub-shift-register 200 and the detection sub-shift-register 100 of each stage. The timing controller 500 may also be configured to provide a trigger signal STV and a reset signal RESET.

The detection sub-shift-register 100 in the gate drive circuit 20 does not have a line-by-line scan function, and the output of the detection output signal of the detection sub-shift-register 100 is determined only by the first random pulse signal and the detection output signal of the display sub-shift-register connected to the detection sub-shift-register.

Figure 12B:
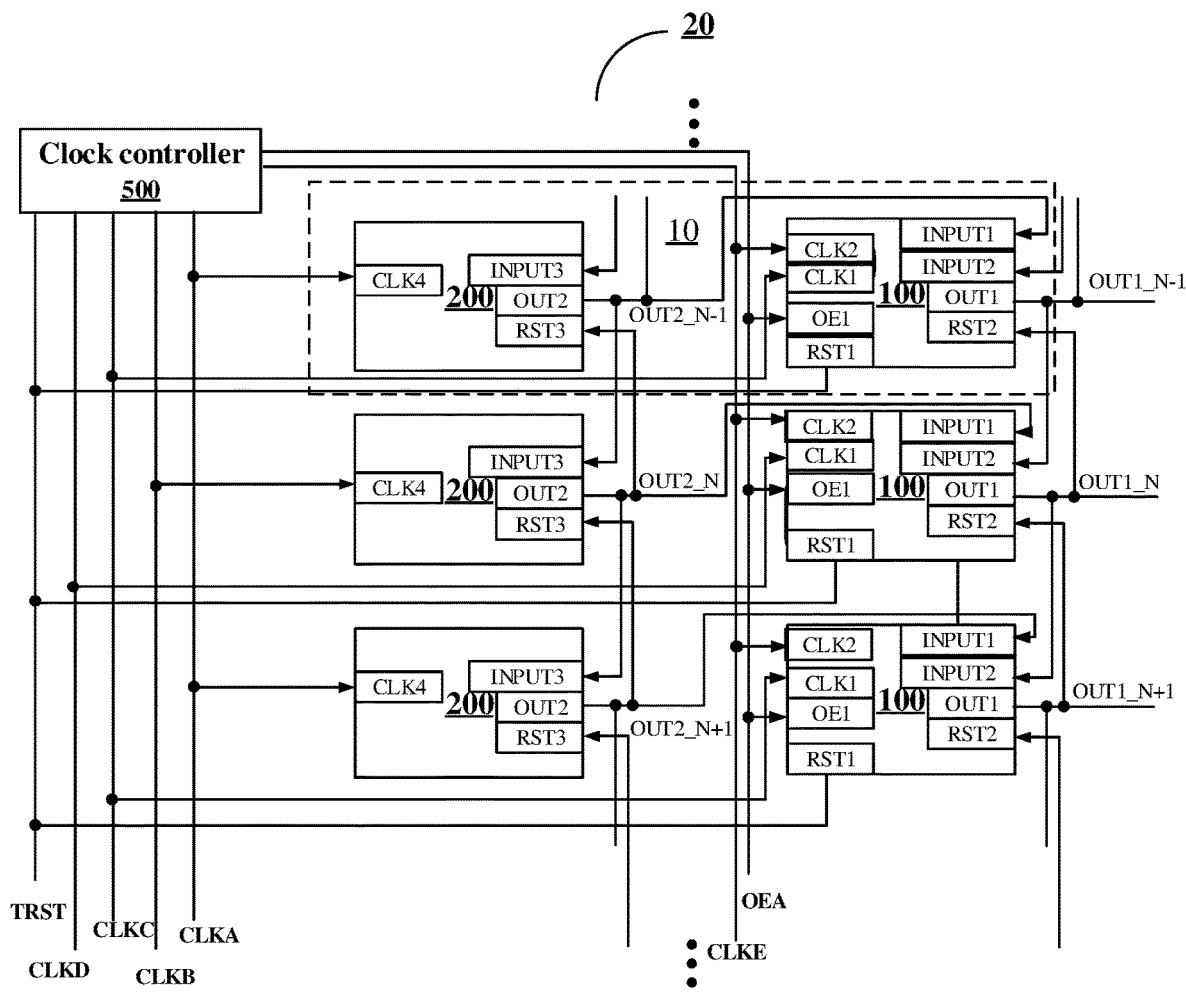
FIG. 12B is a schematic diagram of another gate drive circuit according to an embodiment of the present disclosure.

For example, FIG. 12B shows a schematic diagram of another gate drive circuit 20. The difference between the gate drive circuit 20 and the gate drive circuit illustrated in FIG. 12A lies in that the connection mode of the detection input terminal INPUT2 and the detection output terminal OUT1 of the detection sub-shift-register 100 of each stage is different. For example, in this example, the display sub-shift-register 200 may adopt the circuit structure in FIG. 7C, and the detection sub-shift-register 100 may adopt the circuit structure in FIG. 5B.

For example, except for the detection sub-shift-register 100 of the last stage, the second reset terminal RST2 of the detection sub-shift-register 100 of each other stage is connected to the detection output terminal OUT1 of the detection sub-shift-register 100 of the next stage of the other stage; except for the detection sub-shift-register 100 of the first stage, the detection input terminal INPUT2 of the detection sub-shift-register 100 of each other stage is connected to the detection output terminal OUT1 of the detection sub-shift-register 100 of the preceding stage of the other stage. In this example, the connection method of the first random pulse signal terminal OE1 and the first reset terminal RST1 is the same as that illustrated in FIG. 12A, and will not be described again here.

In this example, the connection method for the rest portion is the same as that illustrated in FIG. 12A, and will not be repeated here. The gate drive circuit 20 in this example, on one hand, when the random detection function is performed, the line-by-line scanning function can be turned off by the first reset signal to avoid the problems of scanning lines and uneven brightness caused by the line-by-line scanning; on the other hand, when the first random pulse signal does not work, the threshold voltage and the mobility of the drive transistors in the pixel circuits can also be compensated by the line-by-line scanning function to improve the display quality. The random detection function and the line-by-line scanning function in this example can be switched as needed. For example, in addition to the control by the total reset line TRST, the switch can also be realized by means of a switching circuit and the like, which will not be repeated here.

Figure 12C:
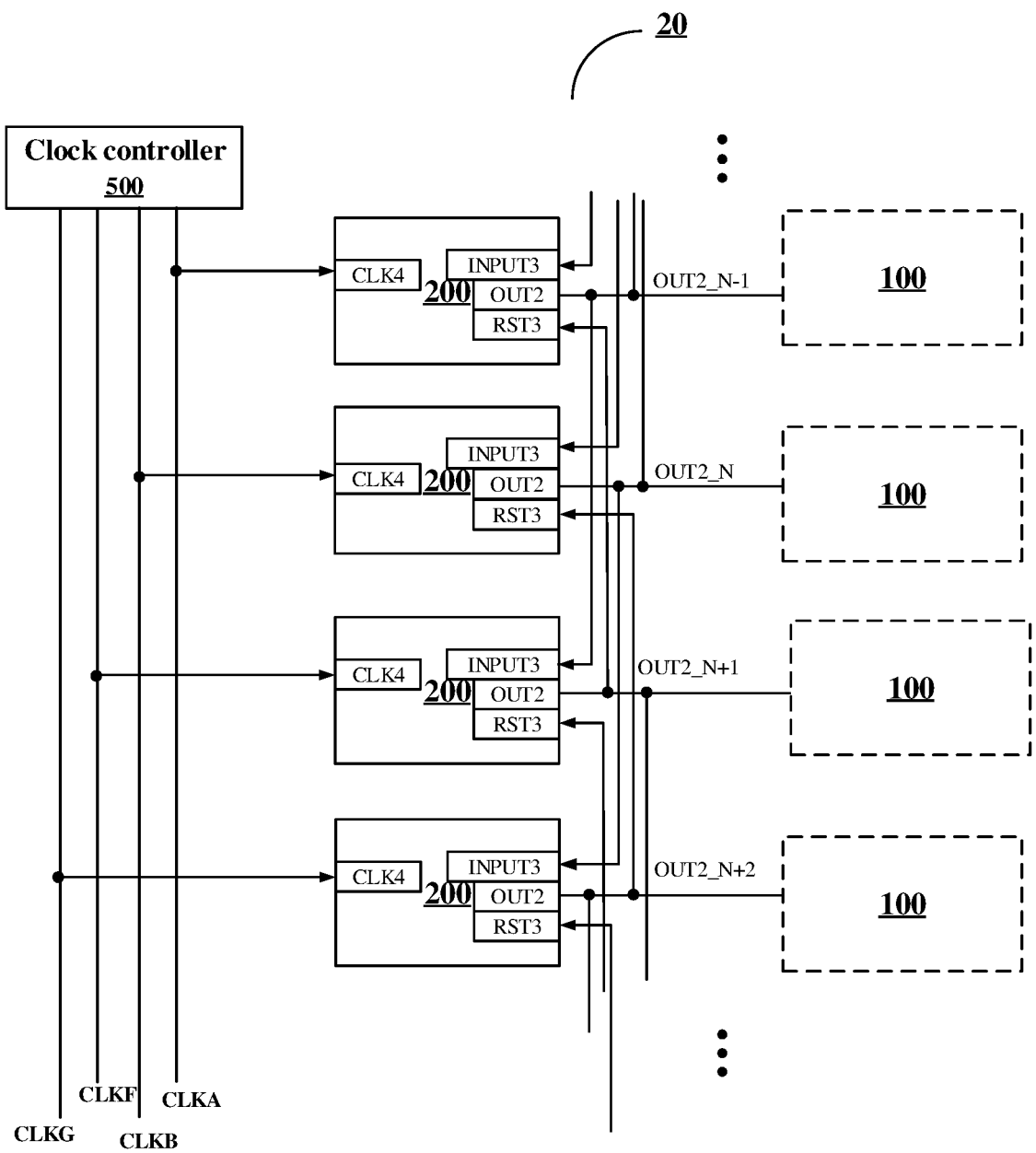
FIG. 12C is a schematic diagram of yet another gate drive circuit according to an embodiment of the present disclosure.

For example, FIG. 12C shows a schematic diagram of another gate drive circuit 20. The difference between the gate drive circuit 20 and the gate drive circuit illustrated in FIG. 12B lies in that the connection mode of the fourth clock signal terminal CLK4, the display input terminal INPIT3 and the third reset terminal RST3 of the display sub-shift-register 100 of each stage is different. For example, in this example, the display sub-shift-register 200 may adopt the circuit structure illustrated in FIG. 7C, and the detection sub-shift-register 100 may adopt the circuit structure illustrated in FIG. 5D and FIG. 5E.

For example, as illustrated in FIG. 12C, except for the display sub-shift-registers of the last two stages, the third reset terminal RST3 of the display sub-shift-register of the other stage is connected to the display output terminal OUT2 of the display sub-shift-register 200 of the following stage which is separate from the other stage by one stage. Except for the display sub-shift-registers of the first stage and the second stage, the display input terminal INPUT3 of the display sub-shift-register 200 of the other stage is connected to the display output terminal OUT2 of the display sub-shift-register 200 of the preceding stage which is separate from the other stage by one stage. It should be noted that the disclosure is not limited to the above case. For example, the connection mode may be that, except for the display sub-shift-registers 200 of the last three stages, the third reset terminal RST3 of the display sub-shift-register 200 of each other stage is connected to the display output terminal OUT2 of the display sub-shift-register 200 of the next stage that is separate from the other stage by two stages. Except for the display sub-shift-registers of the first stage and the second stage, the display input terminal INPUT3 of the display sub-shift-register 200 of each other stage is connected to the display output terminal OUT2 of the display sub-shift-register 200 of the preceding stage which is separate from the other stage by one stage.

For example, as illustrated in FIG. 12C, the gate drive circuit 20 further includes a clock controller 500. For example, the clock controller 500 includes a first clock signal line CLKA, a second clock signal line CLKB, a sixth clock signal line CLKF, and a seventh clock signal line CLKG. For example, in this example, the first clock signal line CLKA is connected to, for example, the clock signal terminal of the display sub-shift-register CLK4 of the (4N−3)th (N is an integer greater than 0) stage; the second clock signal line CLKB is connected to, for example, the clock signal terminal CLK4 of the display sub-shift-register 200 of the (4N−2)th stage. The sixth clock signal line CLK3 is connected to, for example, the fourth clock signal terminal CLK4 of the display sub-shift-register 200 of the (4N−1)th stage; the fourth clock signal line CLK4 is connected to, for example, the fourth clock signal terminal CLK4 of the display sub-shift-register 200 of the (4N)th stage.

The clock controller 500 further includes a second random pulse signal line (not illustrated). For example, the second random pulse signal line is connected to the second random pulse signal terminal (not illustrated in the figure) of the detection sub-shift-register 100, the random pulse signal line OEA is connected to the first random pulse signal terminal OE1 of the detection sub-shift-register 100, and the connection method for other terminals of the detection sub-shift-register 100 is the same as that illustrated in FIG. 12A and FIG. 12B, and will not be described here again.

It should be noted that the gate drive circuit 20 provided in the embodiments of the present disclosure may further include six, eight, or more clock signal lines, and the embodiment of the present disclosure is not limited to this.

In addition to the effect of the gate drive circuit in the above embodiment, the gate drive circuit in this example can also ensure that only one stage of the detection sub-shift-registers outputs when the plurality of stages of the display sub-shift-registers output at the same time, so as to avoid the problems of scanning line and uneven brightness caused by line-by-line scanning.

The operation principle of the sub-shift-register portion illustrated in the gate drive circuit 20 illustrated in FIG. 12A will be described below with reference to the signal timing diagram illustrated in FIG. 13A. For example, in this example, the operation principle of the display sub-shift-register 200 illustrated in FIG. 7C is explained in conjunction with the signal timing diagram illustrated in FIG. 13A. In the three stages, i.e., the first stage 1, the second stage 2 and the third stage 3, illustrated in FIG. 13A, the display sub-shift-register 200 can respectively perform the following operations.

In the first stage, the display input terminal INPUT3 of the display sub-shift-register 200 of the (N)th stage accepts the high level signal provided by the (N−1)th stage as the display input signal, so under the control of the display input signal, the high level of the display input signal charges the second pull-up node PU2_N of the shift register unit 200 so that the potential of the second pull-up node PU2_N is charged to the first high level; the second clock signal line CLKB provides a low-level signal. Because the clock signal terminal CLK4 of the display sub-shift-register 200 of the (N)th stage is connected to the second clock signal line CLKB, a low-level signal is input to the clock signal terminal CLK4 of the display sub-shift-register 200 of the (N)th stage in this stage. Also, because the second pull-up node PU2_N of the display sub-shift-register 200 of the (N)th stage is at the first high level, under the control of the high level of the second pull-up node PU2_N, the low level input from the clock signal terminal CLK4 is output to the display output terminal OUT2_N of the display sub-shift-register 200 of the (N)th stage, whereby the display output signal of the display sub-shift-register 200 of the (N)th stage is at the low level.

In the second stage, the first clock signal line CLKA provides a low-level signal and the second clock signal line CLKB provides a high-level signal, so the clock signal terminal CLK4 of the display sub-shift-register 200 inputs a high-level signal in this stage. Also, because the second pull-up node PU2_N of the display sub-shift-register 200 of the (N)th stage is at a high level, under the control of the high level of the second pull-up node PU2_N, the high level input from the clock signal terminal CLK4 is output to the output terminal OUT2_N of the display sub-shift-register 200 of the (N)th stage, whereby the display output signal of the display sub-shift-register 200 of the (N)th stage is at a high level. Meanwhile, the second pull-up node PU2_N is further charged to the second high level due to the bootstrap effect of the capacitor. Moreover, the high level output from the output terminal OUT_N of the display sub-shift-register 200 of the (N)th stage serves as the display input signal of the display sub-shift-register 200 of the (N+1)th stage, so that the second pull-up node PU2_N+1 of the display sub-shift-register 200 of the (N+1)th stage is pulled up to the first high level, and the output terminal OUT2_N+1 of the display sub-shift-register 200 of the (N+1)th stage outputs the low level provided by the first clock signal line CLKA.

In the third stage, the first clock signal line CLKA provides a high-level signal, so in this stage, the clock signal terminal CLK4 of the display sub-shift-register 200 inputs a high-level signal; because the second pull-up node PU2_N+1 of the display sub-shift-register 200 of the (N+1)th stage is at a high level, under the control of the high level of the second pull-up node PU2_N+1, the high level input from the clock signal terminal CLK4 is output to the output terminal OUT_N+1 of the display sub-shift-register 200 of the (N+1)th stage, while the second pull-up node PU2_N+1 is charged to the second high level due to the bootstrap effect of the capacitor. Because that output terminal OUT_N+1 of the (N+1)th stage display sub-shift register unit 200 is connected to the third reset terminal RST3 of the display sub-shift register unit 200 of the (N)th stage, the second pull-up node PU2_N of the display sub-shift-register 200 of the (N)th stage is reset and pulled down to a low level under the control of the high level output from the output terminal OUT_N+1 of the display sub-shift-register 200 of the (N+1)th stage. Thus, the second pull-down node PD2_N is pulled up to a high level, so that the display output terminal OUT_N of the (N)th stage is connected to the first voltage terminal VGL1, and thus the display output signal of the (N)th stage is pulled down to a low level.

Figure 13A:
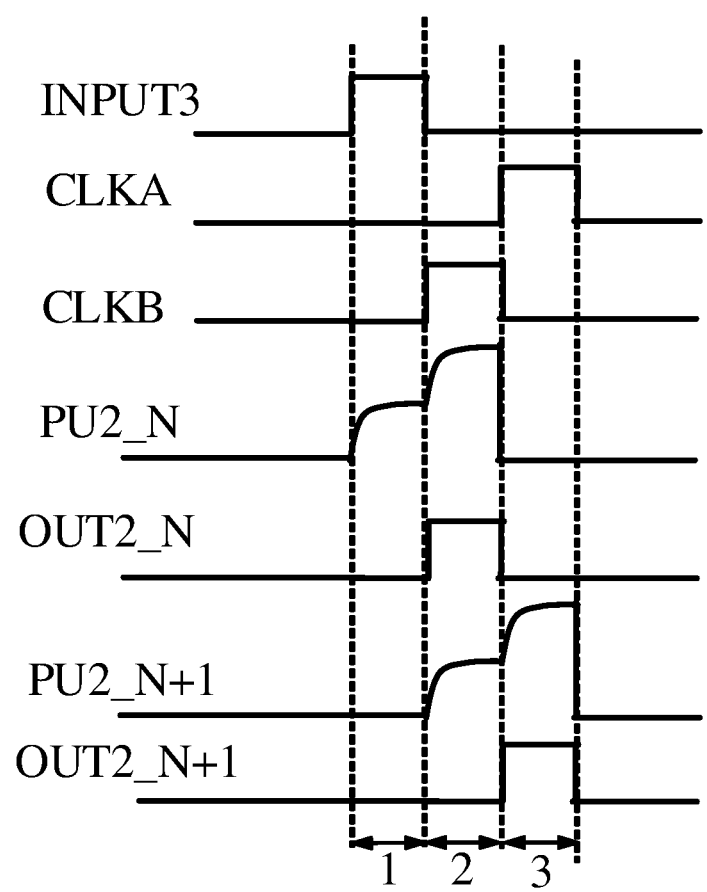
FIG. 13A is a signal timing diagram corresponding to the operation of the display sub-shift-register in the gate drive circuit illustrated in FIG. 12A.

It should be noted that the level of potential in the signal timing diagram illustrated in FIG. 13A is only schematic and does not represent the true potential value or relative proportion, corresponding to the above example, the high-level signal corresponds to the turn-on signal of the N-type transistor and the low-level signal corresponds to the turn-off signal of the N-type transistor, whereby the operation of the pixel circuit using the N-type transistor as the switching transistor in the display panel can be controlled.

Figure 13B:
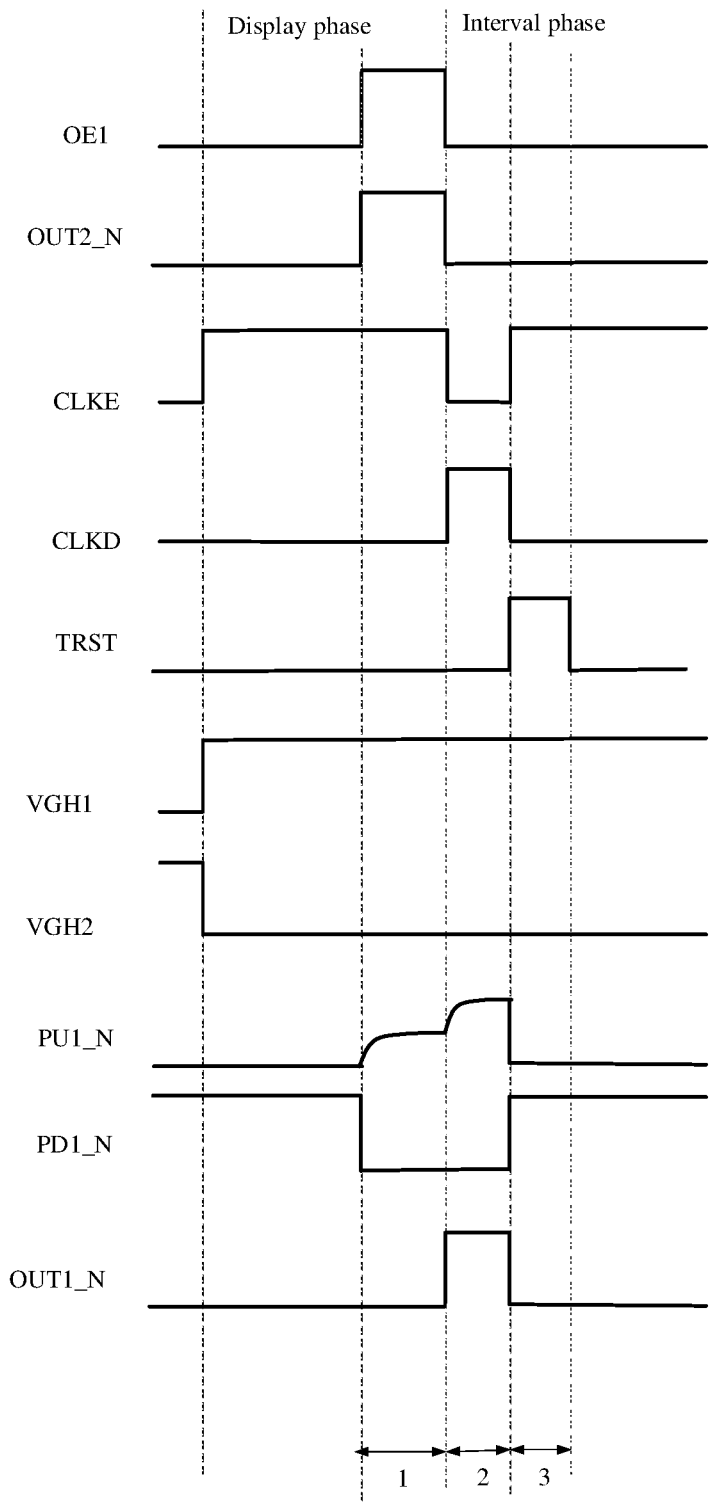
FIG. 13B is a signal timing diagram corresponding to the operation of the detection sub-shift-register in the gate drive circuit illustrated in FIG. 12A.

Next, the operation principle of the detection sub-shift-register portion in the gate drive circuit 20 illustrated in FIG. 12A will be described with reference to the signal timing diagram illustrated in FIG. 13B. For example, in this example, the operation principle of the detection sub-shift-register 100 illustrated in FIG. 4D is explained in conjunction with the signal timing diagram illustrated in FIG. 13B, in the three stages, i.e., the first stage 1, the second stage 2 and the third stage 3, illustrated in FIG. 13B, the detection sub-shift-register can respectively perform the following operations.

In the first stage, a high-level signal is input to the random pulse terminal, and the display output terminal OUT2_N of the display sub-shift-register of the (N)th stage also outputs a high-level signal, the first input terminal INPUT1_N of the detection sub-shift-register 100 of the (N)th stage is connected to the display output terminal OUT2_N of the display sub-shift-register of the (N)th stage, so the first input terminal INPUT1_N of the detection sub-shift-register 100 of the (N)th stage inputs a high-level signal. At this stage, a high-level signal is input to the second clock signal terminal CLK2, so that the first pull-up node PU1_N is connected to the second clock signal terminal CLK2 under the control of the high level of the random pulse signal and the display output signal, so that the first pull-up node PU1_N is charged to the first high level; in this stage, the fourth clock signal line CLKD provides a low-level signal. Because the clock signal terminal CLK1 of the detection sub-shift-register 100 of the (N)th stage is connected to the fourth clock signal line CLKD, in this stage, the clock signal terminal CLK1 of the detection sub-shift-register 100 of the (N)th stage inputs a low-level signal; because the first pull-up node PU1_N of the detection sub-shift-register 100 of the (N)th stage is at the first high level, the low level input from the clock signal terminal CLK1 is output to the detection output terminal OUT1_N of the detection sub-shift-register 100 of the (N)th stage under the control of the high level of the first pull-up node PU1_N.

In the second stage, the fourth clock signal line CLKD provides a high-level signal, so in this stage, the clock signal terminal CLK1 of the detection sub-shift-register 100 inputs a high-level signal; also, because the first pull-up node PU1_N of the detection sub-shift-register 100 of the (N)th stage is at the first high level, under the control of the high level of the first pull-up node PU1_N, the high level input from the clock signal terminal CLK1 is output to the output terminal OUT1_N of the detection sub-shift-register 100 of the (N)th stage, while the first pull-up node PU1_N is charged to the second high level due to the bootstrap effect of the capacitor. For example, in the gate drive circuit illustrated in FIG. 12B, in this stage, the first pull-up node PU_N+1 of the (N+1)th stage detection sub-shift-register 100 is charged to the first high level.

In the third stage, the total reset line TRST provides a high-level signal. Because the first reset terminal RST1 of each detection sub-shift-register 100 is connected to the total reset line, the first reset terminal RST1 of each detection sub-shift-register 100 is input to a high level, so the first pull-up node PU1 of each detection sub-shift-register 100 is pulled down to a low level, so that the first pull-down node PD1 is pulled up to a high level, and thus the detection output terminal OUT1 of each level is pulled down to a low level. Therefore, the function of line-by-line scanning of the detection sub-shift-register illustrated in FIG. 12B is turned off, avoiding the problems of scanning line and uneven brightness caused by line-by-line scanning.

The operation principle of the gate drive circuit 20 illustrated in FIG. 12B is basically the same as that of the gate drive circuit 20 illustrated in FIG. 12A, except that the detection sub-shift-register in the gate drive circuit 20 illustrated in FIG. 12B also has the function of line-by-line scanning, and its specific operation principle is similar to that of the display sub-shift-register, which will not be repeated here.

Figure 13C:
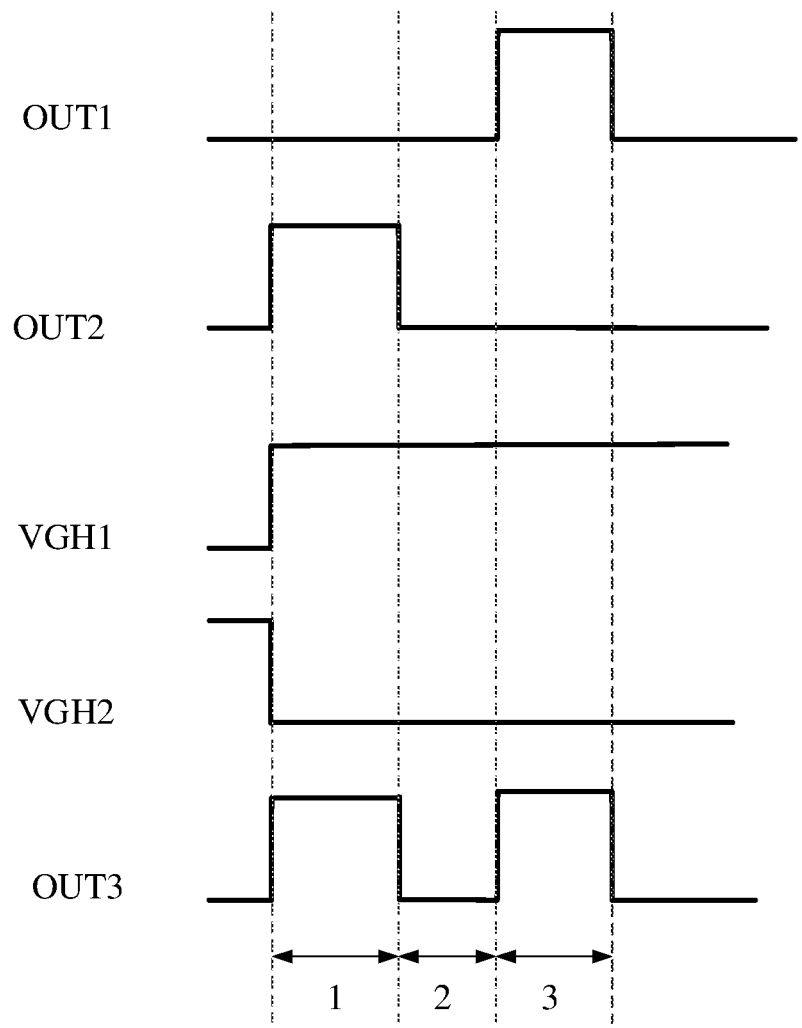
FIG. 13C is a signal timing diagram corresponding to the operation of the logic OR circuit illustrated in FIG. 11A.

FIG. 13C is a timing diagram of the operation principle of the logic OR circuit illustrated in FIG. 11B to output the display output signal and the detection output signal of the gate drive circuit 20 in combination.

In the first stage, the display output terminal OUT2 outputs a display output signal of a high level, and the detection output terminal OUT1 outputs a detection output signal of a low level, so that the second node N2 is connected with the display output terminal OUT2 under the control of the high level of the display output signal, so that the second node N2 is charged to a high level; under the control of the high level of the second node N2, the logic OR output terminal OUT3 is connected to the display output terminal OUT2, so that the logic OR output terminal OUT3 outputs the high level of the display output signal.

In the second stage, the display output terminal OUT2 outputs a display output signal of a low level, the detection output terminal OUT1 outputs a detection output signal of a low level, the second voltage terminal VGH1 inputs a high-level signal, and the third voltage terminal VGH2 inputs a low-level signal, so that under the control of the high-level of the second voltage terminal VGH1, the third node N3 is connected with the second voltage terminal VGH1 (when the third voltage terminal VGH1 is at a high level, it is connected with the third voltage terminal VGH2), thereby charging the third node N3 to a high level; under the control of the third node N3, the logic OR output terminal OUT3 is connected to the fifth voltage terminal VGL2, so that the logic OR output terminal OUT3 is pulled down to a low level.

In the third stage, the detection output terminal OUT1 outputs a detection output signal of a high level, and the display output terminal OUT2 outputs a display output signal of a low level, so that the first node N1 is connected with the detection output terminal OUT1 under the control of the high level of the detection output signal, so that the first node N1 is charged to a high level; under the control of the high level of the first node N1, the logic OR output terminal OUT3 is connected to the detection output terminal OUT1, so that the logic OR output terminal OUT3 outputs the high level of the detection output signal.

The logic OR output terminal OUT3 can cause the gate drive circuit 20 to output a display output signal to drive, for example, a gate scan line connected thereto during a display period, output a detection output signal to drive, for example, a gate scan line connected thereto during a detection period, and use the detection output signal for compensation of the threshold voltage and the mobility of a drive transistor of a pixel circuit connected to the gate scan line, and the output of the display output signal and the output of the detection output signal do not interfere with each other.

Figure 13D:
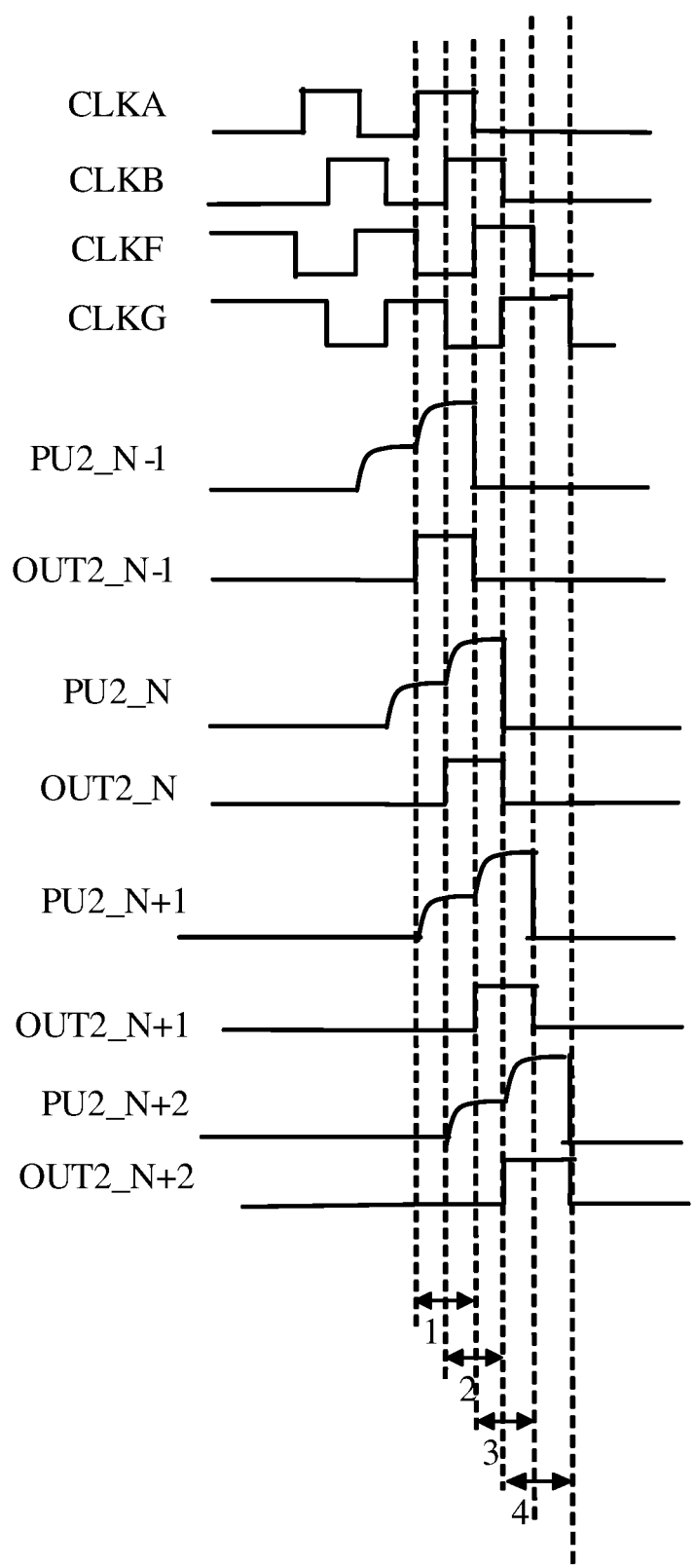
FIG. 13D is a signal timing diagram corresponding to the operation of the display sub-shift-register in the gate drive circuit illustrated in FIG. 12C.

The operation principle of the sub-shift-register portion illustrated in the gate drive circuit 20 illustrated in FIG. 12C will be described below with reference to the signal timing diagram illustrated in FIG. 13D. For example, in this example, the operation principle of the display sub-shift-register 200 illustrated in FIG. 7C is explained in conjunction with the signal timing diagram illustrated in FIG. 13D. In the four stages, i.e., the first stage 1, the second stage 2, the third stage 3 and the fourth stage 4, illustrated in FIG. 13D, the display sub-shift-register 200 can respectively perform the following operations.

In the first stage 1, the first clock signal line CLKA provides a high-level signal, and because the clock signal terminal CLK4 of the display sub-shift-register 200 of the (N−1)th stage is connected to the first clock signal line CLKA, in this stage, the fourth clock signal terminal CLK4 of the display sub-shift-register 200 of the (N−1)th stage inputs a high-level signal; because the second pull-up node PU2_N−1 of the display sub-shift-register 200 of the (N−1)th stage is at a high level, under the control of the high level of the second pull-up node PU2_N−1, the high level input from the fourth clock signal terminal CLK4 is output to the output terminal OUT2_N−1 of the display sub-shift-register 200 of the (N−1)th stage. It should be noted that the level of potential in the signal timing diagram illustrated in FIG. 13D is only schematic and does not represent the true potential value.

In the second stage 2, the second clock signal line CLKB provides a high-level signal. Because the fourth clock signal terminal CLK4 of the display sub-shift-register 200 of the (N)th stage is connected to the second clock signal line CLKB, in this stage a high-level signal is input to the fourth clock signal terminal CLK4 of the display sub-shift-register 200 of the (N)th stage. Because the second pull-up node PU2_N of the display sub-shift-register 200 of the (N)th stage is at a high level, under the control of the high level of the second pull-up node PU2_N, the high level input from the fourth clock signal terminal CLK4 is output to the output terminal OUT2_N of the display sub-shift-register 200 of the (N)th stage.

In the third stage 3, the sixth clock signal line CLKF provides a high-level signal. Because the fourth clock signal terminal CLK4 of the display sub-shift-register 200 of the (N+1)th stage is connected to the sixth clock signal line CLKF, the fourth clock signal terminal CLK4 of the display sub-shift-register 200 of the (N+1)th stage inputs a high-level signal in this stage. Because the second pull-up node PU2_N+1 of the display sub-shift-register 200 of the (N+1)th stage is at a high level, the high level input from the fourth clock signal terminal CLK4 is output to the output terminal OUT2_N+1 of the display sub-shift-register 200 of the (N+1)th stage under the control of the high level of the second pull-up node PU2_N+1.

In the fourth stage 4, the seventh clock signal line CLKG provides a high-level signal, and because the fourth clock signal terminal CLK4 of the display sub-shift-register 200 of the (N+2)th stage is connected to the seventh clock signal line CLKG, the fourth clock signal terminal CLK4 of the display sub-shift-register 200 of the (N+2)th stage inputs a high-level signal in this stage; because the second pull-up node PU2_N+2 of the display sub-shift-register 200 of the (N+2)th stage is at a high level, under the control of the high level of the second pull-up node PU2_N+2, the high level input from the fourth clock signal terminal CLK4 is output to the output terminal OUT2_N+2 of the display sub-shift-register 200 of the (N+2)th stage.

Figure 13E:
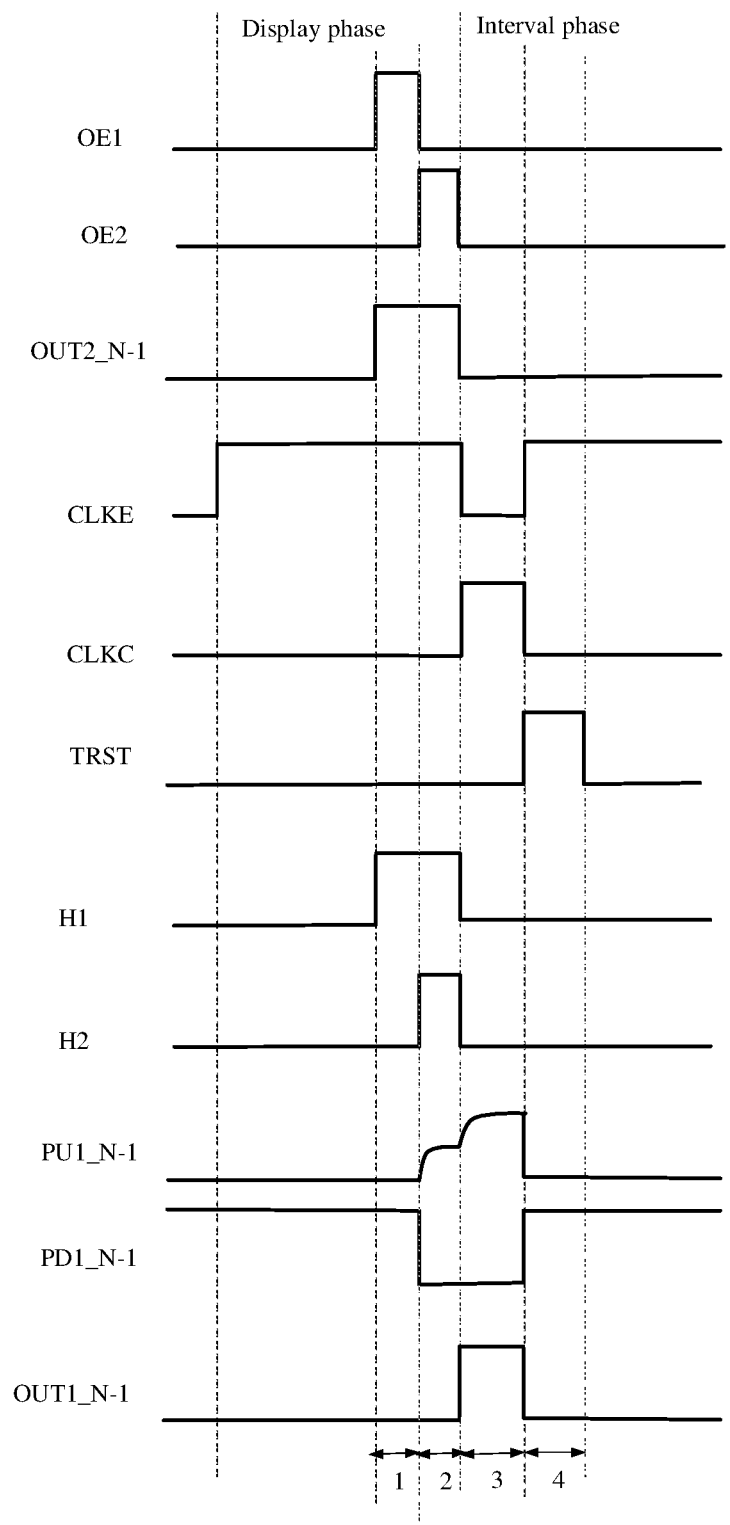
FIG. 13E is a signal timing diagram corresponding to the operation of the detection sub-shift-register in the gate drive circuit illustrated in FIG. 12C.

Next, the operation principle of the detection sub-shift-register portion in the gate drive circuit 20 illustrated in FIG. 12C will be described with reference to the signal timing diagram illustrated in FIG. 13E. For example, in this example, the operation principle of the detection sub-shift-register 100 illustrated in FIG. 5D and FIG. 5E is explained in conjunction with the signal timing diagram illustrated in FIG. 13E. In the four stages, i.e., the first stage 1, the second stage 2, the third stage 3 and the fourth stage 4, illustrated in FIG. 13E, the detection sub-shift-register can respectively perform the following operations. For example, in this example, the working principle of the detection sub-shift-register of the (N−1)th stage is described, and the working principle of the detection sub-shift-register of the other stage 100 is similar to that of the detection sub-shift-register of the (N−1)th stage, and will not be repeated here.

In the first stage 1, the first random pulse terminal OE1 inputs a high-level signal, and the display output terminal OUT2_N−1 of the display sub-shift-register 200 of the (N−1)th stage also outputs a high-level signal. The first input terminal INPUT1_N−1 of the detection sub-shift-register 100 of the (N−1)th stage is connected with the display output terminal OUT2_N−1 of the display sub-shift-register 200 of the (N−1)th stage, so the detection sub-shift-register 100 of the (N−1)th stage inputs a high-level signal. Therefore, under the control of the high level of the first random pulse signal and the high level of the display output signal of the (N−1)th stage, the first output terminal H1 of the random pulse signal control sub-circuit is connected to the first input terminal INPUT1_N−1 of the detection sub-shift-register 100 of the (N−1)th stage. Due to the bootstrap effect of the capacitor, the first output terminal H1 of the random pulse signal control sub-circuit is charged to the high level, so that the first transistor T1 is turned on under the control of the high level of the first output terminal H1 of the random pulse signal control sub-circuit. Because the second random pulse signal is at a low level in this stage, the second output terminal H2 of the random pulse signal control sub-circuit is at a low level, and the second transistor T2 is turned off under the control of the low level of the second output terminal H2 of the random pulse signal control sub-circuit, therefore, in this stage, the detection output terminal OUT1_N−1 of the detection sub-shift-register 100 of the (N−1)th stage is at a low level.

In the second stage 2, the first random pulse terminal OE1 inputs a low level signal, the second random pulse terminal OE2 inputs a high level signal, the display output terminal OUT2_N−1 of the display sub-shift-register 200 of the (N−1)th stage also outputs a high level signal, and the first input terminal INPUT1_N−1 of the detection sub-shift-register 100 of the (N−1)th stage is connected with the display output terminal OUT2_N−1 of the display sub-shift-register 200 of the (N−1)th stage, so the detection sub-shift-register 100 of the (N−1)th stage inputs a high level signal. Therefore, under the control of the high level of the second random pulse signal and the high level of the display output signal of the (N−1)th stage, the second output terminal H2 of the random pulse signal control sub-circuit is connected to the first input terminal INPUT1_N−1 of detection sub-shift-register 100 of the (N−2)th stage, so that the second output terminal H2 of the random pulse signal control sub-circuit is charged to the high level, thus, the second transistor T2 is turned on under the control of the high level of the second output terminal H2 of the random pulse signal control sub-circuit; also, in this stage, the first output terminal H1 of the random pulse signal control sub-circuit is still at a high level, so the first transistor T1 is also turned on. Therefore, under the control of the high level of the first output terminal H1 and high level of the second output terminal H2 of the random pulse signal control sub-circuit, the first pull-up node PU_N−1 of the detection sub-shift-register 100 is connected with the second clock signal terminal so that the first pull-up node PU_N−1 is charged to the first high level. In this stage, the third clock signal line CLKC provides a low-level signal. Because the clock signal terminal CLK1 of the detection sub-shift-register 100 of the (N−1)th stage is connected to the third clock signal line CLKC, in this stage, the clock signal terminal CLK1 of the detection sub-shift-register 100 of the (N−1)th stage inputs a low-level signal; because the first pull-up node PU1_N−1 of the detection sub-shift-register 100 of the (N−1)th stage is at the first high level, the low level input from the clock signal terminal CLK1 is output to the detection output terminal OUT1_N−2 of the detection sub-shift-register 100 of the (N−1)th stage under the control of the high level of the first pull-up node PU1_N−1.

At this stage, the display output terminal OUT2_N of the display sub-shift-register of the (N)th stage outputs a high-level signal, and the first input terminal INPUT1_N of the detection sub-shift-register 100 of the (N)th stage is connected to the display output terminal OUT2_N of the display sub-shift-register 200 of the (N)th stage, so the first input terminal INPUT1_N of the detection sub-shift-register 100 of the (N)th stage inputs a high-level signal. Because a low level signal is input to the first random pulse terminal OE1 in this stage, the first output terminal H1 of the random pulse signal control sub-circuit is still at a low level, and therefore, the first transistor is turned off under the control of the low level of the first output terminal H1 of the random pulse signal control sub-circuit, so that the first pull-up node PU_N of the detection sub-shift-register of the (N)th stage is still at a low level, and thus, in this stage, the output terminal OUT1_N of the detection sub-shift-register of the (N)th stage is at a low level, thus ensuring that the function of line-by-line scanning in the gate drive circuit 20 is turned off, and the gate drive circuit 20 controls the output of only one stage.

In the third stage 3, the third clock signal line CLKC provides a high-level signal, so a high-level signal is input to the clock signal terminal CLK1 of the detection sub-shift-register 100 in this stage; also, because the first pull-up node PU1_N−1 of the detection sub-shift-register 100 of the (N)th stage is at the first high level, under the control of the high level of the first pull-up node PU1_N−1, the high level input from the clock signal terminal CLK1 is output to the output terminal OUT1_N−1 of the detection sub-shift-register 100 of the (N−1)th stage, while the first pull-up node PU1_N−1 is charged to the second high level due to the bootstrap effect of the capacitance. At the same time, under the control of the high level input by the first clock signal terminal CLK1, the first output terminal H1 and the second output terminal H2 of the random pulse signal control sub-circuit are connected with the first voltage terminal VGL1, so that the first output terminal H1 and the second output terminal H2 of the random pulse signal control sub-circuit are changed to the low level, thereby resetting the first output terminal H1 and the second output terminal H2 of the random pulse signal control sub-circuit.

Figure 13F:
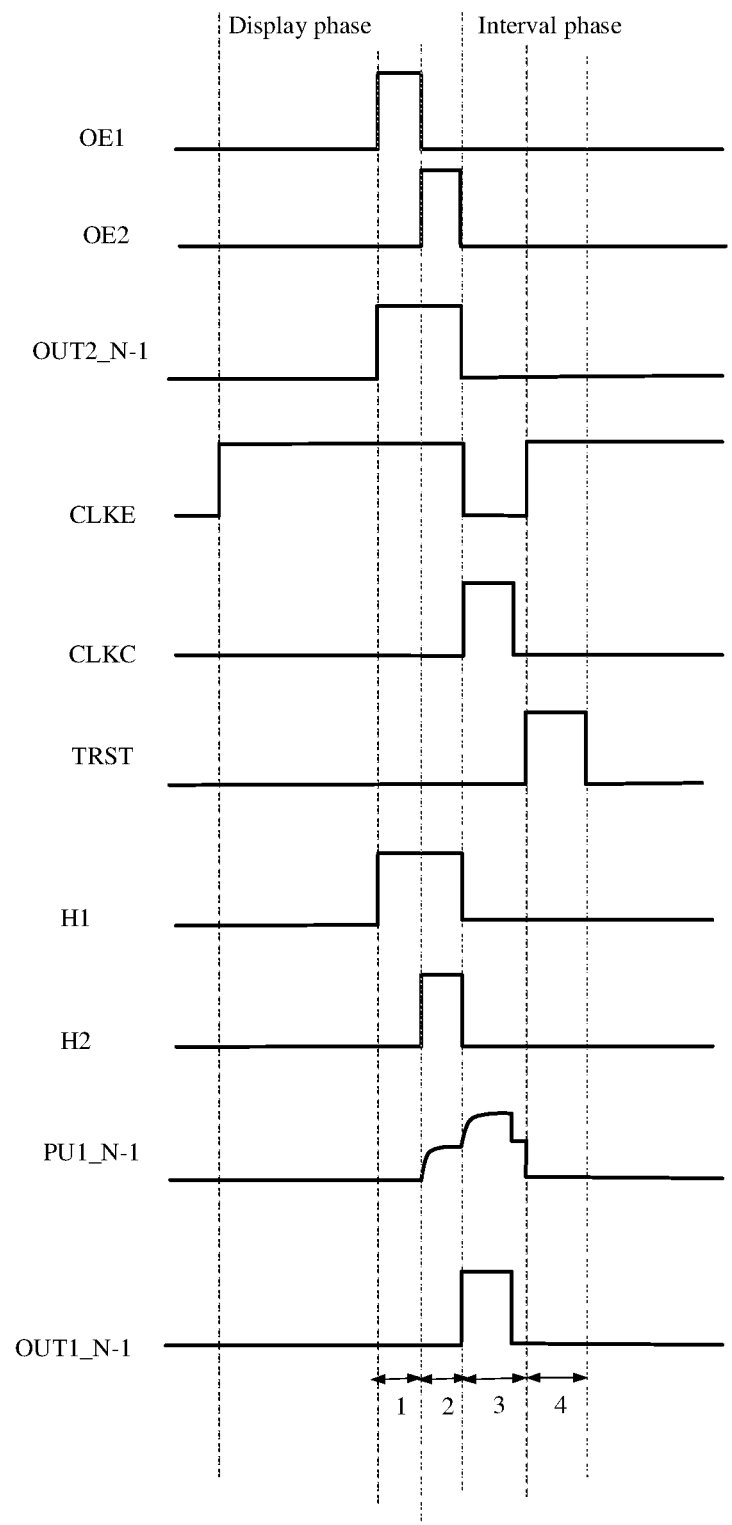
FIG. 13F is another signal timing diagram corresponding to the operation of the detection sub-shift-register in the gate drive circuit illustrated in FIG. 12C.

In the fourth stage 4, the total reset line TRST provides a high-level signal. Because the first reset terminal RST1 of each stage of detection sub-shift-register 100 is connected to the total reset line, the first reset terminal RST1 of each stage of detection sub-shift-register 100 is input to a high level, so the first pull-up node PU1 of each stage of detection sub-shift-register 100 is pulled down to a low level, so the first pull-down node PD1 is pulled up to a high level, and thus the detection output terminal OUT1 of each stage is pulled down to a low level. Therefore, in this stage, the output terminal OUT1_N−1 of the sub-shift-register 100 of the (N−1)th stage outputs a low level. For example, as illustrated in FIG. 13F, when the fourth transistor and the sixth transistor merely use a transistor with a relatively large ratio of width to length, the level of the first pull-up node can be pulled down twice.

Figure 14A:
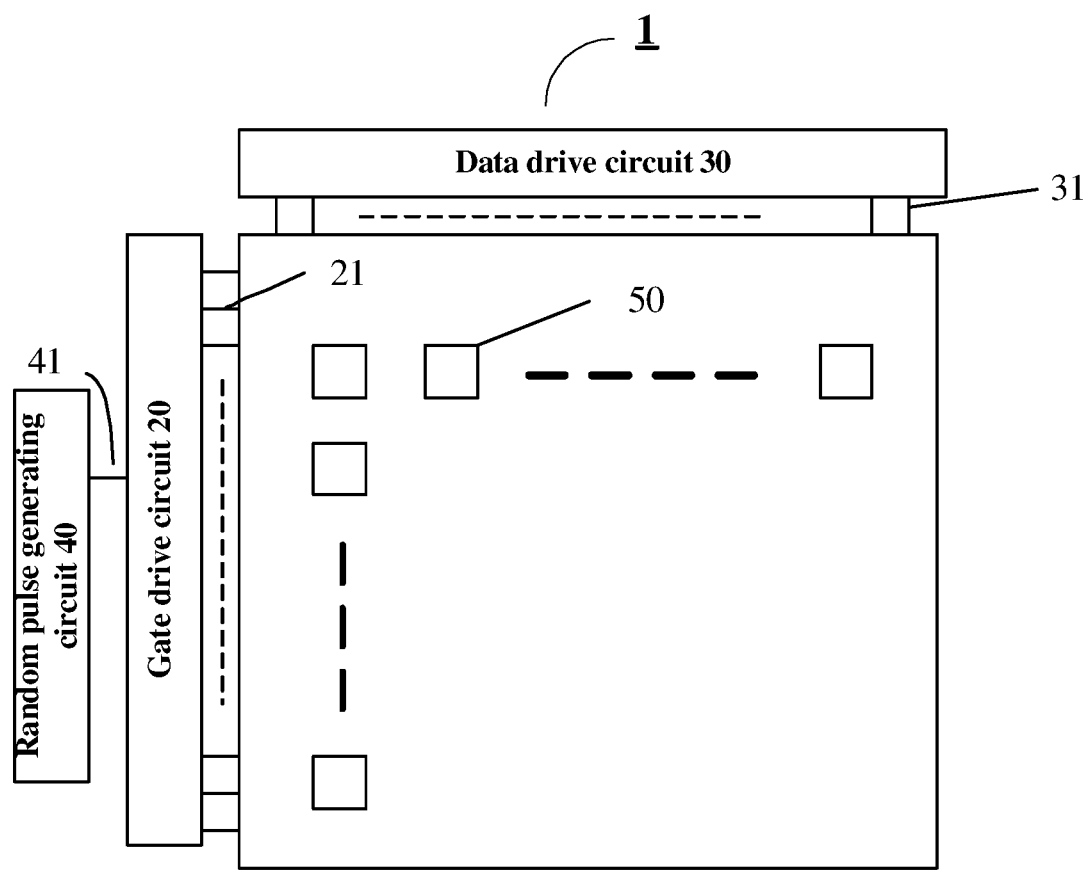
FIG. 14A is a schematic diagram of a display device according to an embodiment of the present disclosure.

An embodiment of the present disclosure also provides a display device 1. As illustrated in FIG. 14A, the display device 1 includes a gate drive circuit 20 provided in any embodiment of the present disclosure. The display device 1 includes an array of a plurality of pixel units 50, each pixel unit using, for example, a 3T1C pixel circuit illustrated in FIG. 1D, or other pixel circuits based on the 3T1C structure, etc. For example, the display device 1 may further include a data drive circuit 30. The data drive circuit 30 is used for providing data signals to the pixel array; the gate drive circuit 20 is used to provide gate scan signals to the pixel array. For example, each of the gate scan signals includes a composite signal including a display output signal and a detection output signal output from a logic OR output terminal OUT3 or an output composite output terminal OUT4. For example, the display output signals are used to drive organic light emitting diodes of pixel circuits in the pixel array to emit light. For example, the detection output signals are used to compensate the threshold voltages and the mobility of the drive transistors of the pixel circuits in the pixel array. The data drive circuit 30 is electrically connected to the pixel unit 50 through the data lines 31, and the gate drive circuit 20 is electrically connected to the pixel unit 50 through the gate lines 21.

For example, the display device 1 further includes a random pulse generating circuit 40. The random pulse generating circuit 40 is configured to generate a first random pulse signal and is connected to a first random pulse signal line 41. For example, the random pulse generating circuit 40 may also be configured to generate a second random pulse signal and be connected to a second random pulse signal line (not illustrated in the figure). For example, the random pulse circuit 40 can be various circuits or devices that can generate pulses, such as a central processing unit (CPU), a data signal processor (DSP), etc., and can also be implemented by a field programmable gate array (FPGA), etc.

It should be noted that the display device 1 in this embodiment can be any product or component with a display function such as a liquid crystal panel, a liquid crystal television, a display, an OLED panel, an OLED television, an electronic paper display device, a mobile phone, a tablet computer, a notebook computer, a digital photo frame, a navigator, etc. The display device 1 may also include other conventional components such as a display panel, and the embodiments of the present disclosure are not limited thereto.

Figure 14B:
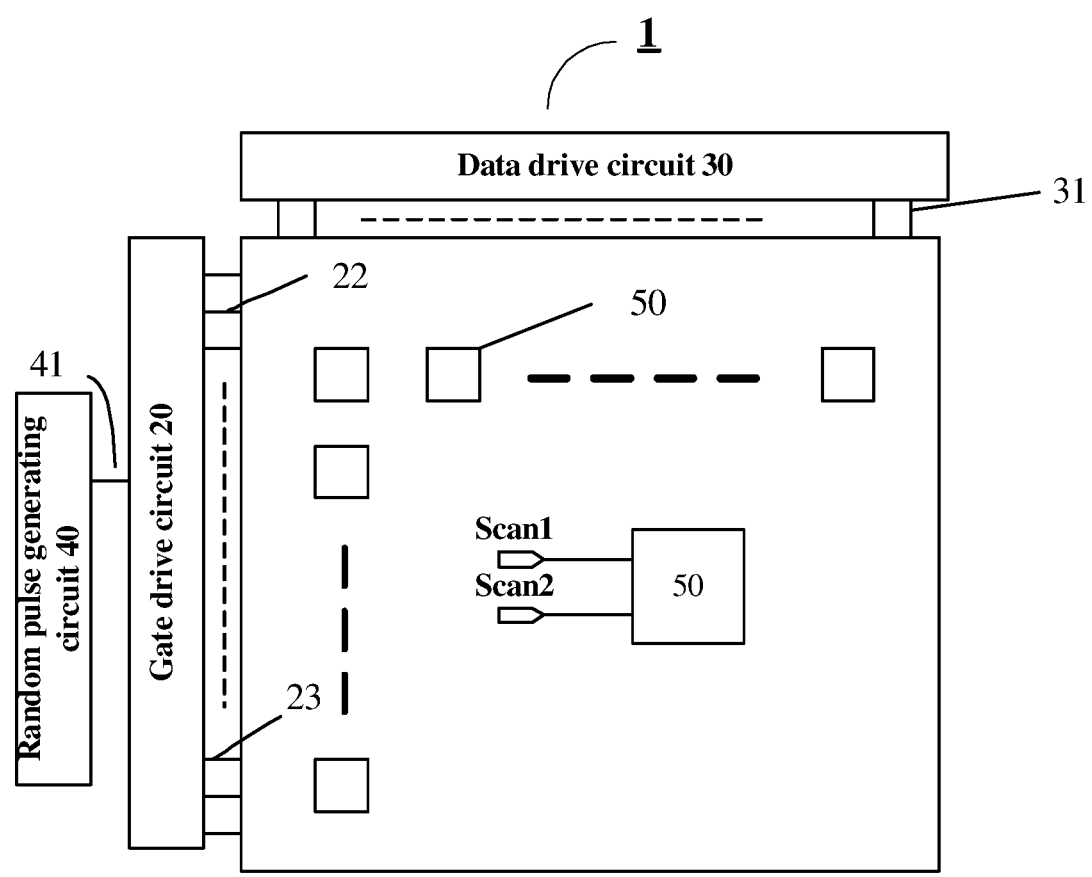
FIG. 14B is a schematic diagram of another display device according to an embodiment of the present disclosure.

FIG. 14B shows a schematic diagram of another example display device 1 provided by an embodiment of the present disclosure. The display device 1 illustrated in FIG. 14B is different from the display device 1 illustrated in FIG. 14A in that the gate scan lines of the gate drive circuit 20 includes scan lines 22 and compensation scan lines 23, and a scan line 22 and a compensation scan line 23 are connected to the scan terminal Scan1 and the compensation scan terminal Scan2 in the pixel unit 50, respectively, to provide the scan signal Scan1 to the switching transistor T0 in the pixel unit 50 through the scan line 22, and to provide the compensation scan signal Scan2 to the sensing transistor S0 in the pixel unit 50 through the compensation scan line 23. Each pixel unit 50 in this example adopts, for example, a 3T1C pixel circuit illustrated in FIG. 1c, or other pixel circuits based on the 3T1C structure, etc.

It should be noted that in the embodiment of the present disclosure, the symbol Scan1 may represent either a scanning terminal or a scanning signal; the symbol Scan2 can represent either the compensation scanning terminal or the compensation scanning signal.

The technical effect of the display device 1 provided by the embodiment of the present disclosure may refer to the corresponding description of the gate drive circuit 20 in the above embodiment, and will not be described here again.

An embodiment of the present disclosure also provides a driving method of the gate drive circuit, which can be applied to the gate drive circuit 20 comprising the shift register unit 10 provided by the embodiment of the present disclosure.

The driving method of the gate drive circuit 20 includes the following operations for the shift register unit 10 of the (N)th stage: the display output terminal OUT2_N of the display sub-shift-register of (N)th stage (N is an integer greater than 1) outputs a display output signal; the detection sub-shift-register of the (N)th stage charges its first pull-up node PU1_N in response to the display output signal and the first random pulse signal; the detection sub-shift-register of the (N)th stage outputs a detection output signal.

An embodiment of the present disclosure also provides another driving method of the gate drive circuit, which can be applied to the gate drive circuit 20 of the shift register unit 10 provided by an embodiment of the present disclosure.

The driving method of the gate drive circuit 20 includes the following operations for the shift register unit 10 of the (N)th stage: the display output terminal of the display sub-shift-register of the (N)th stage outputs a display output signal; the detection sub-shift-register of the (N)th stage charges the first pull-up node in response to the display output signal, the first random pulse signal and the second random pulse signal; the detection sub-shift-register of the (N)th stage outputs a detection output signal.

The technical effect of the driving method of the gate drive circuit 20 provided by an embodiment of the present disclosure may refer to the corresponding description of the gate drive circuit 20 in the above-mentioned embodiment and will not be repeated here.

The above description is only a specific embodiment of the present disclosure, but the scope of protection of the present disclosure is not limited thereto, and the scope of protection of the present disclosure shall be subject to the scope of protection of the claims.

What is claimed is:

1. A shift register unit comprising a display sub-shift-register and a detection sub-shift-register,
    wherein the display sub-shift-register comprises a display output terminal, and the display sub-shift-register is configured to output a display output signal of the shift register unit from the display output terminal at a display stage; and
    the detection sub-shift-register is connected to the display output terminal of the display sub-shift-register to receive the display output signal, and comprises a first random pulse signal terminal to receive a first random pulse signal,
    wherein the detection sub-shift-register is configured to output a detection output signal of the shift register unit in a case where the display output signal is at a turn-on level and the first random pulse signal is at a turn-on level.

2. The shift register unit according to claim 1, wherein the detection sub-shift-register comprises a first detection input sub-circuit, a first pull-up node reset sub-circuit and a detection output sub-circuit,
    wherein the first detection input sub-circuit is configured to charge a first pull-up node in response to the display output signal and the first random pulse signal;
    the first pull-up node reset sub-circuit is configured to reset the first pull-up node in response to a first reset signal;
    the detection output sub-circuit is configured to output a first clock signal to a detection output terminal under control of a level of the first pull-up node.

3. The shift register unit according to claim 2, wherein the detection sub-shift-register further comprises a first pull-up node noise reduction sub-circuit, a first output noise reduction sub-circuit and a first pull-down sub-circuit,
    wherein the first pull-up node noise reduction sub-circuit is configured to reduce noise on the first pull-up node under control of a level of the first pull-down node;
    the first output noise reduction sub-circuit is configured to reduce noise at the detection output terminal under the control of the level of the first pull-down node; and
    the first pull-down sub-circuit is configured to control the level of the first pull-down node under the control of the level of the first pull-up node.

4. The shift register unit according to claim 3, wherein the detection sub-shift-register further comprises a second detection input sub-circuit and a detection input terminal, and
    the second detection input sub-circuit is configured to be connected to a detection input terminal to receive a detection input signal and charge the first pull-up node in response to the detection input signal.

5. The shift register unit according to claim 4, wherein the first detection input sub-circuit further comprises a random pulse signal control sub-circuit and a second random pulse signal terminal, and
    the random pulse signal control sub-circuit is configured to be connected to the display output terminal, the first random pulse signal terminal, and the second random pulse signal terminal to receive the display output signal, the first random pulse signal, and the second random pulse signal, and to cause the first random pulse signal and the second random pulse signal to be turn-on levels simultaneously in response to the display output signal, the first random pulse signal, and the second random pulse signal.

6. The shift register unit according to claim 4, wherein the detection sub-shift-register further comprises a current leak-proof circuit, and
    the current leak-proof circuit is configured to maintain a high level of the first pull-up node under control of a level of the first pull-up node.

7. The shift register unit according to claim 3, wherein the display sub-shift-register comprises a display input sub-circuit, a second pull-up node reset sub-circuit and a display output sub-circuit,
    the display input sub-circuit is configured to charge a second pull-up node in response to a display input signal;
    the second pull-up node reset sub-circuit is configured to reset the second pull-up node in response to a third reset signal received by a third reset terminal; and
    the display output sub-circuit is configured to output a fourth clock signal to the display output terminal under control of a level of the second pull-up node.

8. The shift register unit according to claim 7, wherein the display sub-shift-register further comprises a second pull-up node noise reduction sub-circuit, a display output noise reduction sub-circuit and a second pull-down sub-circuit,
    the second pull-up node noise reduction sub-circuit is configured to reduce noise on the second pull-up node under control of a level of the second pull-down node;
    the display output noise reduction sub-circuit is configured to reduce noise on the display output terminal under the control of the level of the second pull-down node; and the second pull-down sub-circuit is configured to control the level of the second pull-up node under the control of the level of the second pull-up node.

9. The shift register unit according to claim 8, further comprising an output control circuit,
the output control circuit is connected to the first pull-up node and the first pull-down node of the detection sub-shift-register and to the second pull-up node and the second pull-down node of the display sub-shift-register, and is configured to pull down one of the first pull-up node and the second pull-up node when the other of the first pull-up node and the second pull-up node is at an turn-on level.

10. The shift register unit according to claim 9, wherein the output control circuit comprises a display output control sub-circuit and a detection output control sub-circuit,
the detection output control sub-circuit is configured to control the levels of the second pull-up node and the second pull-down node under the control of the level of the first pull-up node;
the display output control sub-circuit is configured to control the levels of the first pull-up node and the first pull-down node under the control of the level of the second pull-up node.

11. The shift register unit according to claim 1, further comprising a logic OR circuit, wherein
the logic OR circuit is connected to the display output terminal of the display sub-shift-register and the detection output terminal of the detection sub-shift-register, and is configured to perform OR operation on the display output signal and the detection output signal to obtain a composite output signal.

12. The shift register unit according to claim 11, wherein the logic OR circuit comprises a first logic OR input sub-circuit, a second logic OR input sub-circuit, a first output control sub-circuit, a second output control sub-circuit, a first node noise reduction sub-circuit, a second node noise reduction sub-circuit, an output noise reduction control sub-circuit and an output noise reduction sub-circuit,
the first logic OR input sub-circuit is configured to charge a first node in response to the detection output signal;
the second logic OR input sub-circuit is configured to charge a second node in response to the display output signal;
the first output control sub-circuit is configured to output the detection output signal under control of a level of the first node;
the second output control sub-circuit is configured to output the display output signal under control of a level of the second node;
the first node noise reduction sub-circuit is configured to reduce noise on the first node under control of a level of the display output signal;
the second node noise reduction sub-circuit is configured to reduce noise on the second node under control of a level of the detected output signal;
the output noise reduction control sub-circuit is configured to control a level of a third node under the control of the levels of the display output signal and the detection output signal; and
the output noise reduction sub-circuit is configured to reduce noise at a logic OR output terminal under the control of the level of the third node.

13. A gate drive circuit comprising a plurality of cascaded shift register units according to claim 1, wherein the first random pulse signal terminal of the detection sub-shift-register of each shift register unit is connected with a first random pulse signal line;
except for a display sub-shift-register of a first stage, a display input terminal of a display sub-shift-register of each other stage is connected with a display output terminal of a display sub-shift-register of a preceding stage; and
except for a display sub-shift-register of a last stage, a third reset terminal of a display sub-shift-register of each other stage is connected with a display output terminal of a display sub-shift-register of a next stage.

14. A gate drive circuit comprising a plurality of cascaded shift register units according to claim 4, wherein
the first random pulse signal terminal of the detection sub-shift-register of each shift register unit is connected with a first random pulse signal line;
except for a display sub-shift-register of a first stage, a display input terminal of a display sub-shift-register of each other stage is connected with a display output terminal of a display sub-shift-register of a preceding stage;
except for a detection sub-shift-register of a first stage, a detection input terminal of a detection sub-shift-register of each other stage is connected with a detection output terminal of a detection sub-shift-register of a preceding stage.

15. A gate drive circuit comprising a plurality of cascaded shift register units as claimed in claim 5, wherein
the first random pulse signal terminal of the detection sub-shift-register of each shift register unit is connected with a first random pulse signal line;
the second random pulse signal terminal of the detection sub-shift-register of each shift register unit is connected with a second random pulse signal line;
except for display sub-shift-register of a first stage and a second stage, a display input terminal of a display sub-shift-register of each other stage is connected with a display output terminal of a display sub-shift-register of a preceding stage which is separated from the display sub-shift-register by one stage;
except for a detection sub-shift-register of a first stage, a detection input terminal of a detection sub-shift-register of each other stage is connected with a detection output terminal of a detection sub-shift-register of a preceding stage.

16. A display device comprising the gate drive circuit according to claim 13.

17. The display device according to claim 16, further comprising a random pulse generation circuit,
wherein the random pulse generation circuit is configured to generate the first random pulse signal and is connected to the first random pulse signal line.

18. A driving method of the gate drive circuit according to claim 13, comprising:
a display output terminal of a display sub-shift-register of an (N)th stage outputting a display output signal;
a detection sub-shift-register of the (N)th stage charging a first pull-up node in response to the display output signal and a first random pulse signal; and
the detection sub-shift-register of the (N)th stage outputting a detection output signal,
wherein N is an integer greater than 1.

19. A driving method of the gate drive circuit according to claim 15, comprising:
a display output terminal of a display sub-shift-register of an (N)th stage outputting a display output signal;

a detection sub-shift-register of the (N)th stage charging a first pull-up node in response to the display output signal, a first random pulse signal, and a second random pulse signal; and the detection sub-shift-register of the (N)th stage outputting a detection output signal, wherein N is an integer greater than 1.

* * * * *